(12) United States Patent
Li et al.

(10) Patent No.: US 11,843,038 B2
(45) Date of Patent: Dec. 12, 2023

(54) BIPOLAR JUNCTION TRANSISTOR WITH GATE OVER TERMINALS

(71) Applicant: Taiwan Semiconductor Manufacturing Co., Ltd., Hsinchu (TW)

(72) Inventors: Ming-Shuan Li, Zhudong Township (TW); Zi-Ang Su, Longtan Township (TW); Ying-Keung Leung, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 122 days.

(21) Appl. No.: 17/589,180

(22) Filed: Jan. 31, 2022

(65) Prior Publication Data

US 2022/0157953 A1 May 19, 2022

Related U.S. Application Data

(62) Division of application No. 16/785,124, filed on Feb. 7, 2020, now Pat. No. 11,239,330.

(51) Int. Cl.
*H01L 29/417* (2006.01)
*H01L 29/78* (2006.01)
(Continued)

(52) U.S. Cl.
CPC .. *H01L 29/41708* (2013.01); *H01L 29/42304* (2013.01); *H01L 29/6681* (2013.01);
(Continued)

(58) Field of Classification Search
CPC ......... H01L 29/66795; H01L 29/42304; H01L 29/41708; H01L 29/6625; H01L 29/04–045; H01L 29/0804–0817; H01L 29/0821–0826; H01L 29/083–0839; H01L 29/1004–1008; H01L 29/16–1608; H01L 29/18–185; H01L 29/22–2206;
(Continued)

(56) References Cited

U.S. PATENT DOCUMENTS 8,487,378 B2  7/2013 Goto et al.
8,729,634 B2  5/2014 Shen et al.
(Continued)

FOREIGN PATENT DOCUMENTS

KR  20130139158 A  12/2013
TW  201351486 A   12/2013
TW  201913818 A    4/2019

*Primary Examiner* — Wasiul Haider
(74) *Attorney, Agent, or Firm* — Slater Matsil, LLP

(57) ABSTRACT

Embodiments include a first set of fins having an emitter of a bipolar junction transistor (BJT) disposed over the first set of fins, a second set of fins having a base of the BJT disposed over the second set of fins, and a third set of fins having a collector of the BJT disposed over the third set of fins. A first gate structure is disposed over the first set of fins adjacent to the emitter. A second gate structure is disposed over the second set of fins adjacent to the base. A third gate structure is disposed over the third set of fins adjacent to the collector. The first gate structure, second gate structure, and third gate structure are physically and electrically separated.

20 Claims, 41 Drawing Sheets

(51) Int. Cl.
*H01L 29/66* (2006.01)
*H01L 29/73* (2006.01)
*H01L 29/423* (2006.01)

(52) U.S. Cl.
CPC ........ *H01L 29/66234* (2013.01); *H01L 29/73* (2013.01); *H01L 29/785* (2013.01)

(58) Field of Classification Search
CPC ..... H01L 29/36–365; H01L 29/66234–66348; H01L 29/70–749; H01L 2924/1305–13056; H01L 29/401; H01L 29/6681; H01L 29/785; H01L 21/8249; H01L 27/0623; H01L 29/0808; H01L 21/823431; H01L 27/082; H01L 21/8222; H01L 27/0711; H01L 29/7302
See application file for complete search history.

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 10,529,837 B1 | 1/2020 | Hung et al. |
| 2013/0168819 A1* | 7/2013 | Chang ................. H01L 29/1004 257/E29.171 |
| 2013/0328162 A1* | 12/2013 | Hu ..................... H01L 27/0635 257/E29.174 |
| 2014/0252489 A1 | 9/2014 | Yu et al. |
| 2014/0282326 A1 | 9/2014 | Chen et al. |
| 2018/0068998 A1 | 3/2018 | Wang et al. |
| 2018/0277666 A1 | 9/2018 | Chu et al. |
| 2018/0331192 A1 | 11/2018 | Zhou |
| 2019/0140083 A1 | 5/2019 | Pan |
| 2020/0105900 A1 | 4/2020 | Pan et al. |

* cited by examiner

BIPOLAR JUNCTION TRANSISTOR WITH GATE OVER TERMINALS

PRIORITY CLAIM AND CROSS-REFERENCE

This application is a divisional of U.S. application Ser. No. 16/785,124, filed on Feb. 7, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

A bipolar junction transistor (BJT) includes a base, a collector, and an emitter. BJTs are formed by two p-n junctions placed back-to-back, with one of the regions common to both junctions. This arrangement forms either a PNP or NPN bipolar junction transistor. In BJTs, the current flow through the emitter and collector is controlled by the voltage across the base and emitter. As the semiconductor industry has progressed into nanometer technology process nodes in pursuit of higher device density, higher performance, and lower costs, various techniques have been implemented to improve BJT device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
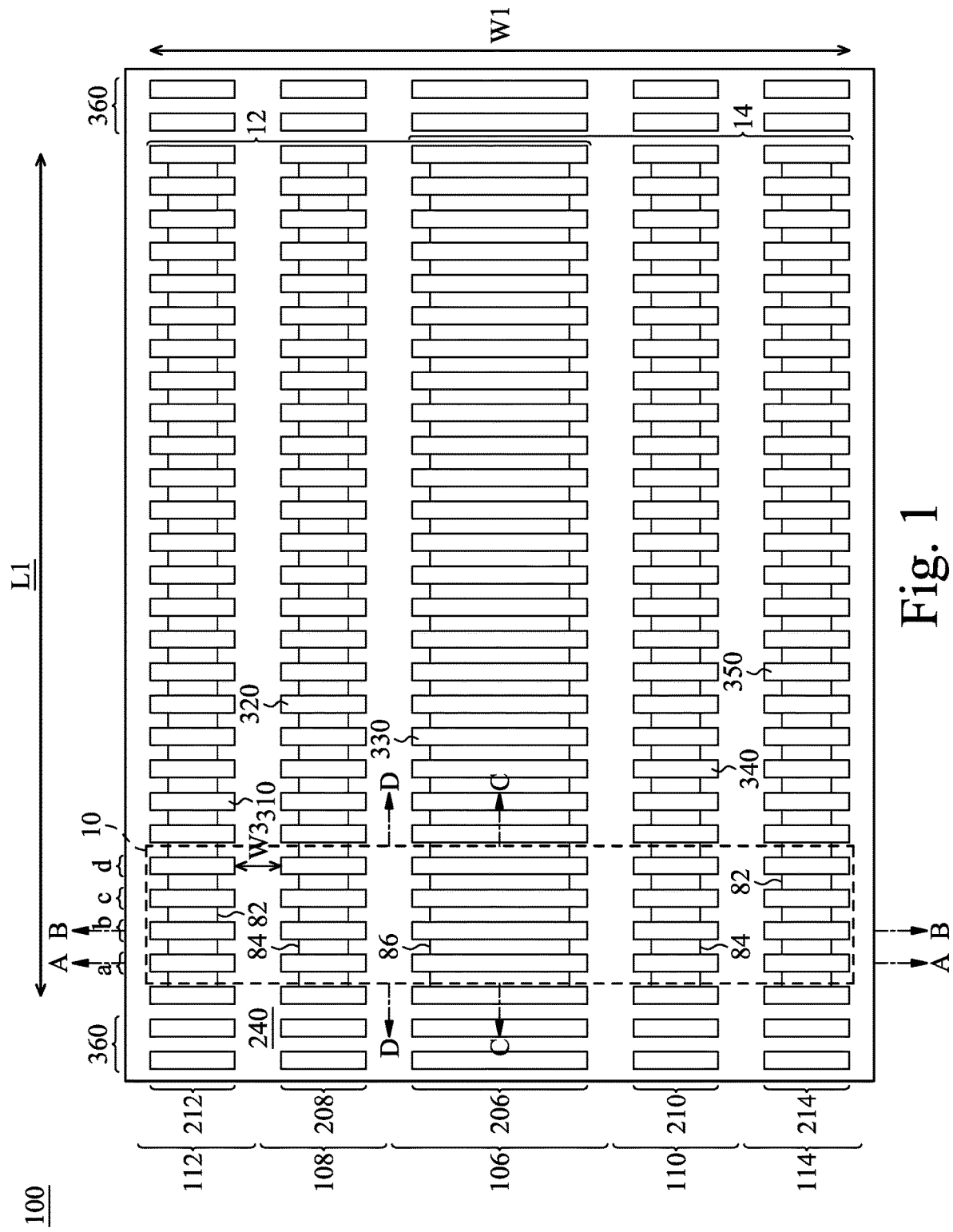
FIG. 1 illustrates a top down view of a bipolar transistor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provide BJTs which are formed from FinFET transistors, using FinFET processes. A series of p-type FinFET transistors can be tied together to form a BJT collector terminal, a series of n-type FinFET transistors can be tied together to from a BJT base terminal, and a series of p-type FinFET transistors can be tied together to from a BJT emitter terminal. The source/drain of each of these series of FinFET transistors can be electrically coupled together, which may also be electrically coupled to the gate electrodes of the FinFET transistors. When put in appropriate contact to each other through the substrate, a lateral BJT transistor is formed. For example, in this case, the BJT transistor is a PNP BJT transistor. The gate structures of the FinFET transistors may include a polysilicon gate structure or metal gate structure. In the formation of the BJT, the gate structures may span the terminals and be cut in a later process, span certain ones of the terminals and cut in a later process, or may be formed to span over each individual terminal. To improve performance of the BJTs, embodiments separate the gate structure over the emitter terminal from that of the gate structure over the base terminal. Embodiments also expand the surface area of the BJTs to provide appropriate spacing between these gate structures to avoid or reduce leakage from one gate structure to the next. By separating the gate structures, the stability of the base-emitter voltage ($\Delta V_{be}$) is seen to improve by about 50%. Embodiments may also couple the gate structures to each of the respective source/drains of the base terminal, collector terminal, and emitter terminal.

FIG. 1 provides a top down view of a BJT 100 after an intermediate stage in fabrication, in accordance with some embodiments. For example, FIG. 1 can be seen as a top down view after the process described with respect to FIG. 14, below. BJT 100 includes BJT 12 and BJT 14, where BJT 12 is a first lateral BJT including an emitter terminal 206, base terminal 208, and collector terminal 212 and BJT 14 is a second lateral BJT including the emitter terminal 206, base terminal 210, and collector terminal 214. In FIG. 1, an active area of the BJT 100 is defined by the length L1 and the width W1. An overall length L1 of the BJT 100 may be between about 3 μm and about 5 μm, such as about 3.6 μm, though other values are contemplated. The length L1 may be chosen to drive mismatch between a parasitic BJT (described below) in the substrate and the lateral BJTs (e.g., BJT 12 and BJT 14). The width W1 may be between about 1.5 μm and 3.5 μm, such as about 2.5 μm, though other values are contemplated.

Figure 3B:
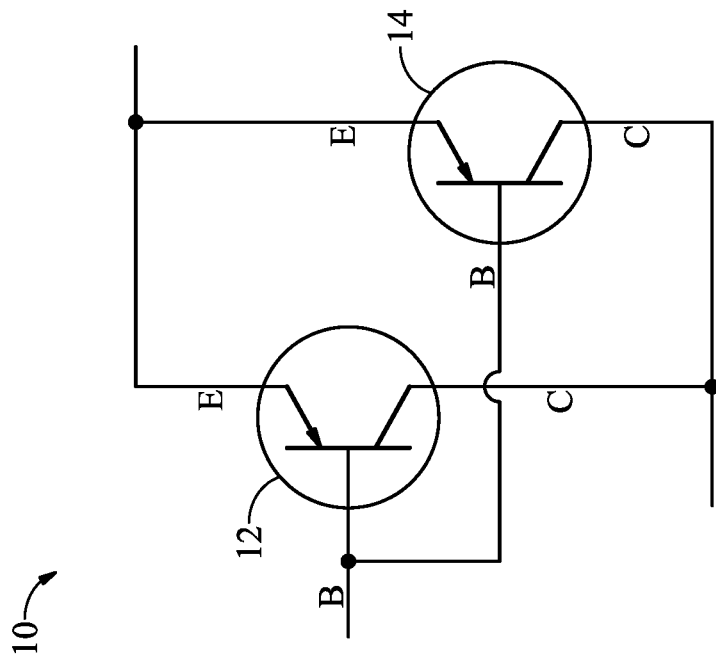
FIGS. 3a and 3b illustrate circuit diagrams for bipolar transistors, in accordance with some embodiments.
Figure 3A:
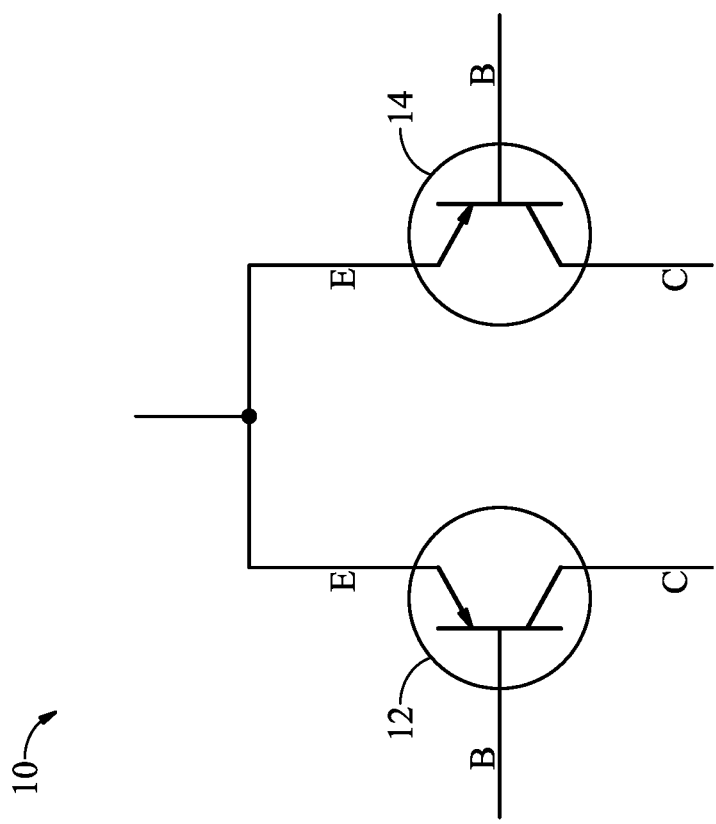

BJT 100 may be understood to be two separate BJTs, BJT 12 and BJT 14, which share a common emitter terminal 206, such as illustrated by the circuit diagram in FIG. 3a. In some embodiments, however, the base terminal 208 of BJT 12 and base terminal 210 of BJT 14 may be coupled together, for example in a metallization layer to tie the terminals together. Likewise, the collector terminal 212 of BJT 12 and collector terminal 214 of BJT 14 may be coupled together, for example in a metallization layer to tie the terminals together. When BJT 12 and BJT 14 are tied together, such as illustrated by the circuit diagram in FIG. 3b, then they can effectively act as a single BJT 100 having a length of about 2×L1.

In the active area, the gate structures 310, 320, 330, 340, and 350 are positioned over fins or semiconductor strips (fins 212, 208, 206, 210, and 214, respectively) over the substrate. In particular, four rows of gate structures, rows a, b, c, and d are marked in FIG. 1, however, it should be understood that additional rows may be included. In some embodiments, for example, a single BJT may use between 15 and 40 rows of gates disposed over respective fins 212, 208, 206, 210, and 214. In some embodiments, a single BJT may use between 20 and 30, between 1 and 15, or between 40 and 55 rows of gates; other embodiments may use more than 55 rows of gates. Between each of the gate structures 310, 320, 330, 340, and 350 is a respective epitaxial collector region 82, epitaxial base region 84, epitaxial emitter region 86, epitaxial base region 84, and epitaxial collector region 82. These epitaxial regions are similar to source/drain regions of a FinFET transistor, and are electrically coupled together to form the relevant BJT terminals.

Outside the active area, in an inactive area, a shallow trench isolation region (STI) 240 surrounds the active area. The STI 240 also extends between fins 212, 208, 206, 210, and 214, and is described in further detail below. The inactive gates 360 in the inactive area may be dummy gates, poly gates, or metal gates. Where the gates are metal gates or poly gates, no metallization reaches the inactive gates 360 and they float electrically.

As a point of reference, doped well regions of the substrate are noted in FIG. 1. The p-well 106 is doped with p-type dopants and corresponds to the common emitter terminal of the BJT 100 (common to BJT 12 and BJT 14). The n-wells 108 and 110 are doped with n-type dopants and correspond to the base terminals of the BJT 100. The p-wells 112 and 114 are doped with p-type dopants and correspond to the collector terminals of the BJT 100. The fins 212, 208, 206, 210, and 214 are formed from these doped well regions (as will be shown and described in other Figures in greater detail below).

In general, like references in FIG. 1 are used to refer to like references in the other Figures, unless otherwise noted. The same reference may be used in an intermediate process so that the item referred to may change from process to process even though its reference indicator may not.

FIG. 1 also illustrates that the gate structures 320 over the fins 208 are laterally separated by a distance, the width W2, from the gate structures 330 over the fins 206. Embodiments provide that the end-to-end distance from the gate structures 320 to the gate structures 330 (and from the gate structures 330 to the gate structures 340) may be between about 100 nm and about 400 nm, such as about 150 nm. The minimum width of W2 should be at least 100 nm to about 120 nm, such as about 110 nm to reduce leakage and maintain design constraints. The width W3 between the gate structures 320 and the gate structures 310 (and between the gate structures 340 and gate structures 350) may be between about 200 nm and about 500 nm, such as about 250 nm.

A partial portion of the BJT 100 is defined by the dashed box 10, which may for simplicity be referred to as device 10 or BJT 10. The partial portion of the BJT 100 is used for the cross-sectional and perspective views illustrated in the Figures below. It should be understood that these views of BJT 10 may be used to represent any embodiment consistent with those discussed herein.

FIG. 1 further illustrates cross-sections which will be referred to in the Figures below. These cross-sections are marked on each Figure. Cross-section A-A is along a longitudinal axis of the gates 310a, 320a, 330a, 340a, and 350a (where 310a represents for example gate 310 in row a) and in a direction, for example, perpendicular to the direction of the fins 206, 208, 210, 212, and 214. Cross-section B-B is parallel to cross-section A-A and extends through the epitaxial collector regions 82, epitaxial base regions 84, and the epitaxial emitter regions 86. Cross-section C-C is perpendicular to cross-section A-A and is along a longitudinal axis of the fins 206. Cross-section D-D is parallel to cross-section C-C and extends between the epitaxial base regions 84 and epitaxial emitter regions 86 along the STI 240.

Figure 2:
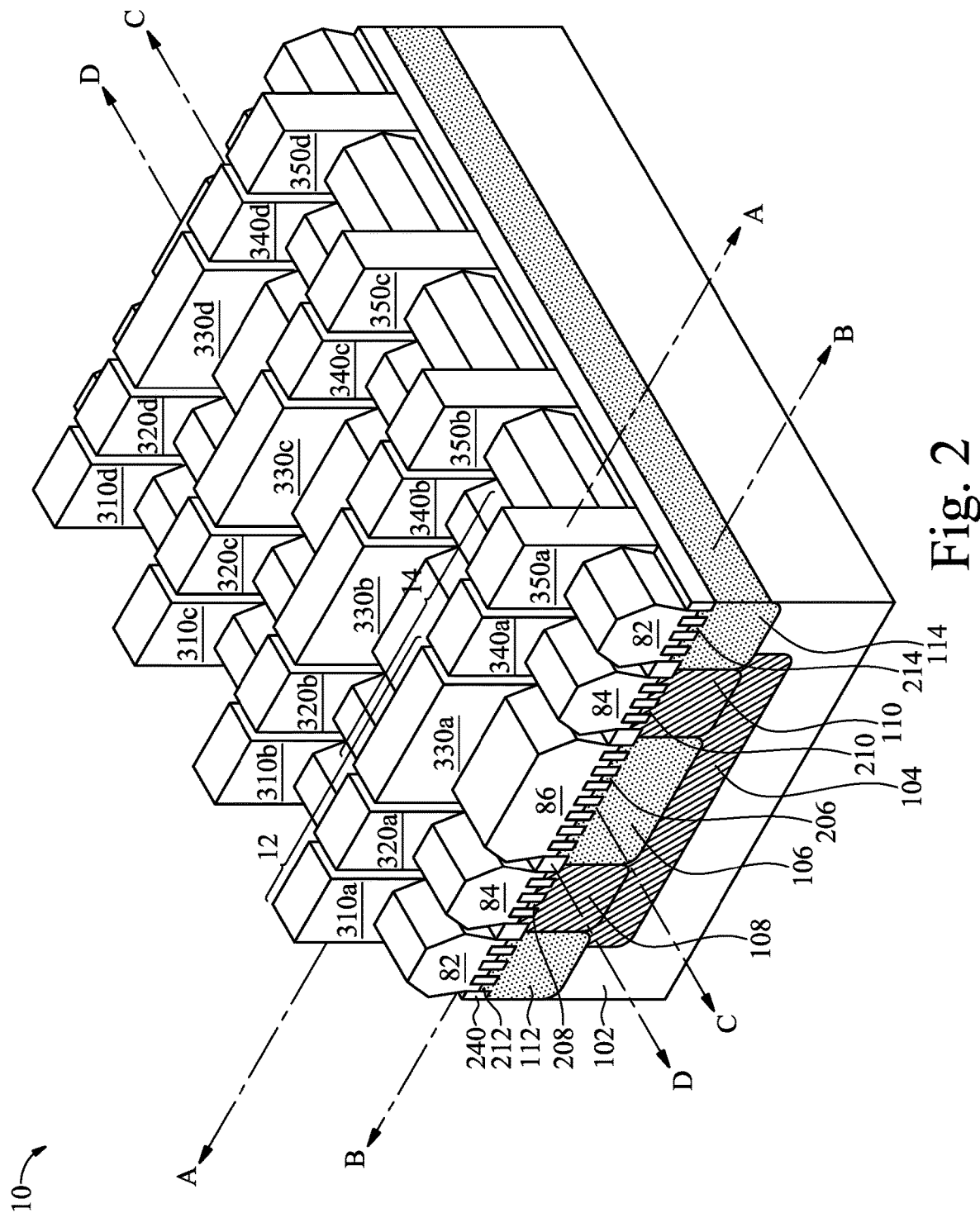
FIG. 2 illustrates perspective view of a bipolar transistor device, in accordance with some embodiments.

FIG. 2 illustrates a perspective view of the BJT 10 (the partial portion of the BJT 100 from FIG. 1). FIG. 2 also provides the cross-sections referred to in the Figures below (FIGS. 10-11, 15-26, 28-40). FIG. 2 shows the wells—n-wells 108 and 110 and p-wells 106, 112, and 114, discussed briefly above. In addition, FIG. 2 illustrates a deep n-well 104. FIG. 2 also illustrates the STI 240 and fins 206, 208, 210, 212, and 214. The gate structures 310, 320, 330, 340, and 350 in rows a, b, c, and d are illustrated as well as the respective corresponding epitaxial collector regions 82, epitaxial base region 84, epitaxial emitter region 86, epitaxial base region 84, and epitaxial collector region 82.

The present disclosure describes a fabricating process of a BJT, in accordance with embodiments. The BJT may be formed on bulk silicon substrates in certain embodiments of the present disclosure. Still, the BJT may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

FIG. 3a illustrates a portion of a circuit diagram for the BJT 100, including a pair of p-type BJTs having a common emitter, in accordance with some embodiments. BJT 12 is coupled to BJT 14 by its emitter. The base signals and the collector signals of each of the BJTs may be coupled elsewhere in the circuit. FIG. 3b illustrates a portion of a circuit diagram for the BJT 100 in another embodiment, for a pair of p-type BJTs having a common emitter, common base, and common collector, effectively combining the pair of BJTs into a single BJT device. Although the illustrated embodiments described in further detail below form a pair of emitter joined BJTs, other arrangements may be used and are contemplated.

FIGS. 4 through 40 are various views of intermediate steps of a process for forming a BJT 10, in accordance with some embodiments. FIGS. 4 through 9, 12 through 14, and 27 are perspective views, and FIGS. 10 through 11, 15 through 26, and 28 through 40 are cross-sectional views. Although the description below corresponds to the formation of a particular arrangement for a p-type BJT (PNP BJT or pBJT), one should understand that the process below may be used for forming variations of the arrangements described while remaining within the scope of the embodiments. For example, more or fewer gate structures, more or fewer fins, lengths or widths, spacing, polarity (type) and concentration of dopants, and so forth may be adjusted as desired.

Figure 4:
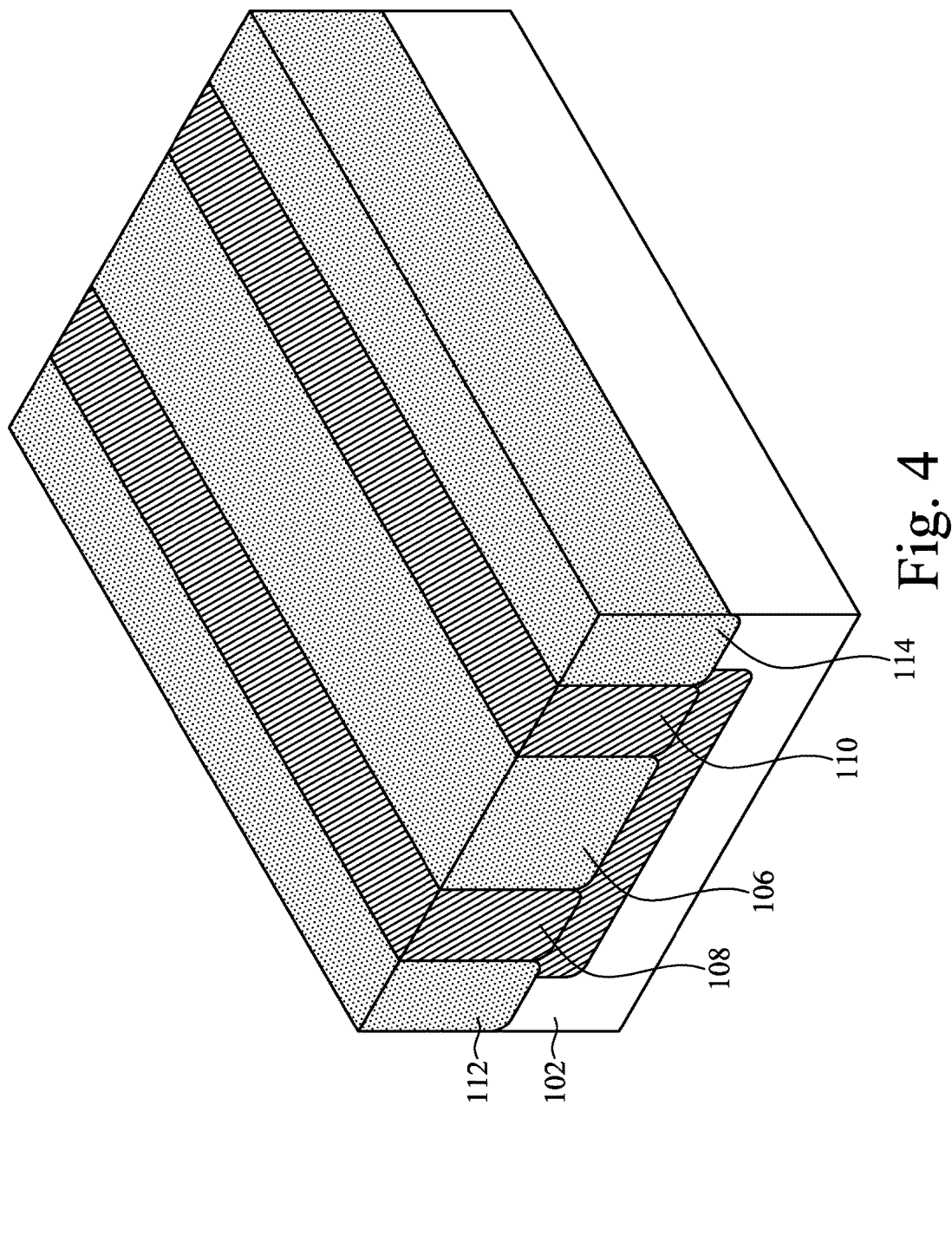
FIGS. 4 through 40 illustrate various views of intermediate stages in the manufacturing of a bipolar transistor, in accordance with some embodiments.

In FIG. 4, a semiconductor substrate 102 is provided. The illustration in FIG. 4 represents a portion of the semiconductor substrate 102. In some embodiments, the semiconductor substrate 102 includes a crystalline silicon substrate (e.g., wafer). The semiconductor substrate 102 may be a p-type substrate, that is, semiconductor substrate 102 may be doped with p-type dopants (also referred to as impurities). The semiconductor substrate 102 may also include additional doped wells which are doped with n-type or p-type dopants forming well regions comprising n-type doped wells and p-type doped wells depending on design requirements. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The n-well 104 is a deep n-well. For example, the n-well 104 is doped with n-type dopants and is positioned below other wells formed in the substrate 102. The n-well 104 also spans the underside of the other wells formed in the substrate 102 at the surface of the substrate 102. The n-well 104 may be formed by masking areas of the substrate 102 which are not to be implanted and performing a deep implant of n-type impurities. The n-type impurities may include phosphorus, arsenic, antimony, or the like, or a combination thereof implanted in the n-well 104 region to a concentration of equal to or less than $10^{19}$ cm$^{-3}$, such as between about $10^{16}$ cm$^{-3}$ and about $10^{19}$ cm$^{-3}$, though other concentrations may be used and are contemplated.

The p-well 106 is doped with p-type dopants and is formed to span a width of a center portion of the illustrated substrate 102. The n-well 108 and the n-well 110 are formed on either side of the p-well 106. The p-well 112 and the p-well 114 are formed on either side of the n-well 108 and the n-well 110, respectively. The p-well 106 will serve as a coupled emitter for a pair of BJTs formed in the device 10 (see FIG. 1a). In some embodiments, the collectors, and bases of the pair of BJTs may also be coupled together to form effectively a single BJT (see FIG. 1b). The n-well 108 and the n-well 110 will serve as a respective base for each of the pair of BJTs, and the p-well 112 and the p-well 114 will serve as a respective collector for each of the pair of BJTs.

The implantation of dopants in the different well types may be achieved using a photoresist or other masks (not shown). For example, a photoresist may be formed over the substrate 102. The photoresist is patterned to expose the p-well 106, the p-well 112, and the p-well 114 of the substrate 102. The photoresist can be formed by using a spin-on technique and can be patterned using acceptable photolithography techniques. Once the photoresist is patterned, a p-type impurity implant is performed in the p-well 106, the p-well 112, and the p-well 114, and the photoresist may act as a mask to substantially prevent p-type impurities from being implanted into the p-well 106, the p-well 112, and the p-well 114. The p-type impurities may be boron, boron fluoride, indium, or the like implanted in the region to a concentration of equal to or less than $10^{19}$ cm$^{-3}$, such as between about $10^{17}$ cm$^{-3}$ and about $10^{19}$ cm$^{-3}$. After the implant, the photoresist may be removed, such as by an acceptable ashing process.

Following the implanting of the p-well 106, the p-well 112, and the p-well 114, a photoresist is formed over the substrate 102. The photoresist is patterned to expose the n-well 108 and the n-well 110 of the substrate 102. The photoresist can be formed by using a spin-on technique and can be patterned using acceptable photolithography techniques. Once the photoresist is patterned, an n-type impurity implant may be performed in the n-well 108 and the n-well 110, and the photoresist may act as a mask to substantially prevent n-type impurities from being implanted into the p-well 106, the p-well 112, and the p-well 114. The n-type impurities may be phosphorus, arsenic, antimony, or the like implanted in the region to a concentration of equal to or less than $10^{19}$ cm$^{-3}$, such as between about $10^{17}$ cm$^{-3}$ and about $10^{19}$ cm$^{-3}$. After the implant, the photoresist is removed, such as by an acceptable ashing process.

After the implants of the p-well 106, the n-well 108, the n-well 110, the p-well 112, and the p-well 114, an anneal may be performed to repair implant damage and to activate the p-type and n-type impurities that were implanted.

Figure 5:
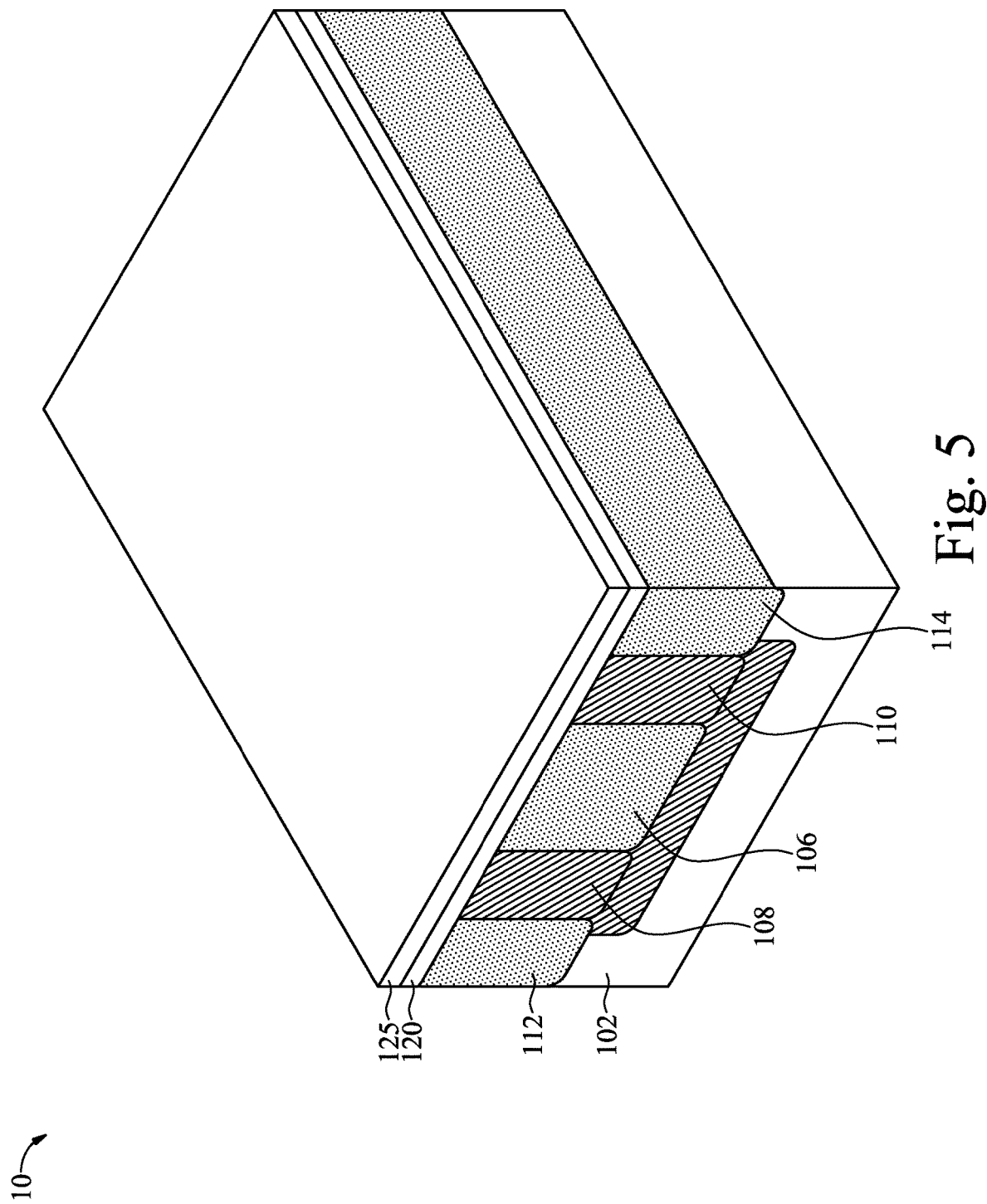

In FIG. 5, the pad layer 120 and the mask layer 125 are sequentially formed over the p-well 106, the n-well 108, the n-well 110, the p-well 112, and the p-well 114 of the semiconductor substrate 102. The pad layer 120 a may be a silicon oxide thin film formed, for example, by thermal oxidation process. The pad layer 120 may act as an adhesion layer between the semiconductor substrate 102 and the mask layer 125. The pad layer 120 may also act as an etch stop layer for etching the mask layer 125. For example, the mask layer 125 may be a silicon nitride layer formed by low-pressure chemical vapor deposition (LPCVD) or plasma enhanced chemical vapor deposition (PECVD). The mask layer 125 may be used as a hard mask during subsequent etching processes.

Figure 6:
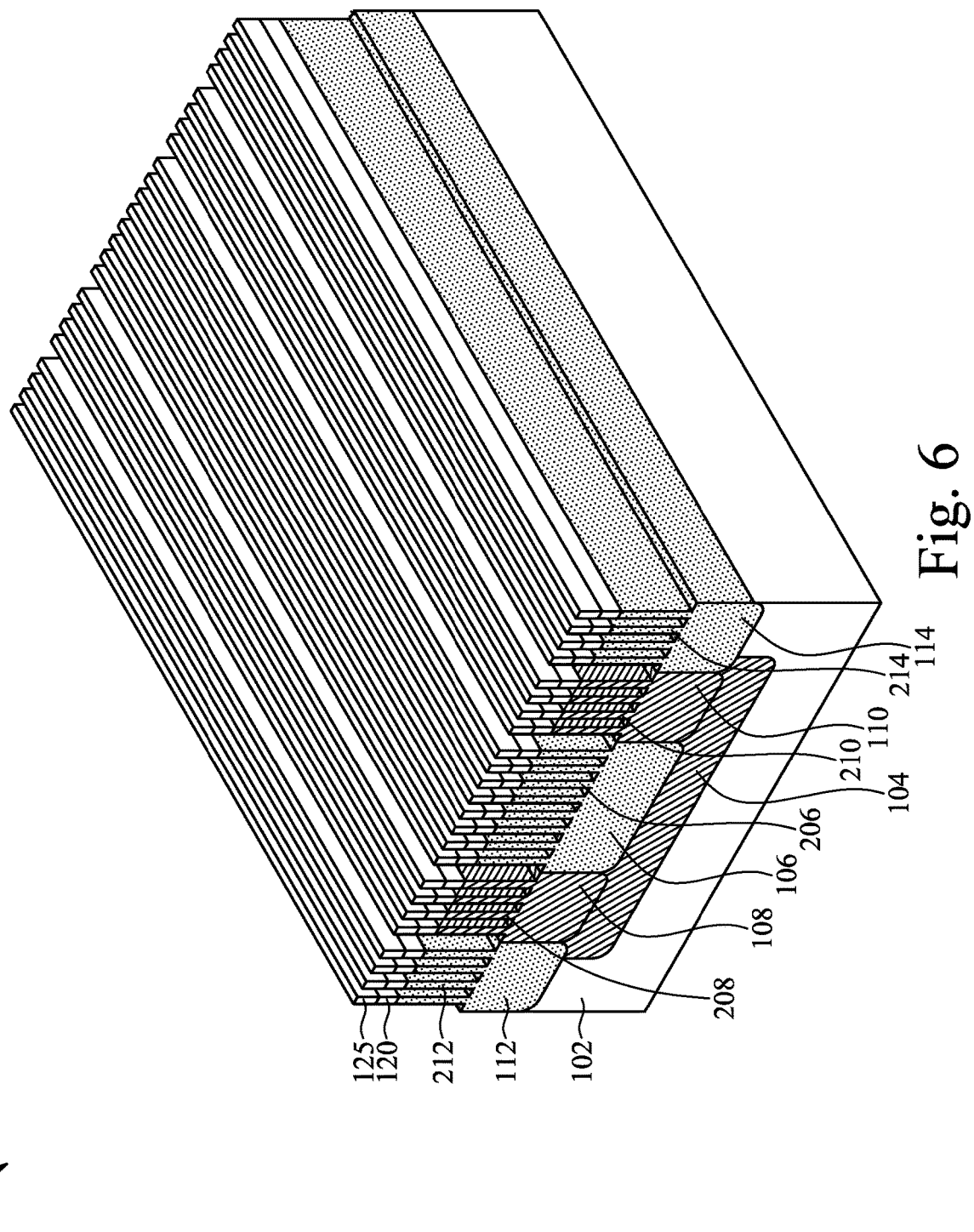

In FIG. 6, the mask layer 125 may be patterned using a photolithography technique. The pad layer 120 may be etched based on the pattern of the mask layer 125, using the mask layer as an etch mask, thereby exposing upper surfaces of the p-well 106, the n-well 108, the n-well 110, the p-well 112, and the p-well 114 of the semiconductor substrate 102. The upper surfaces of the p-well 106, the n-well 108, the n-well 110, the p-well 112, and the p-well 114 which are uncovered by the mask layer 125 are then etched to form trenches between the fins 206 formed from the p-well 106, between the fins 208 formed from the n-well 108, between the fins 210 formed from the n-well 110, between the fins 212 formed from the p-well 112, and between the fins 214 formed from the p-well 114. The number of fins and trenches can vary depending on design. The etching may be any acceptable etch process, such as a reactive ion etch (RIE), neutral beam etch (NBE), the like, or a combination thereof. The etch may be anisotropic. The active region, such as described above with respect to FIG. 1 may also be defined, etching the substrate to form the ends of the fins 206, 208, 210, 212, and 214. In some embodiments, the fins 206, 208, 210, 212, and 214 may be formed first and then cut to a desired length (e.g., length L1) in a subsequent process.

The fins 206, 208, 210, 212, and 214 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins.

The height of the semiconductor strips or fins 206, 208, 210, 212, and 214 may be between about 100 nm to about 150 nm, though other values may be used and are contemplated. The pitch from fin to fin of the fins 206, 208, 210, 212, and 214 may be between about 20 nm and about 36 nm. Each fin may be between about 5 nm and 12 nm wide on its narrowest cross-section. The spacing between one fin sidewall and the sidewall of an adjacent fin may be between 10 nm and 30 nm. Other dimensions are contemplated and may be used for the fin.

Figure 7:
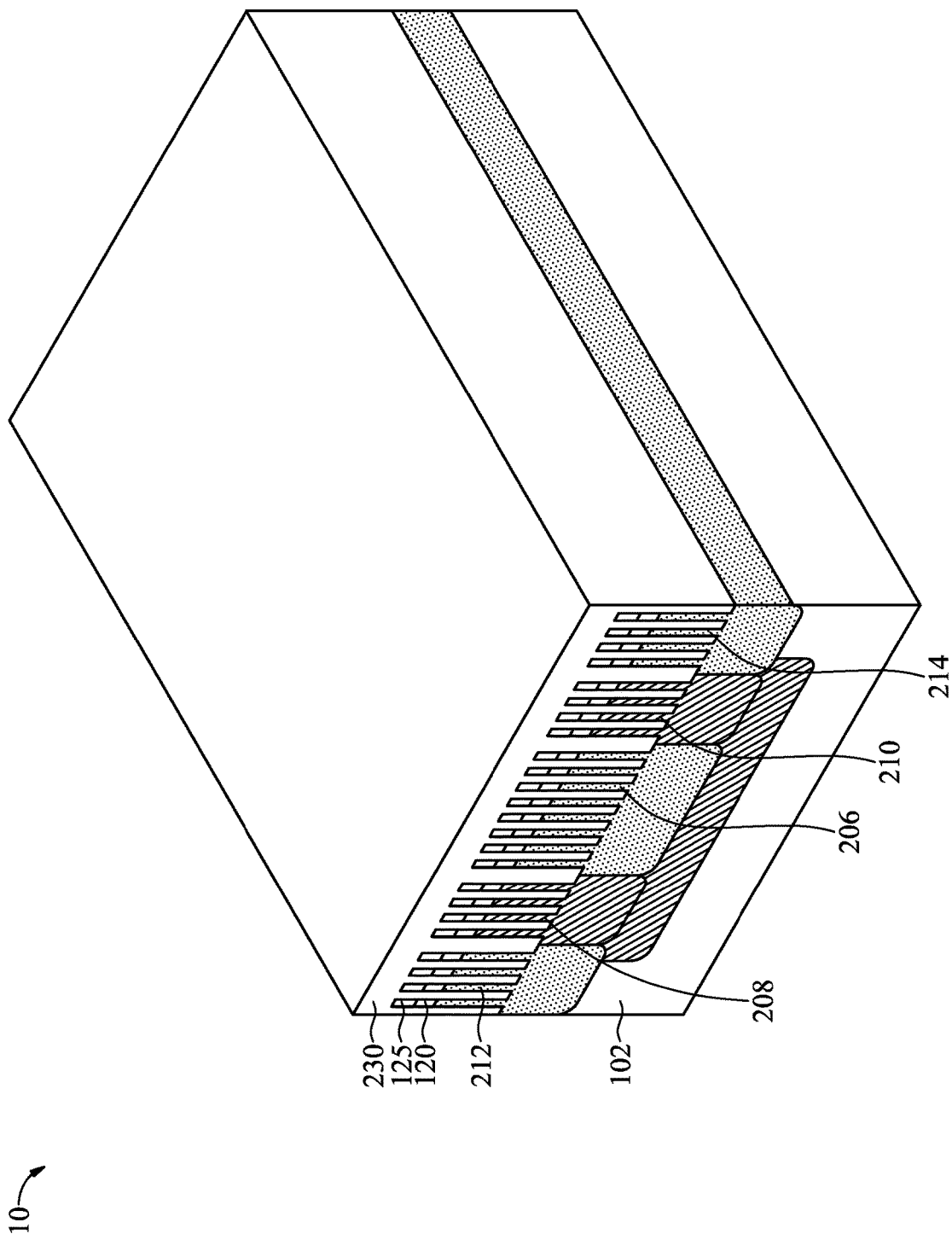

In FIG. 7, an insulating material 230 is formed over the fins 206, 208, 210, 212, and 214 and fills the trenches between the fins 206, 208, 210, 212, and 214. The insulation material 230 may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 230 is silicon oxide formed by a FCVD process. An anneal process may be performed once the insulation material 230 is formed. In an embodiment, the insulation material 230 is formed such that excess insulation material 230 covers the fins 206, 208, 210, 212, and 214. Although the insulation material 230 is illustrated as a single layer, some embodiments may utilize multiple layers. For example, in some embodiments a liner (not shown) may first be formed along a surface of the substrate 102 and the fins 206, 208, 210, 212, and 214. Thereafter, a fill material, such as those discussed above may be formed over the liner.

Figure 8:
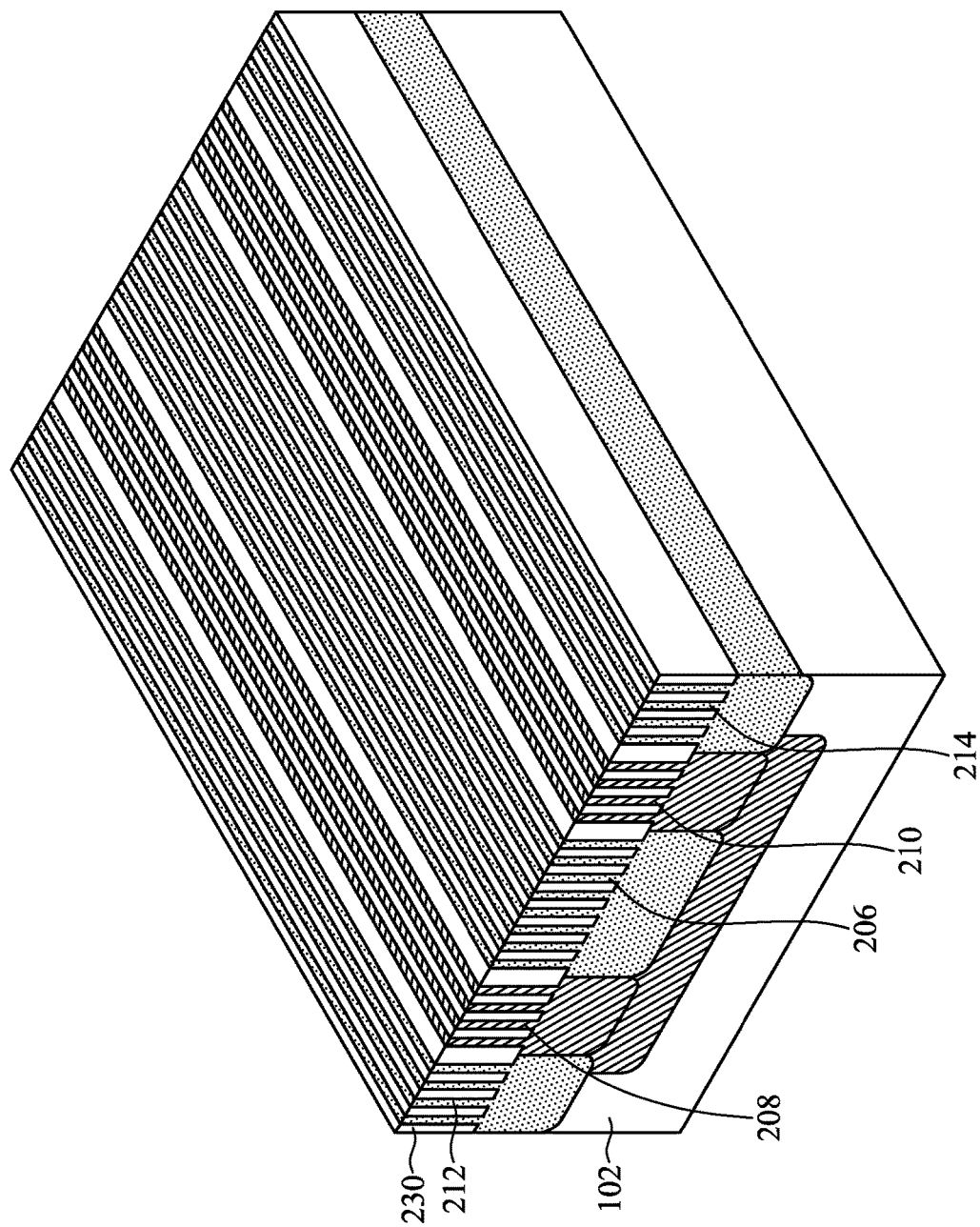

In FIG. 8, a removal process is applied to the insulation material 230 to remove excess insulation material 230 over the fins 206, 208, 210, 212, and 214. In some embodiments, a planarization process such as a chemical mechanical polish (CMP), an etch-back process, combinations thereof, or the like may be utilized. The planarization process exposes the fins 206, 208, 210, 212, and 214 such that top surfaces of the fins 206, 208, 210, 212, and 214 and the insulation material 230 are level after the planarization process is complete. In embodiments in which a mask remains on the fins 206, 208, 210, 212, and 214, the planarization process may expose the mask or remove the mask such that top surfaces of the mask or the fins 206, 208, 210, 212, and 214, respectively, and the insulation material 230 are level after the planarization process is complete.

Figure 9:
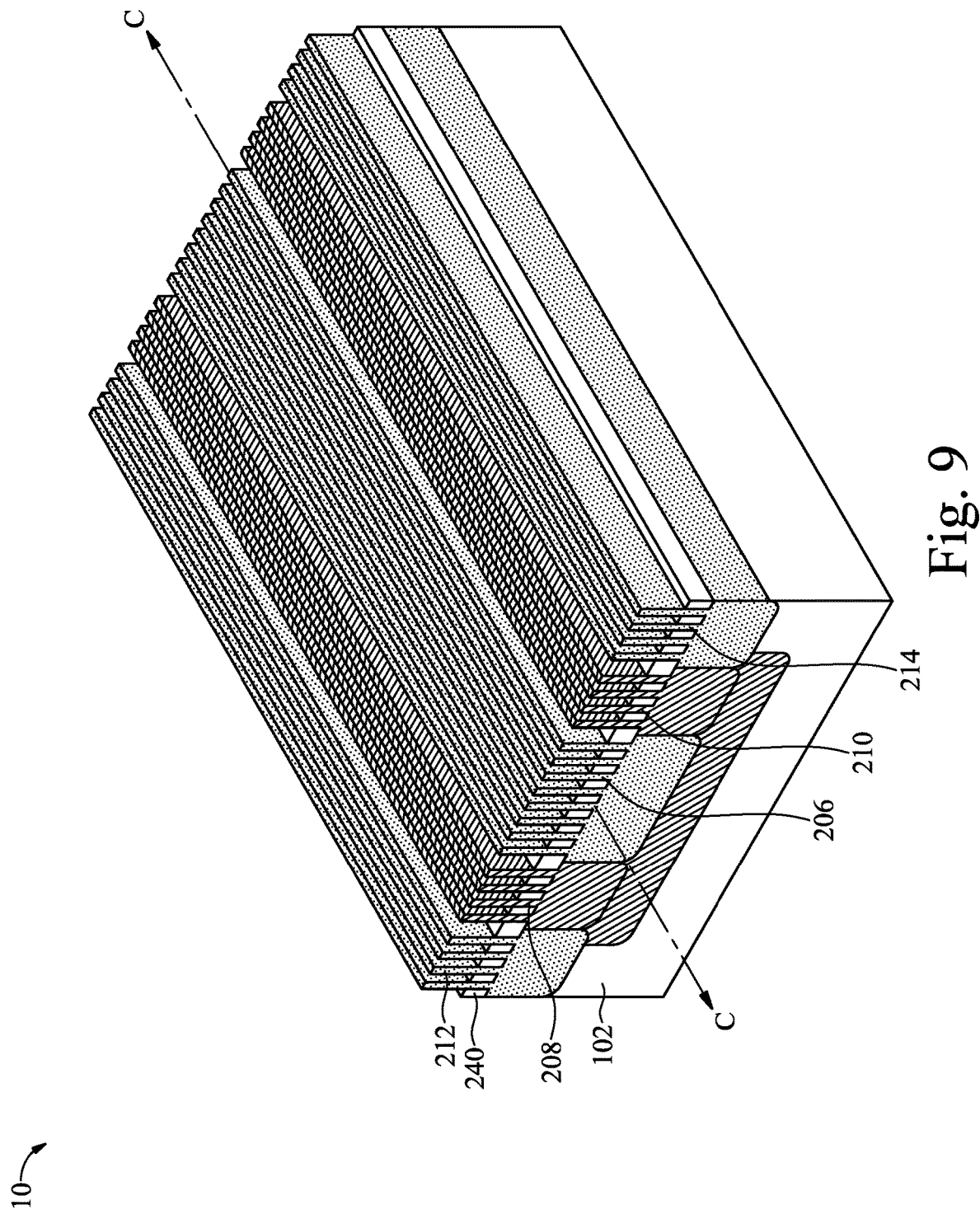

In FIG. 9, the insulation material 230 (FIG. 6) is recessed to form Shallow Trench Isolation (STI) regions 240. The insulation material 230 is recessed such that upper portions of fins 206, 208, 210, 212, and 214 protrude from between neighboring STI regions 240. Further, the top surfaces of the STI regions 330 may have a flat surface as illustrated, a convex surface, a concave surface (such as dishing), or a combination thereof. The top surfaces of the STI regions 240 may be formed flat, convex, and/or concave by an appropriate etch. The STI regions 240 may be recessed using an acceptable etching process, such as one that is selective to the material of the insulation material 230 (e.g., etches the material of the insulation material 230 at a faster rate than the material of the fins 206, 208, 210, 212, and 214). For example, an oxide removal using, for example, dilute hydrofluoric (dHF) acid may be used.

The process described with respect to FIGS. 4 through 9 is just one example of how the fins 206, 208, 210, 212, and 214 may be formed. In some embodiments, the fins 206, 208, 210, 212, and 214 may be formed by an epitaxial growth process. For example, a dielectric layer can be formed over a top surface of the substrate 102, and trenches can be etched through the dielectric layer to expose the underlying substrate 102. Homoepitaxial structures can be epitaxially grown in the trenches, and the dielectric layer can be recessed such that the homoepitaxial structures protrude from the dielectric layer to form fins 206, 208, 210, 212, and 214. Additionally, in some embodiments, heteroepitaxial structures can be used for the fins 206, 208, 210, 212, and 214. For example, the fins 206, 208, 210, 212, and 214 in FIG. 6 can be recessed, and a material different from the fins 206, 208, 210, 212, and 214 may be epitaxially grown over the recessed fins 206, 208, 210, 212, and 214. In such embodiments, the fins 206, 208, 210, 212, and 214 comprise the recessed material as well as the epitaxially grown material disposed over the recessed material. In an even further embodiment, a dielectric layer can be formed over a top surface of the substrate 102, and trenches can be etched through the dielectric layer. Heteroepitaxial structures can then be epitaxially grown in the trenches using a material different from the substrate 102, and the dielectric layer can be recessed such that the heteroepitaxial structures protrude from the dielectric layer to form the fins 206, 208, 210, 212, and 214. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-well 108 and the n-well 110 different from the material in the p-well 106, the p-well 112, and the p-well 114. In various embodiments, upper portions of the fins 206, 208, 210, 212, and 214 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

In some embodiments, the grown materials of the epitaxial fins 206, 208, 210, 212, and 214 may be in situ doped during growth, which may obviate the implantations, although in situ and implantation doping may be used together.

Regardless of the process used to form the fins 206, 208, 210, 212, and 214, in some embodiments the fins 206, 208, 210, 212, and 214 may be further doped in a separate process to increase the dopant concentration in the fins 206, 208, 210, 212, and 214. In some embodiments, the upper portion of the fins 206, 208, 210, 212, and 214 may be doped to a concentration between about $10^{19}$ cm$^{-3}$ and about $10^{21}$ cm$^{-3}$ of additional p-type or n-type impurities as appropriate. Masks may be used to protect parts of the fins 206, 208, 210, 212, and 214 while other areas are implanted. This implantation process uses processes and materials similar to those used in the process of forming the wells as discussed above with respect to FIG. 2.

Figure 10:
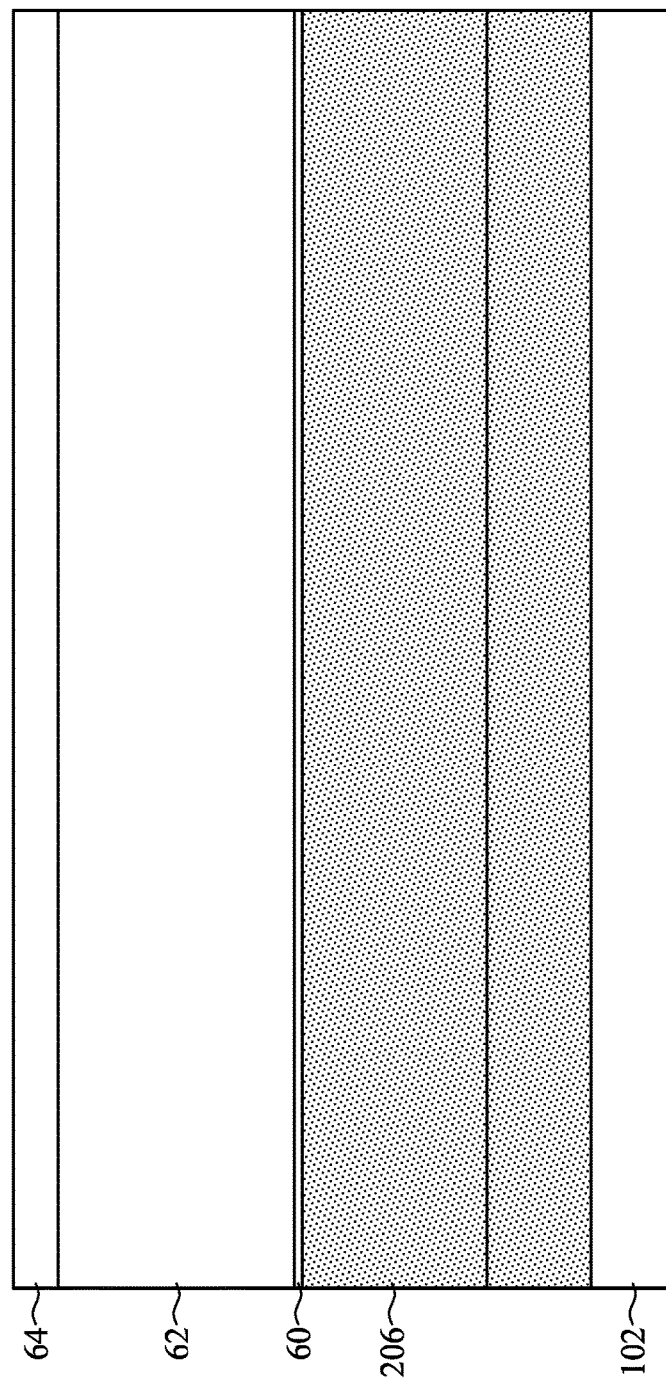

In FIG. 10, a cross-sectional view along one of the fins 206 (see FIG. 9, line C-C) is illustrated, in accordance with some embodiments. A gate dielectric layer 60 is formed on the fins 206, 208, 210, 212, and 214. The gate dielectric layer 60 may be, for example, silicon oxide, silicon nitride, silicon oxy-nitride, or high-k dielectrics a combination thereof, or the like, and may be deposited or thermally grown according to acceptable techniques. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 112 is a high-k dielectric layer with a thickness in the range of about 0.2 nm to 50 nm. The gate dielectric layer 60 may be formed by a suitable process such as atomic layer deposition (ALD), chemical vapor deposition (CVD), physical vapor deposition (PVD), thermal oxidation or UV-ozone oxidation.

A gate layer 62 is formed over the gate dielectric layer 60, and a mask layer 64 is formed over the gate layer 62. The gate layer 62 may be deposited over the dielectric layer 60 and then planarized, such as by a CMP. The mask layer 64 may be deposited over the gate layer 62. The gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The gate layer 62 may be deposited by physical vapor deposition (PVD), CVD, sputter deposition, or other techniques known and used in the art for depositing the selected material. In some embodiments, the gate layer 62 may be a dummy gate layer which is later replaced in a replacement gate cycle. The gate layer 62 may be made of other materials that have a high etching selectivity from the etching of isolation regions.

The mask layer 64 may include, for example, silicon nitride, silicon oxynitride, or the like. In some embodiments, the gate dielectric layer 60 may be deposited such that the gate dielectric layer 60 covers the STI regions 240, extending between the gate layer 62 and the STI regions 240.

Figure 11:
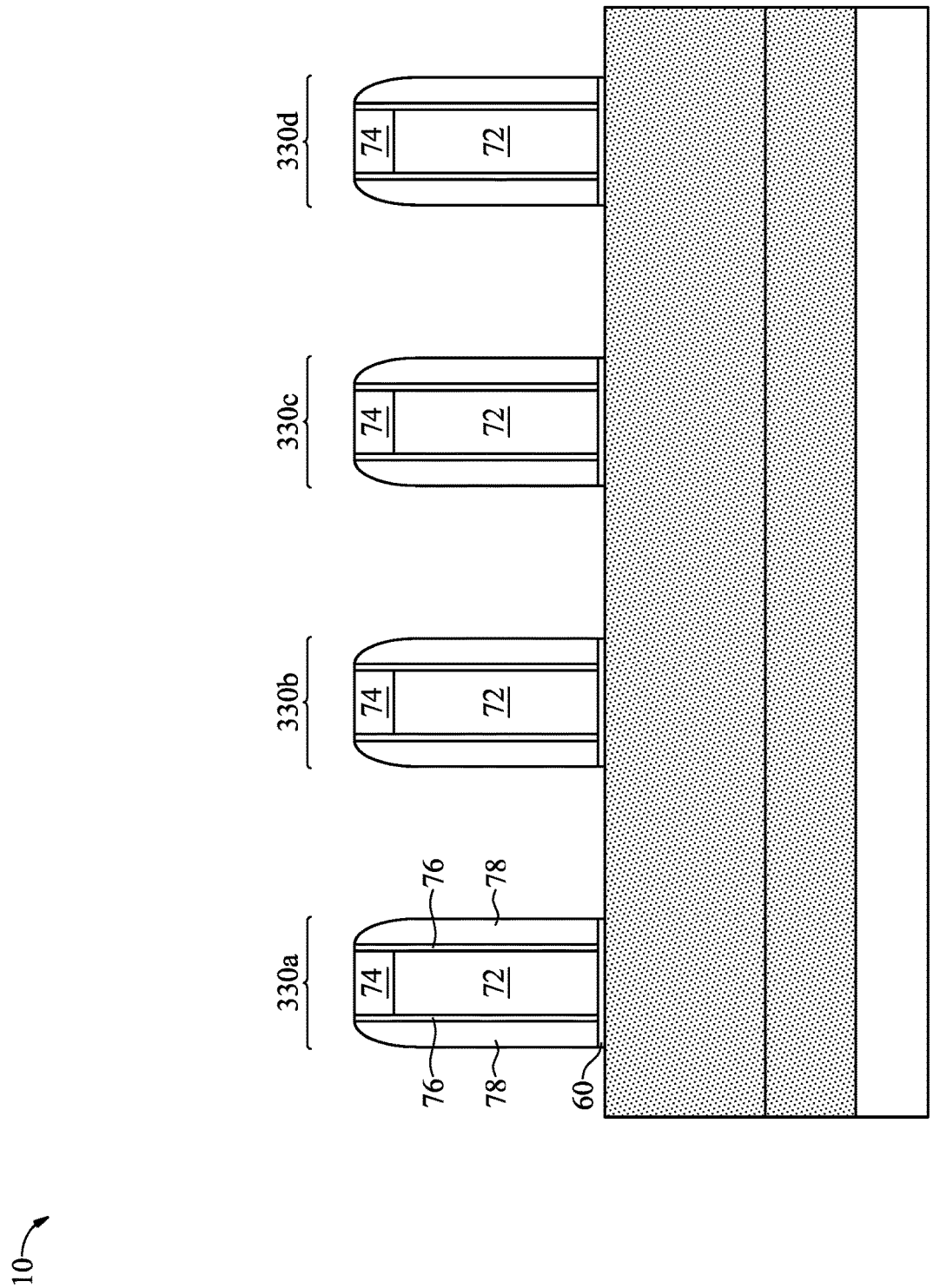

In FIG. 11, the mask layer 64 (see FIG. 10) may be patterned using acceptable photolithography and etching techniques to form masks 74. The pattern of the masks 74 then may be transferred to the gate layer 62 to form gate electrodes 72. In some embodiments, the pattern of the masks 74 may also be transferred to the gate dielectric layer 60. The gate electrodes 72 cover respective channel regions of the fins 206, 208, 210, 212, and 214. The pattern of the masks 74 may be used to physically separate each of the gate electrodes 72 from adjacent gate electrodes, thereby forming gates 330*a*, 330*b*, 330*c*, and 330*d*. Similar gates are also formed simultaneously (see FIG. 12). The gate electrodes 72 may also have a lengthwise direction substantially perpendicular to the lengthwise direction of respective fins 206, 208, 210, 212, and 214.

The gates 310*a-d*, 320*a-d*, 330*a-d*, 340*a-d*, and 350*a-d* provide separation between the subsequently formed epitaxial terminal regions (see FIG. 14). The quality and consistency of the epitaxial regions are improved by their separation using the gates 310*a-d*, 320*a-d*, 330*a-d*, 340*a-d*, and 350*a-d*. The formation of gates 310*a-d*, 320*a-d*, 330*a-d*, 340*a-d*, and 350*a-d* also allow for using the same processes to form these gates at the same time as forming another device which is not a BJT in another area of the die. For example, in forming the device 10, the source/drain epitaxies formed on either side of the gates will be tied together, however, in another device on the same die, these source/drain areas may be left separated and coupled to electrically separate signals, for example in forming a metal-oxide field-effect transistor (MOSFET) or the like.

Figure 12:
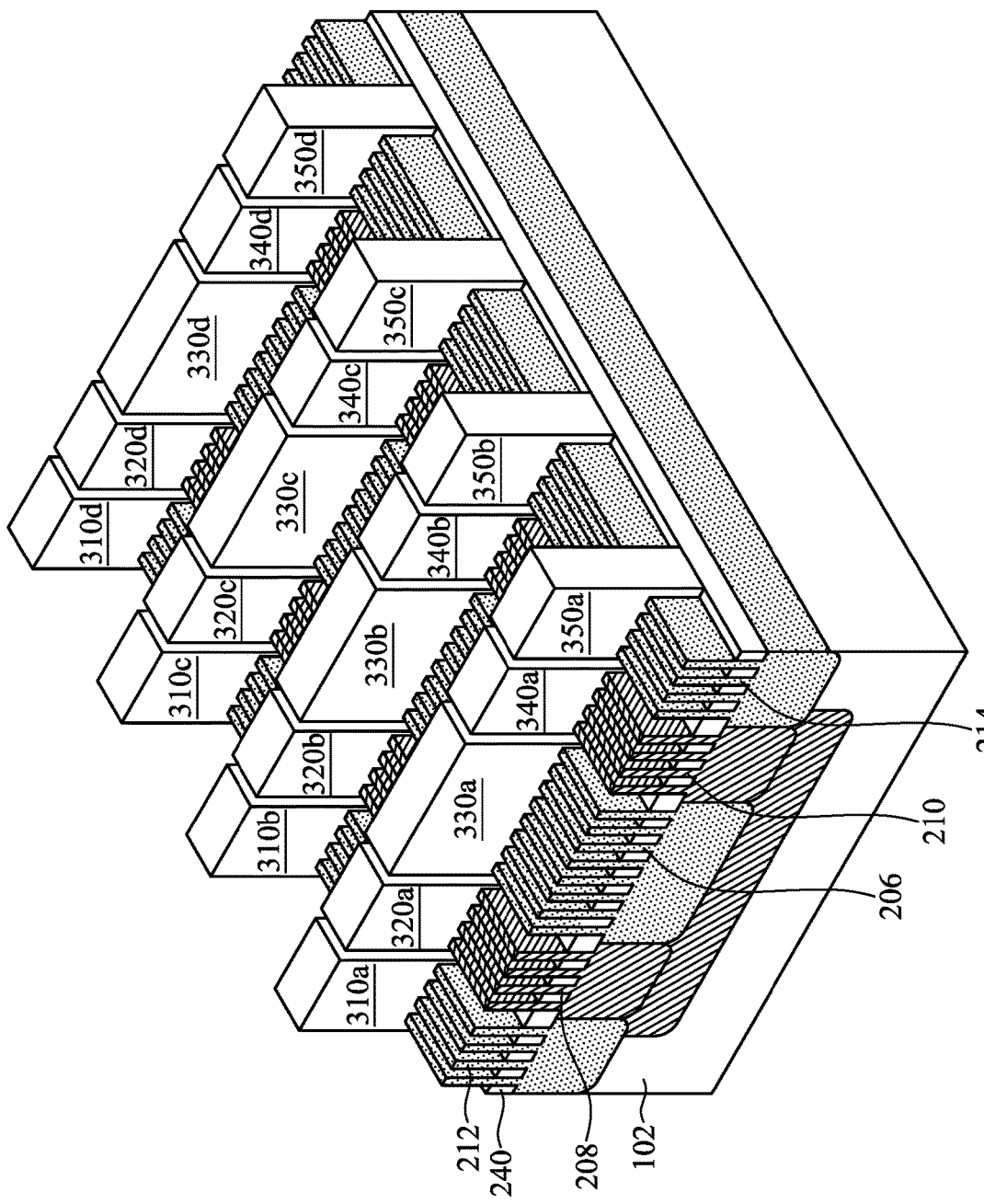

In another embodiment, the gates in each row (see FIG. 12) may all be formed as one joined gate. For example, gates 310*a*, 320*a*, 330*a*, 340*a*, and 350*a* may be a single gate structure which extends over all the fins 206, 208, 210, 212, and 214. In another embodiment, the gates in each row (see FIG. 12) may all be formed as a combination of joined gates and separate gates. For example, gates 320*a*, 330*a*, and 340*a* may be formed as a single gate structure which extends over all the fins 206, 208, and 210, while gates 310*a* and 350*a* may be formed as separate gates as illustrated in FIG. 12. In these embodiments, the gates may be separated in a gate cutting process, described below with respect to FIGS. 27 through 28.

Further in FIG. 11, gate seal spacers 76 can be formed on exposed surfaces of the gate electrodes 72, the masks 74, and/or the fins 206, 208, 210, 212, and 214. A thermal oxidation or a deposition followed by an anisotropic etch may form the gate seal spacers 76. The gate seal spacers 76 may be formed of silicon oxide, silicon nitride, silicon oxynitride, or the like.

Further in FIG. 11, gate spacers 78 are formed on the gate seal spacers 76 along sidewalls of the gate electrodes 72 and the masks 74. The gate spacers 78 may be formed by conformally depositing an insulating material and subsequently anisotropically etching the insulating material. The insulating material of the gate spacers 78 may be silicon oxide, silicon nitride, silicon oxynitride, silicon carbonitride, a combination thereof, or the like.

FIG. 12 provides a perspective view illustrating individual gates 310*a-d*, 320*a-d*, 330*a-d*, 340*a-d*, and 350*a-d* formed over respective groups of fins 206, 208, 210, 212, and 214. FIG. 12 illustrates rows a through d of gates 310, 320, 330, 340, and 350. However, it should be understood that additional rows may be included. In some embodiments, for example, a single BJT may use between 15 and 40 rows of gates disposed over respective fins 206, 208, 210, 212, and 214. In some embodiments, a single BJT may use between 20 and 30, between 1 and 15, or between 40 and 55 rows of gates; other embodiments may use more than 55 rows of gates.

Some designs may provide the gates over the emitter and base signals (for example corresponding to the fins 206, 208, and 210) as one continuous gate so that gates 320*a*, 330*a*, and 340*a*, for example, would be formed as one structure. Separating the gate 320*a* over the base from the gate 330*a* over the emitter of the BJT, however, improves voltage response. Also, providing a minimum distance between the gate ends of the base gate and emitter gates (e.g., gate 320*a* and gate 330*a*) reduces leakage and also improves voltage response. These distances are discussed in greater detail below with respect to FIG. 15.

Figure 13:
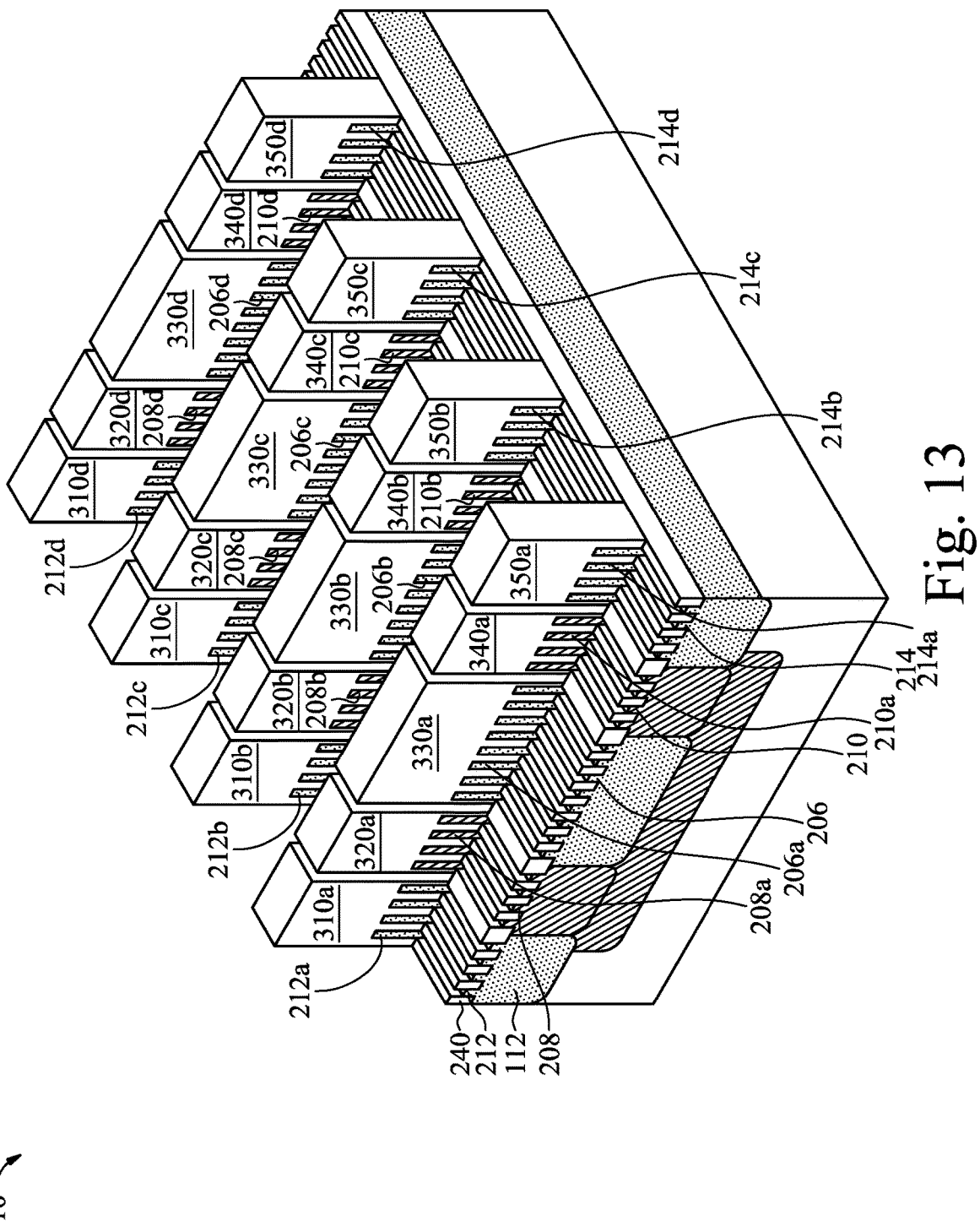

In FIG. 13, recesses are formed in the fins 206, 208, 210, 212, and 214 between the gate structures in rows a through d. The recesses may be formed by etching the fins 206, 208, 210, 212, and 214. In some embodiments, the fins 206, 208, 210, 212, and 214 may be etched so that the upper surface of the fins 206, 208, 210, 212, and 214 after etching is below an upper surface of the STI 240 (as illustrated). In other embodiments, the fins 206, 208, 210, 212, and 214 may be etched so that the upper surface of the fins 206, 208, 210, 212, and 214 still protrudes from the upper surface of the STI 240 after etching. The gates 310, 320, 330, 340, and 350 in rows a through d protect a portion of the fins 206, 208, 210, 212, and 214 during the recessing, forming channel regions 206a-d, 208a-d, 210a-d, 212a-d, and 214a-d. These channel regions 206a-d, 208a-d, 210a-d, 212a-d, and 214a-d provide a point of contact between the gates and BJT collectors, emitters, and bases.

Figure 14:
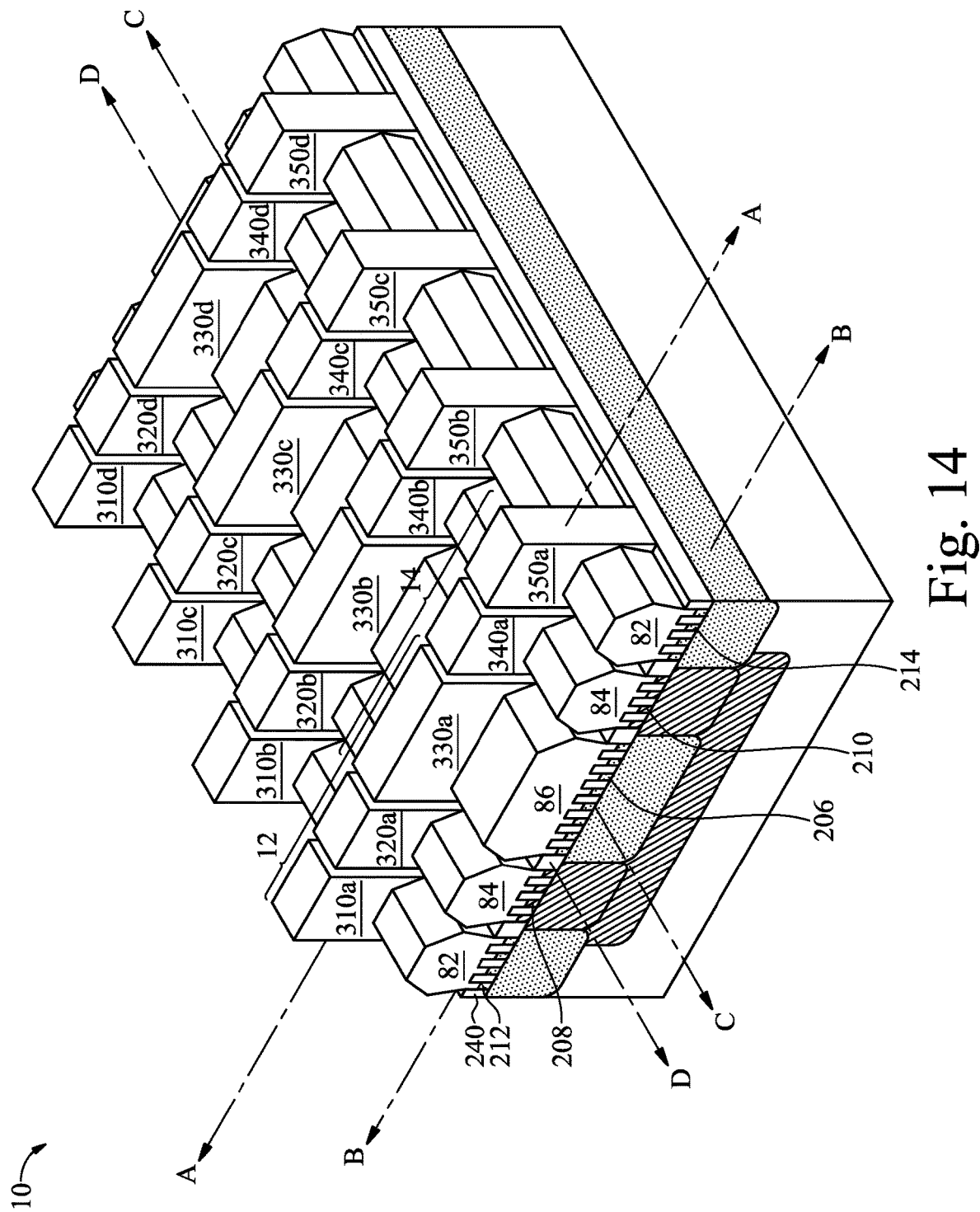

In FIG. 14, epitaxial collector regions 82, epitaxial base regions 84, and epitaxial emitter regions 86 are formed in the recesses and over the fins 206, 208, 210, 212, and 214. The epitaxial collector regions 82, the epitaxial base regions 84, and the epitaxial emitter regions 86 are formed in the fin 206, 208, 210, 212, and 214 such that each gate 310a-d, 320a-d, 330a-d, 340a-d, and 350a-d are disposed between respective neighboring pairs of the epitaxial collector regions 82, the epitaxial base regions 84, and the epitaxial emitter regions 86. In some embodiments, the gate spacers 78 are used to separate the epitaxial collector regions 82, the epitaxial base regions 84, and the epitaxial emitter regions 86 from the gate electrodes 72 by an appropriate lateral distance so that the epitaxial collector regions 82, the epitaxial base regions 84, and the epitaxial emitter regions 86 do not short out to the gate electrodes 72 or any subsequently formed replacement gate of the resulting BJTs.

In some embodiments, the epitaxial collector regions 82 and the epitaxial emitter regions 86 are formed in a first epitaxial process because they share the same conductivity and the epitaxial base regions 84 are formed in a second epitaxial process because they share the same opposite conductivity, though either the first or second epitaxial process may be performed first.

In forming the epitaxial collector regions 82 and epitaxial emitter regions 86, a mask may be formed over the structure and patterned to protect the areas where the epitaxial collector regions 82 and epitaxial emitter regions 86 are not to be formed, including the area of the epitaxial base regions 84. The epitaxial collector regions 82 and epitaxial emitter regions 86 may then be selectively grown from the fins. The epitaxial collector regions 82 may be grown from the fins 212 and 214, and the epitaxial emitter regions 86 may be grown from the fins 206. In some embodiments, the epitaxial emitter regions 86 and the epitaxial collector regions 82 are epitaxial-grown silicon germanium (SiGe) by CVD process, and may be in-situ doped during the epitaxial process with a p-type dopant. In some embodiments the epitaxial emitter regions 86 and the epitaxial collector regions 82 may be subsequently or instead doped with an implantation process with a p-type dopant. The p-type dopant for the epitaxial collector regions 82 and epitaxial emitter regions 86 may be any of the p-type impurities (or dopants) previously discussed.

In forming the epitaxial base regions 84, a mask may be formed over the structure and patterned to protect the areas where the epitaxial base regions 84 are not to be formed, including the area of the epitaxial collector regions 82 and the epitaxial emitter regions 86. The epitaxial base regions 84 may then be selectively grown from the fins 208 and 210. In some embodiments, the epitaxial base regions 84 are epitaxial-grown silicon Si), silicon phosphide (SiP), or silicon carbide (SiC) by CVD process, and may be in-situ doped during the epitaxial process with an n-type dopant. In some embodiments the epitaxial base regions 84 may be subsequently or instead doped with an implantation process with an n-type dopant. The n-type dopant for the epitaxial base regions 84 may be any of the n-type impurities (or dopants) previously discussed.

As a result of the epitaxy processes used to form the epitaxial collector region 82, the epitaxial base region 84, and the epitaxial emitter region 86, upper surfaces of these epitaxial regions have facets which expand laterally outward beyond sidewalls of the fins 206, 208, 210, 212, and 214. In some embodiments, these facets cause adjacent epitaxial regions of the epitaxial collector region 82, the epitaxial base region 84, and the epitaxial emitter region 86 to merge, such as illustrated in FIG. 14. In other embodiments, adjacent epitaxial structures may remain separated after the epitaxy growth process.

Following growing the epitaxial collector regions 82, the epitaxial base regions 84, and the epitaxial emitter regions 86, the dopant concentration for each p-type and n-type dopant in the epitaxial regions may have a concentration between about $10^{19}$ cm$^{-3}$ and about $10^{21}$ cm$^{-3}$. Following growing the epitaxial collector regions 82, the epitaxial base regions 84, and the epitaxial emitter regions 86, an anneal may be performed in one or more annealing processes to activate the dopants.

The fins 212 and the epitaxial collector region 82 disposed thereon, the fins 208 and the epitaxial base region 84 disposed thereon, and the fins 206 and the epitaxial emitter region 86 disposed thereon form a first lateral PNP BJT 12 (see also FIG. 3a). Each of these epitaxial regions may be respectively coupled together for n number of rows of gates (e.g., gates $3101_{1-n}$, $320_{1-n}$, and $330_{1-n}$), to adjust the length of the PNP BJT 12 to a form a lateral PNP BJT 12 of a desired length.

The fins 214 and the epitaxial collector region 82 disposed thereon, the fins 210 and the epitaxial base region 84 disposed thereon, and the fins 206 and the epitaxial emitter region 86 disposed thereon form a second lateral PNP BJT 14 (see also FIG. 3b). Each of these epitaxial regions may be respectively coupled together for m number of rows of gates (e.g., gates $350_{1-m}$, $340_{1-m}$, and $330_{1-m}$), to form a lateral PNP BJT 14 of a desired length. As illustrated in FIG. 3a, the first lateral PNP BJT 12 and second linear PNP BJT 14 will be coupled by a common epitaxial emitter region 86. As illustrated in FIG. 3b, the first lateral PNP BJT 12 and second linear PNP BJT 14 may also have coupled epitaxial base regions 84 and coupled epitaxial collector regions 82.

As a result of the epitaxial growth processes used to form the epitaxial collector region 82, the epitaxial base region 84, and the epitaxial emitter region 86, upper surfaces of these epitaxial regions have facets which expand laterally outward beyond sidewalls of the fins 206, 208, 210, 212, and 214. In some embodiments, these facets may cause adjacent epitaxial regions of the epitaxial collector region 82, the epitaxial base region 84, and the epitaxial emitter region 86 to respectively merge as illustrated by FIG. 14. In other embodiments, adjacent epitaxial structures may remain separated (i.e., unmerged) after the epitaxy process.

FIGS. 15, 19, 23, 28, 29, 33, and 37 are along the A-A cross-section (see FIG. 2). FIGS. 16, 20, 24, 30, 34, and 38 are along the B-B cross-section (see FIG. 2). FIGS. 17, 21, 25, 31, 35, and 39 are along the C-C cross-section (see FIG. 2). FIGS. 18, 22, 26, 32, 36, and 40 are along the D-D cross-section (see FIG. 2).

Figure 15:
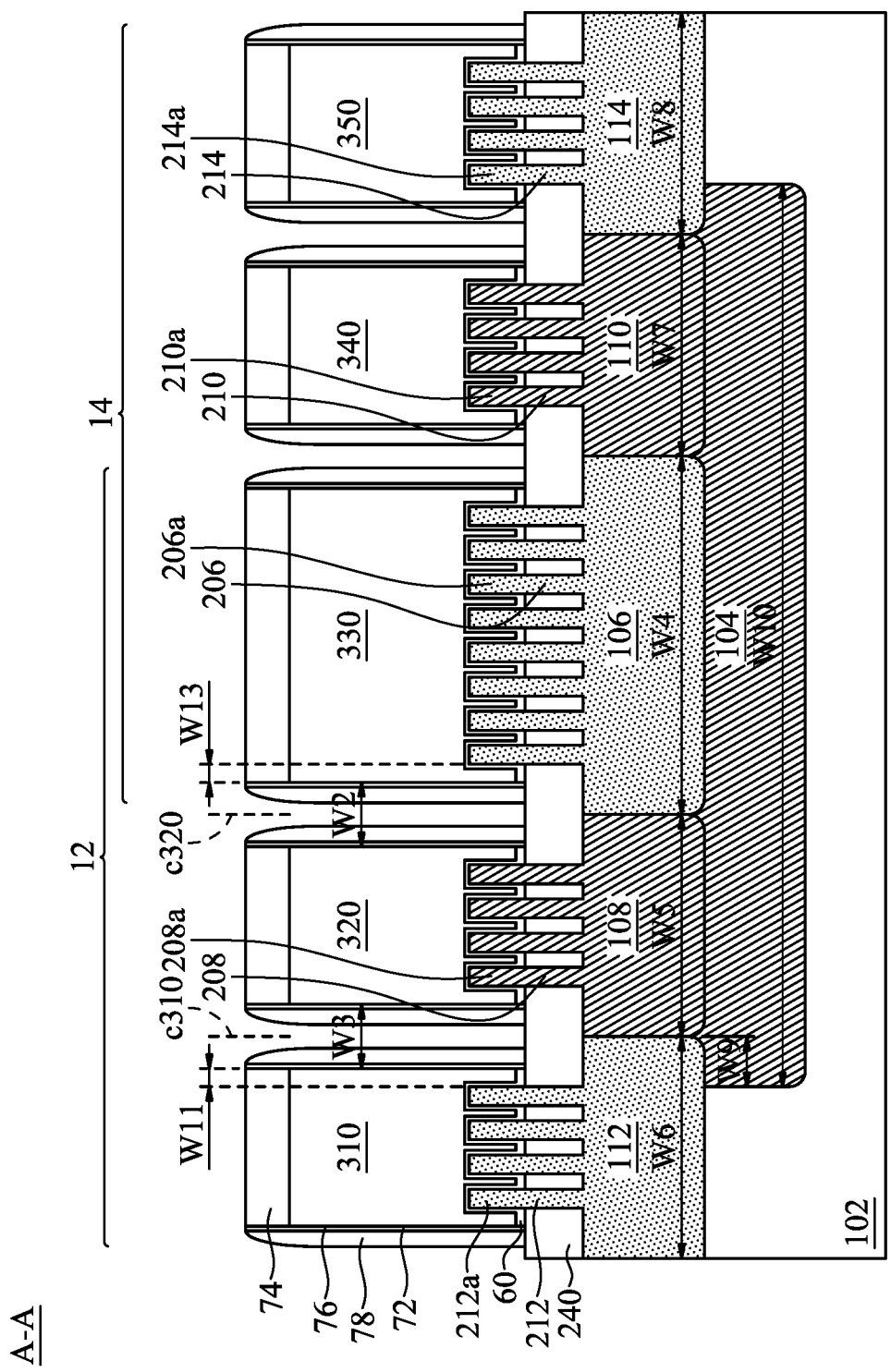
Figure 16:
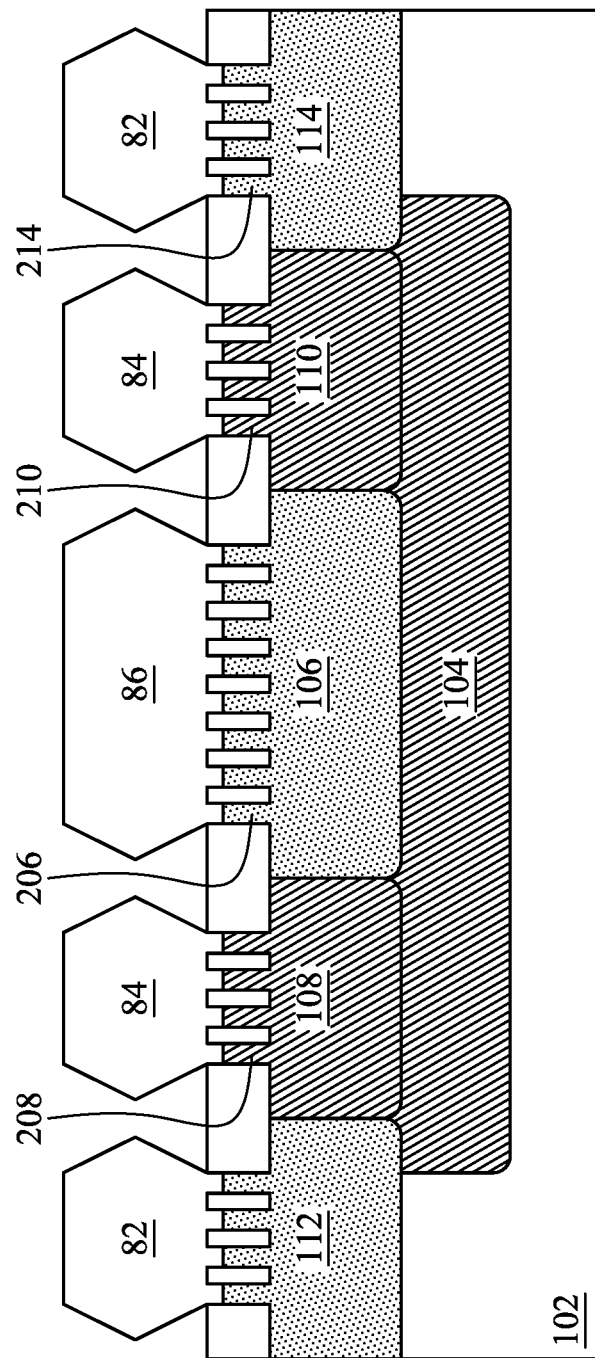
Figure 17:
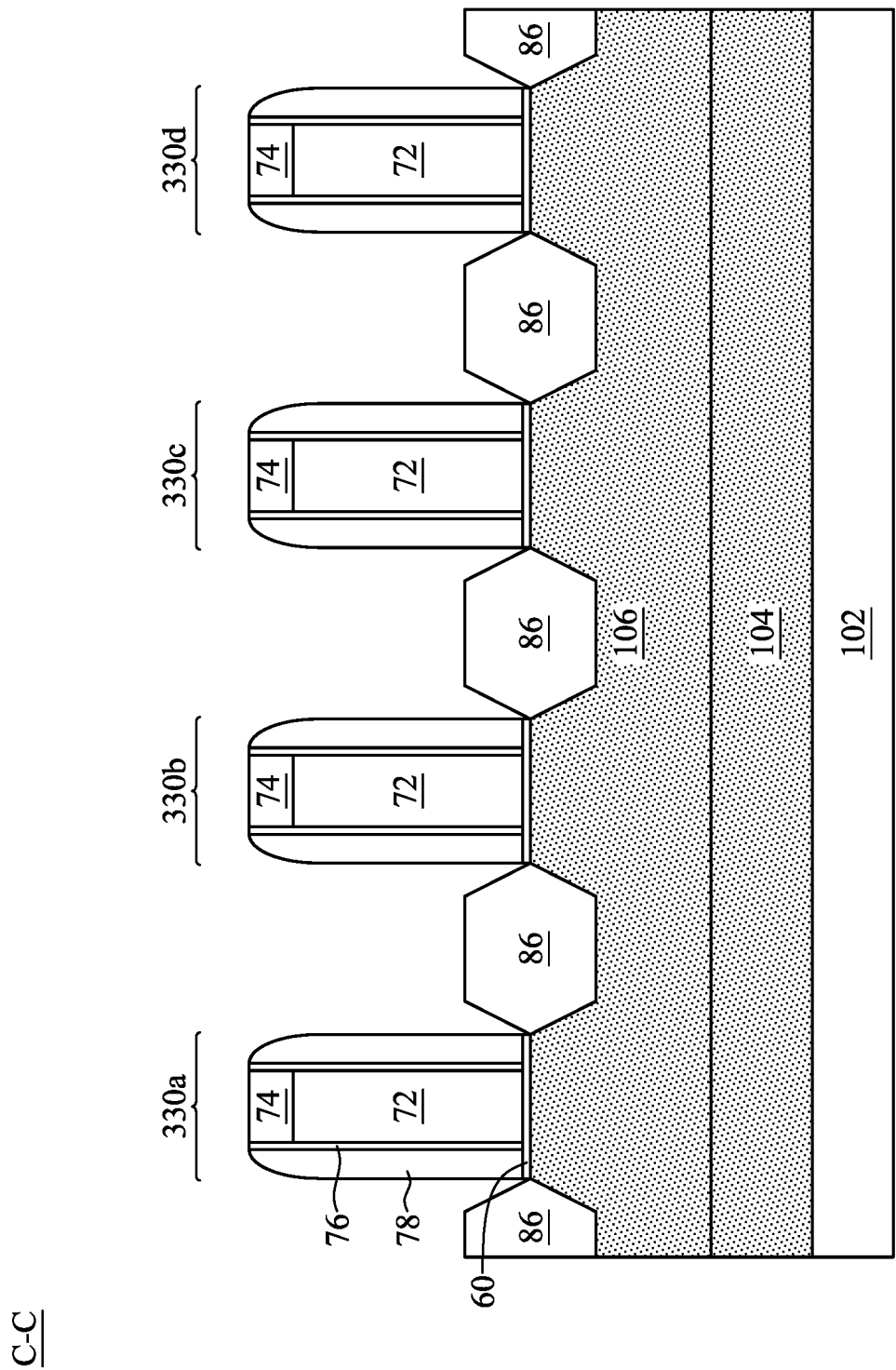
Figure 18:
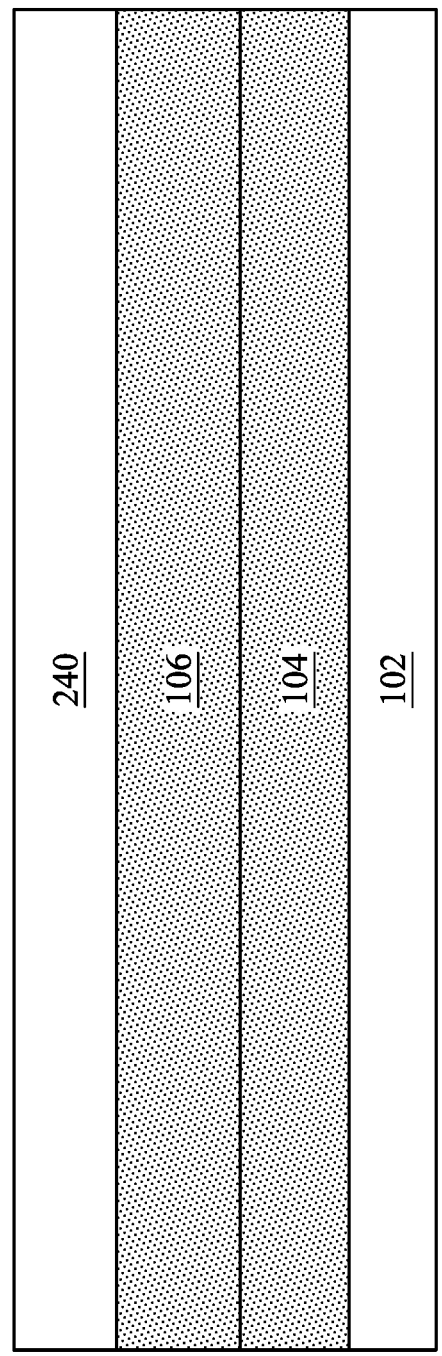
Figure 19:
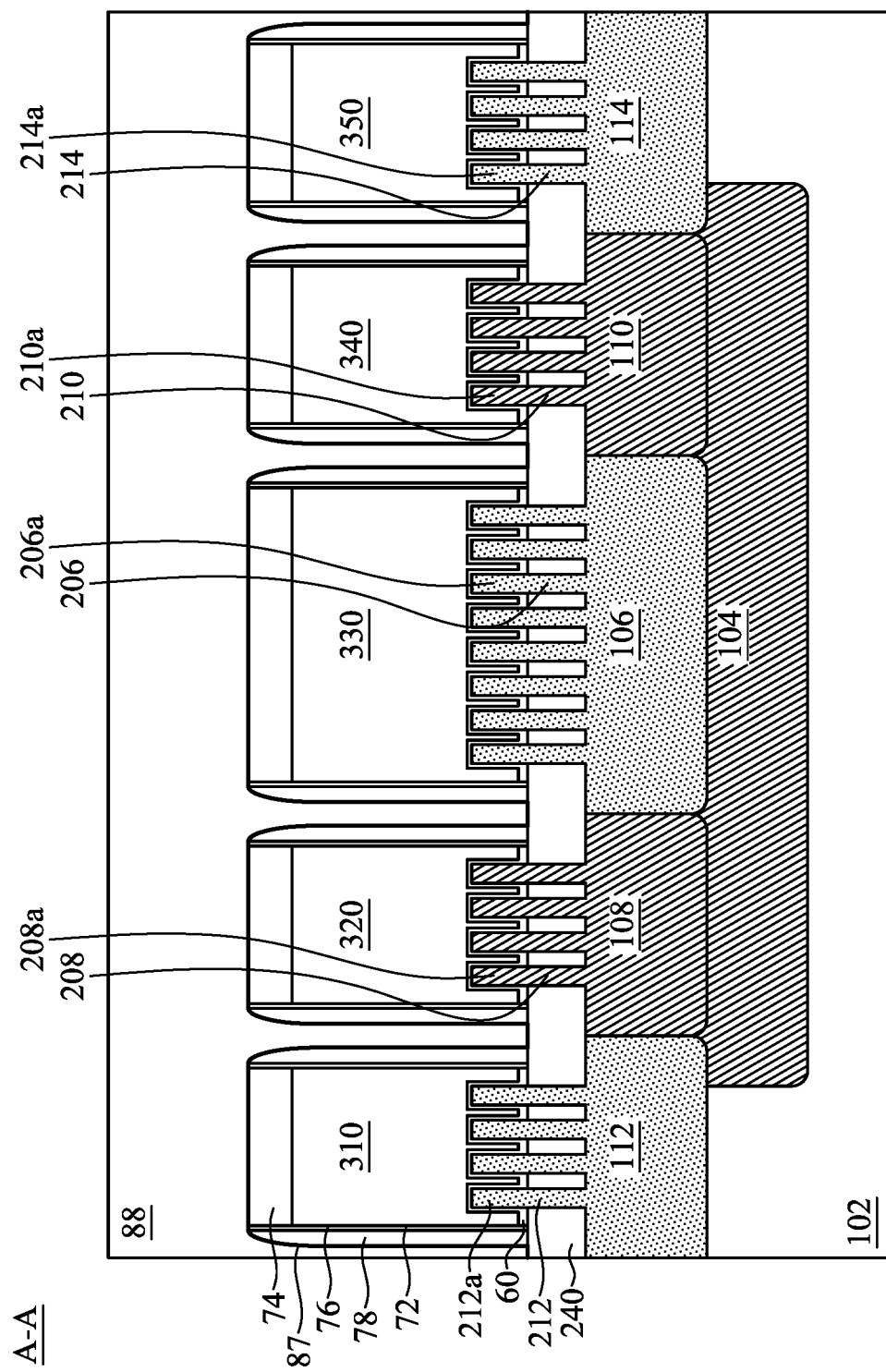
Figure 20:
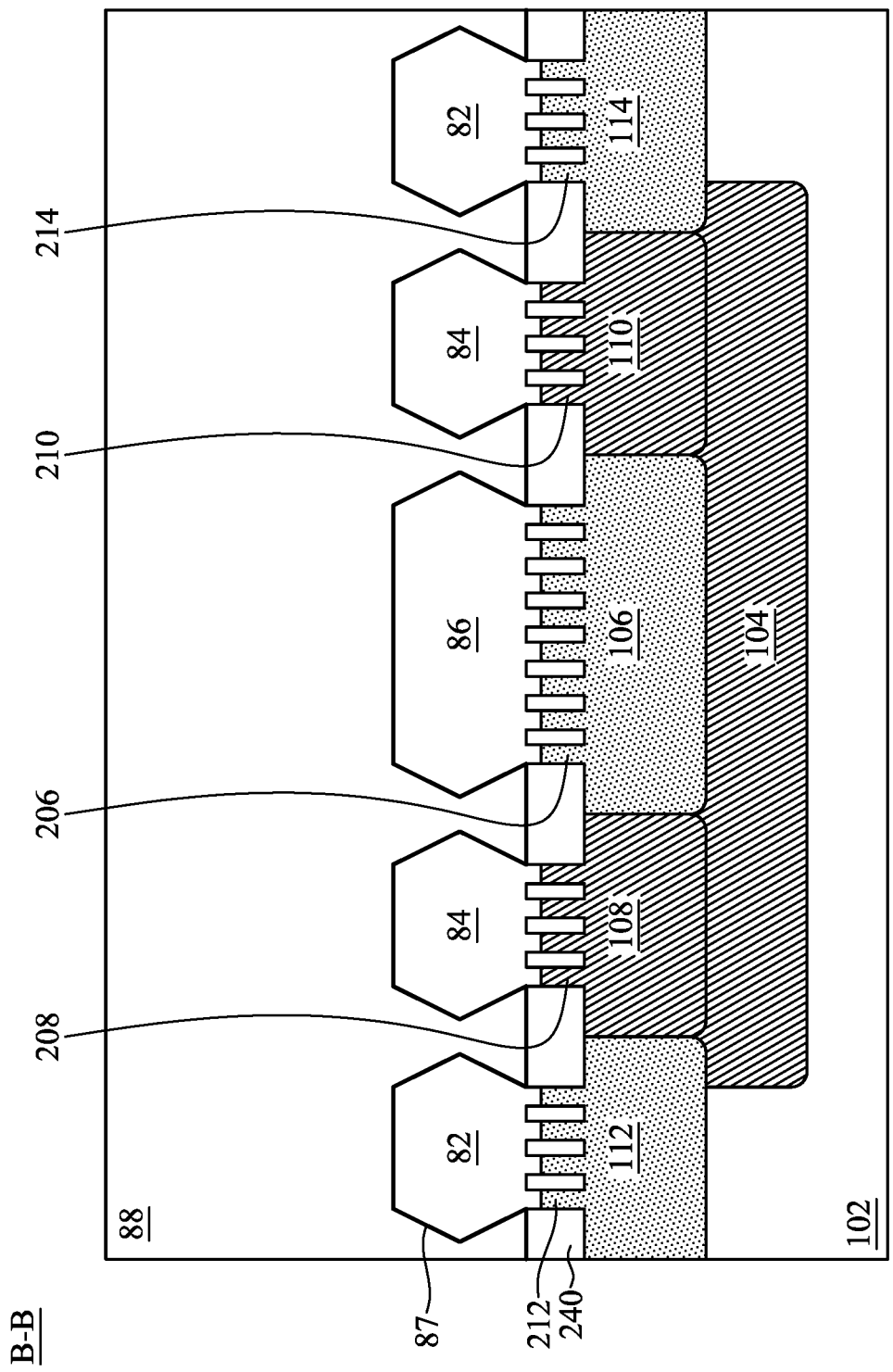
Figure 21:
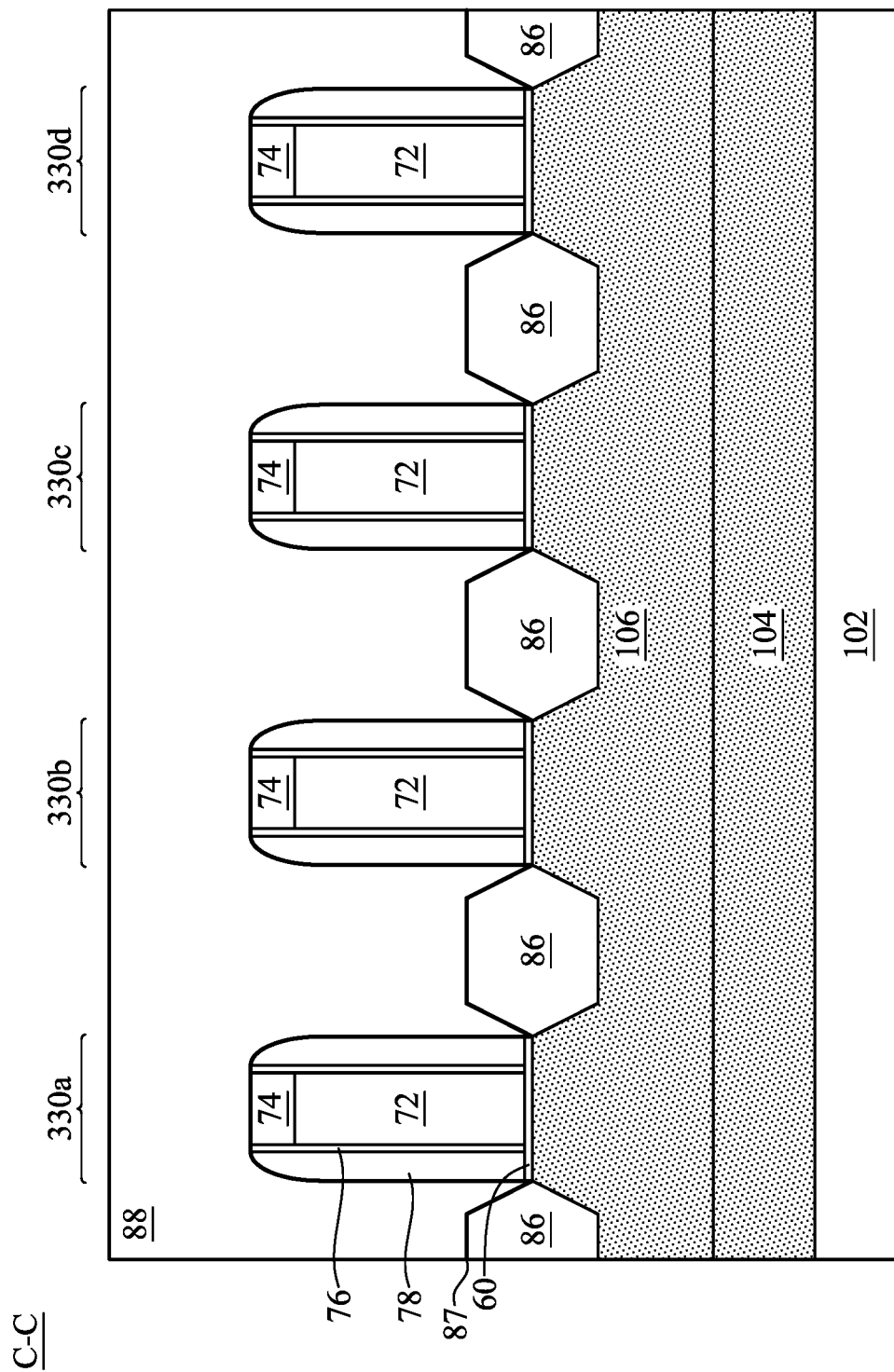
Figure 22:
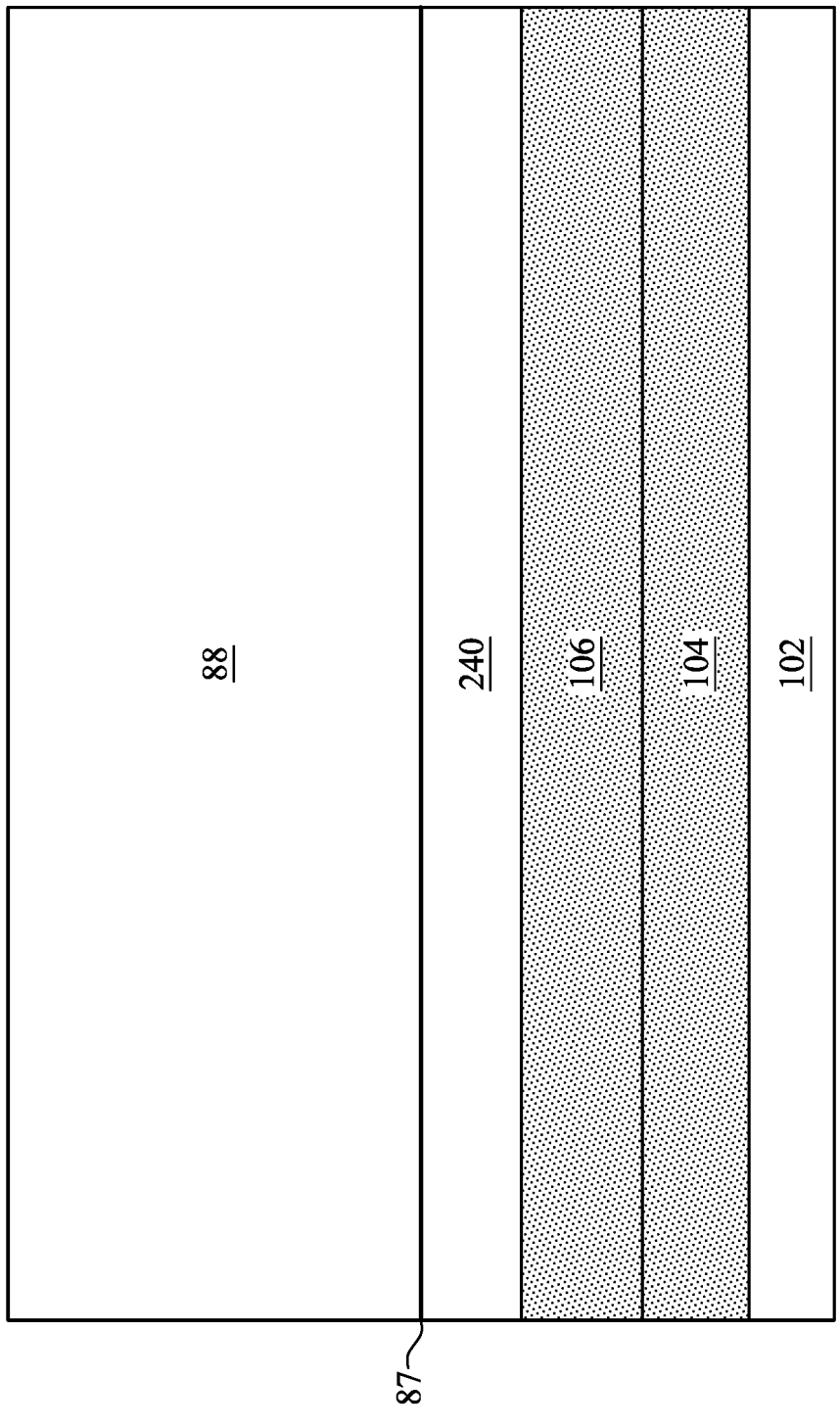
Figure 23:
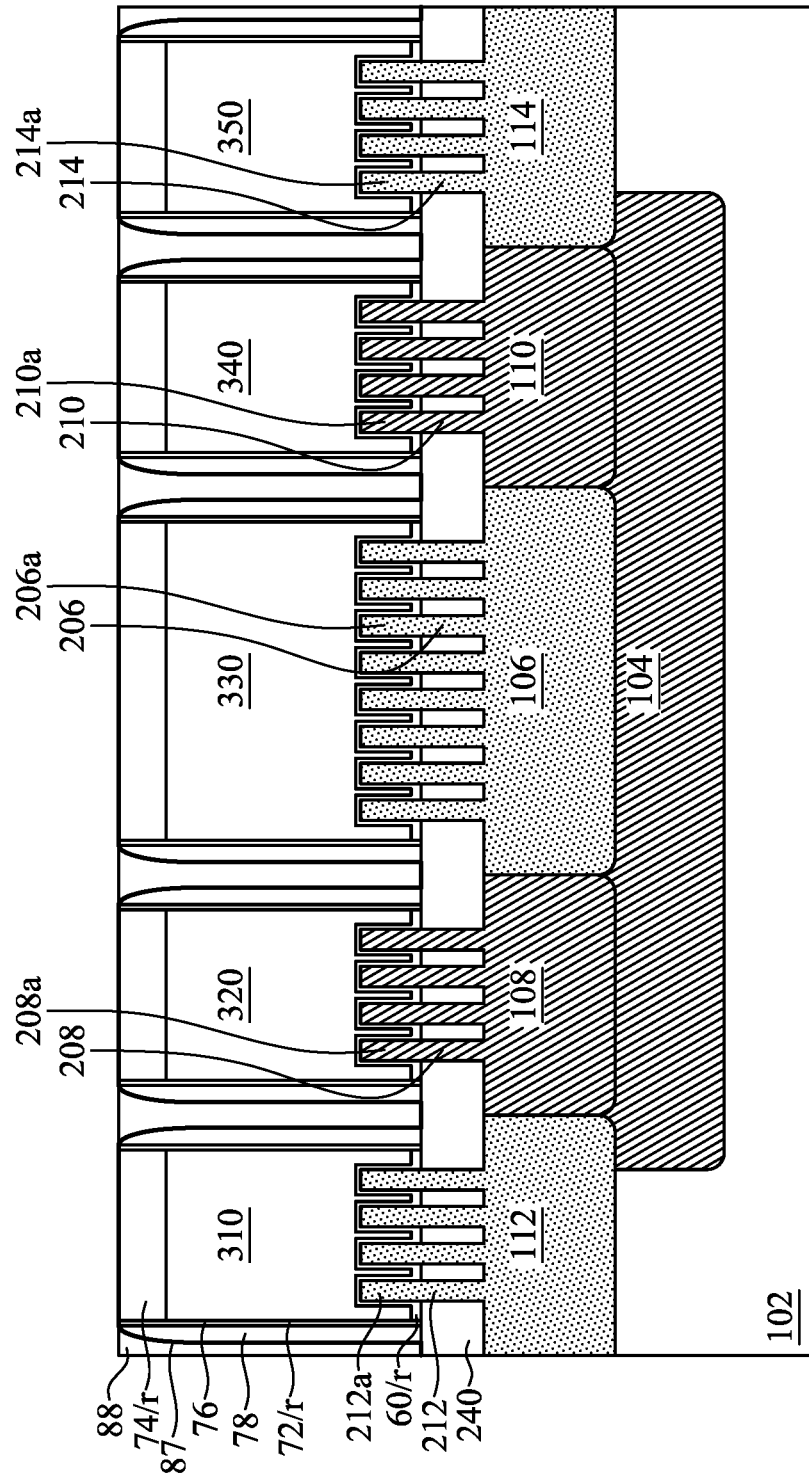
Figure 24:
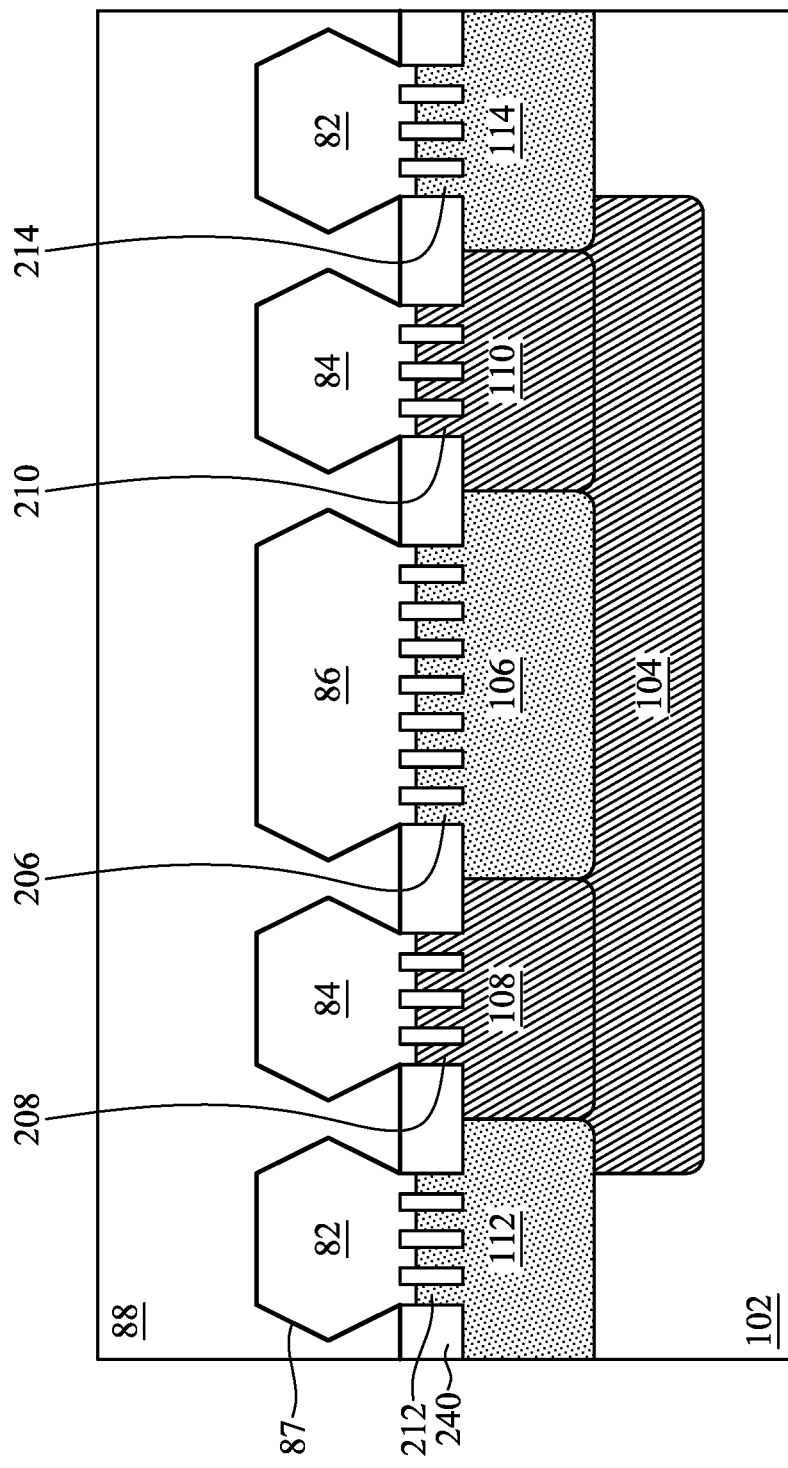
Figure 25:
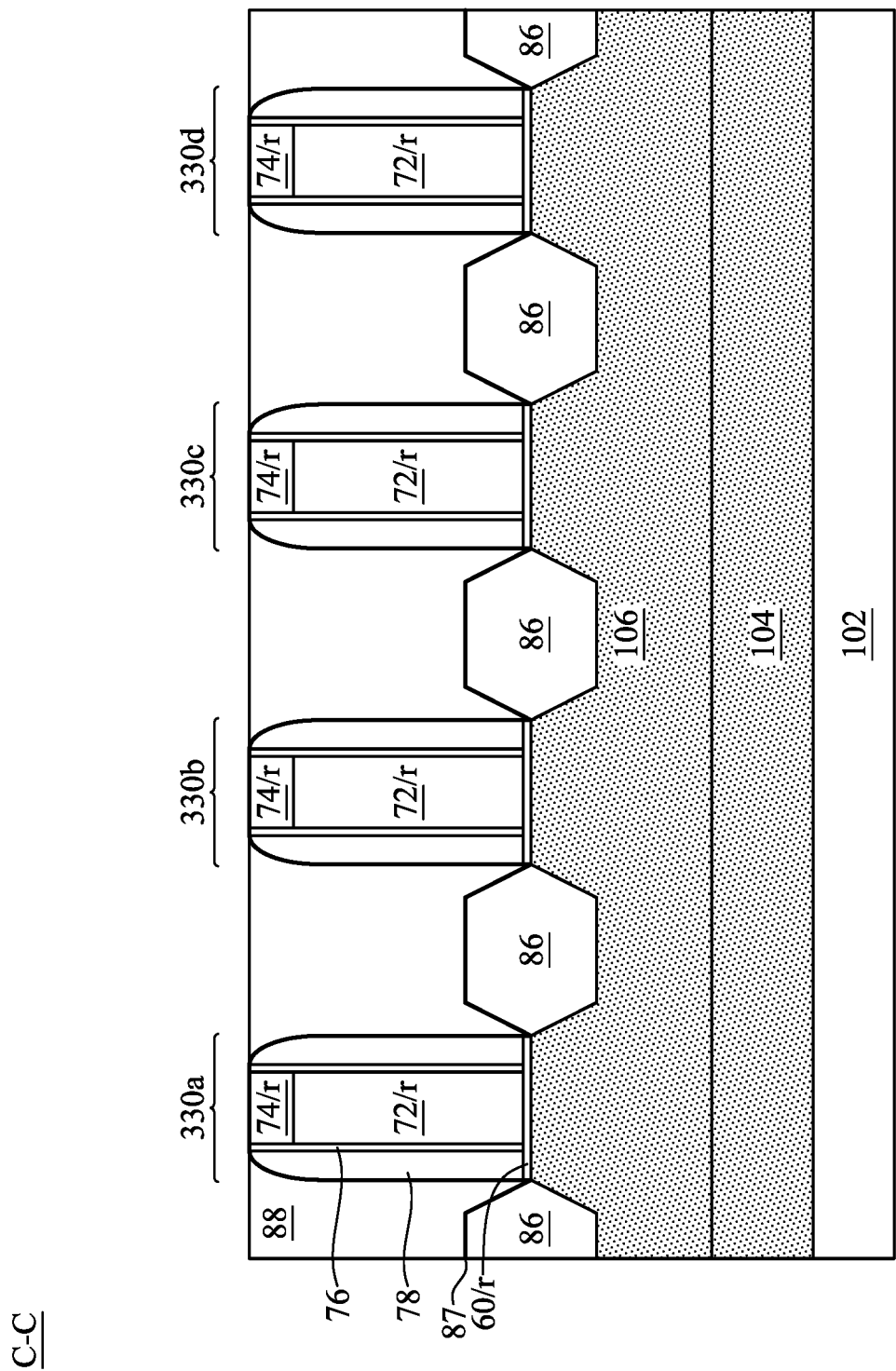
Figure 26:
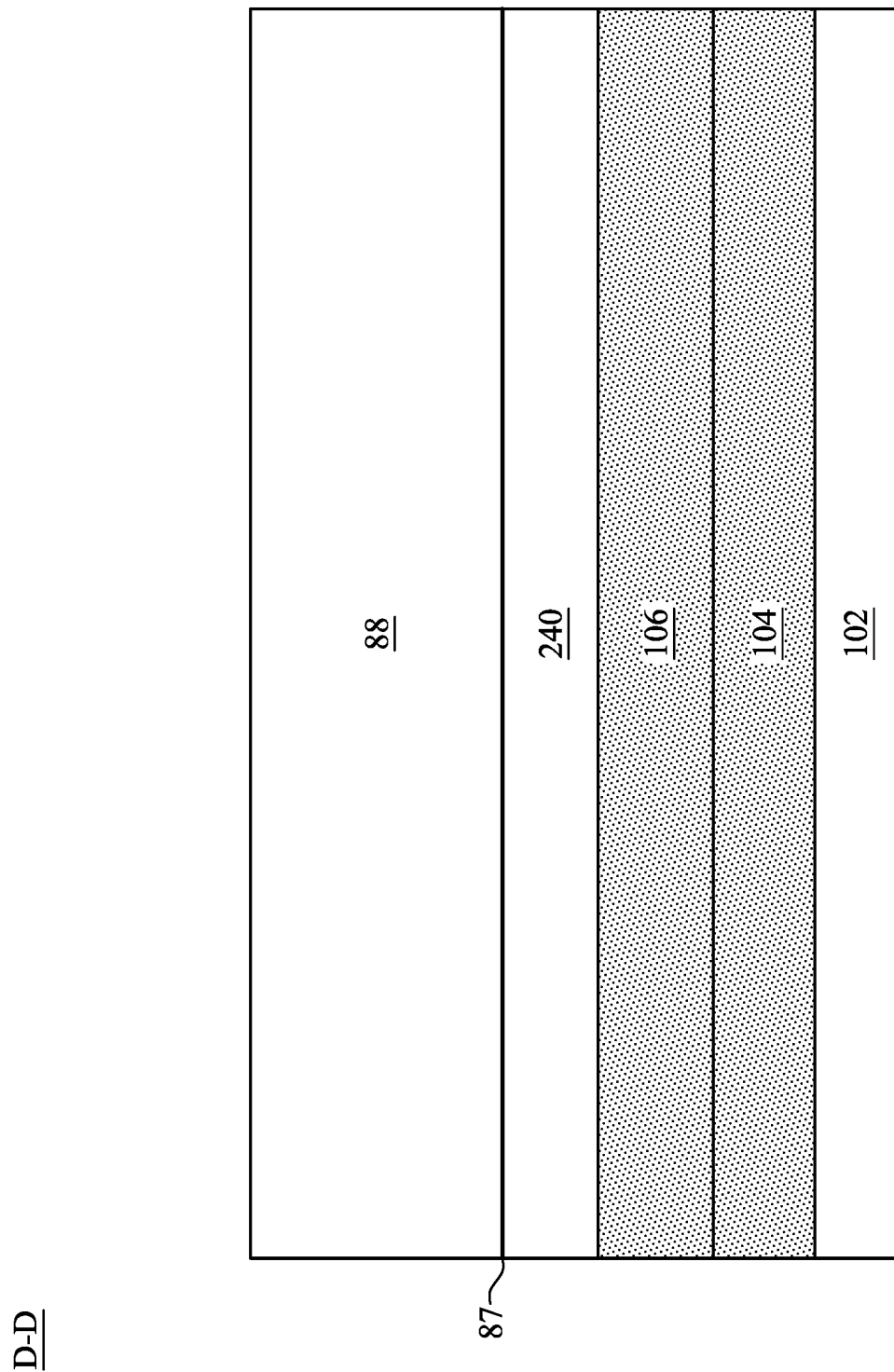

FIGS. 15, 16, 17, and 18 illustrate cross-sectional views of the device 10 of FIG. 14. These illustrations provide additional detail regarding the above described processes. As illustrated in FIG. 15, the width W2 between the ends of the gate 320 over the BJT base and the gate 330 over the BJT emitter may be between about 100 nm and about 400 nm, such as about 150 nm. The minimum width of W2 should be at least 100 nm to about 120 nm, such as about 110 nm to reduce leakage and maintain design constraints. The width W3 between the ends of the gate 320 over the BJT base and the gate 310 over the BJT collector may be between about 200 nm and about 500 nm, such as about 250 nm μm. The width W4 of the p-type well 106 for the emitter may be between about 500 nm and about 1000 nm, such as about 800 nm. The widths W5 and W7 of the n-type wells 108 and 110 for the BJT bases may be between about 300 nm and about 700 nm, such as about 500 nm. The widths W6 and W8 of the p-type wells 112 and 114 for the collectors may be between about 300 nm and about 700 nm, such as about 500 nm. The deep well 104 and p-type well 112 may overlap by a width W9, between about 0 nm and about 100 nm, such as about 0 nm. The width W10 of the deep well 104 may be between about 1500 nm and about 2000 nm, such as about 1800 μm.

The interface between the p-type well 106 and the n-type well 108 may be aligned to the gap (corresponding to the width W2) between gate 320 and gate 330. The centerline c320 is the center of the gap between gate 320 and gate 330. This interface may have a horizontal distance from the centerline c320 between 0% and 30% of the width W2 in either direction, though other values are contemplated and may be used. The same holds for the interface between the p-type well 106 and the n-type well 110 and the gap between gate 330 and gate 340. Similarly, the interface between the p-type well 112 and the n-type well 108 may be aligned to the gap (corresponding to the width W3) between gate 310 and 320. The centerline c310 is the center of the gap between gate 310 and gate 320. This interface may have a horizontal distance from the centerline c310 between 0% and 30% of the width W3 in either direction, though other values are contemplated and may be used. The same holds for the interface between the p-type well 114 and the n-type well 110 and the gap between gate 340 and gate 350.

The distance W11 between the outermost fin edge of fins 212a and the edge of the gate 310 may be between 100 nm and about 300 nm, such as about 120 nm. The distance W12 between the outermost fin edge of fins 208a and the edge of the gate 320 may be between 100 nm and about 300 nm, such as about 120 nm. The distance W13 between the outermost fin edge of fins 206a and the edge of the gate 330 may be between 100 nm and about 300 nm, such as about 120 nm. The ratio of the width W2 to the distance W12 or the distance W13 may be between 1 and 3. The ratio of the width W3 to the distance W11 may be between 2 and 5. These distances and ratios are needed in order for the BJT to operate effectively, though some design variance may be acceptable outside these ranges.

The emitter fins 206 are common to both BJT 12 and BJT 14. There is also a parasitic vertical BJT formed between the emitter fins 206 and the substrate 102 through the deep n-well 104. The number of fins in the emitter region 106 should therefore be sized to create a mismatch between the parasitic vertical BJT and the lateral BJTs 12 and 10. The number of fins in the emitter region 106 may be between 3 times and 8 times the number of fins in the collector region 112 and/or base region 108, such as about 5 times. Oversizing the emitter region 106 has diminishing returns and so a balance may be found between the creating the necessary mismatch and increasing the area size/number of emitter fins 206 in the emitter region 106.

In FIGS. 19, 20, 21, and 22, a first interlayer dielectric (ILD) 88 is deposited over the structure illustrated in FIGS. 15, 16, 17, and 18. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial collector regions 82, epitaxial base regions 84, the epitaxial emitter regions 86, the masks 74, and the gate spacers 78. The CESL 87 may comprise a dielectric material, such as, silicon nitride, silicon oxide, silicon oxynitride, or the like, having a different etch rate than the material of the overlying first ILD 88.

In FIGS. 23, 24, 25, and 26, a planarization process, such as a CMP, may be performed to level the top surface of the first ILD 88 with the top surfaces of the gate electrodes 72 or the masks 74. The planarization process may also remove the masks 74 on the gate electrodes 72, and portions of the gate seal spacers 76 and the gate spacers 78 along sidewalls of the masks 74. In some embodiments, after the planarization process, top surfaces of the gate electrodes 72, the gate seal spacers 76, the gate spacers 78, and the first ILD 88 may be level. In such embodiments, the top surfaces of the gate electrodes 72 are exposed through the first ILD 88. In some embodiments, the masks 74 may remain, in which case the planarization process levels the top surface of the first ILD 88 with the top surfaces of the top surface of the masks 74.

In some embodiments, the gate electrodes 72 may be dummy gate electrodes and may be replaced. In such embodiments, the gate electrodes 72 and masks 74, if present, are removed in an etching step(s). Portions of the gate dielectric layer 60 may also be removed. In some embodiments, only the gate electrodes 72 are removed and the gate dielectric layer 60 remains and is exposed by the etching step(s). In some embodiments, the gate electrodes 72 may be removed by an anisotropic dry etch process. For example, the etching process may include a dry etch process using reaction gas(es) that selectively etch the gate electrodes 72 without etching the first ILD 88 or the gate spacers 78. Each recess exposes and/or overlies a channel region of a respective fin (e.g., 206a, 208a, 210a, 212a, and 214a). Each of channel regions 206a-d, 208a-d, 210a-d, 212a-d, and 214a-d is disposed between neighboring pairs of respective epitaxial collector regions 82, epitaxial base regions 84, and epitaxial emitter regions 86. During the removal, the gate dielectric layer 60 may be used as an etch stop layer when the gate electrodes 72 are etched. The gate dielectric layer 60 may then be optionally removed after the removal of the gate electrodes 72.

In embodiments where the gate electrodes 72 are dummy gate electrodes which are replaced, the gate electrodes 72 may be replaced with replacement gate electrodes 72r. Similarly, the gate dielectric layer 60 may be replaced with a replacement gate dielectric layer 60r. Replacement gate dielectric layers 60r are deposited conformally in the recesses (where the dummy gate is removed), such as on the top surfaces and the sidewalls of the fins (e.g., 206a, 208a, 210a, 212a, and 214a) and on sidewalls of the gate seal spacers 76/gate spacers 78. The replacement gate dielectric layers 60r may also be formed on the top surface of the first ILD 88. In accordance with some embodiments, the replacement gate dielectric layers 60r comprise silicon oxide, silicon nitride, or multilayers thereof. In some embodiments, the replacement gate dielectric layers 60r include a high-k dielectric material, and in these embodiments, the replacement gate dielectric layers 60r may have a k value greater than about 7.0, and may include a metal oxide or a silicate of hafnium, aluminum, zirconium, lanthanum, manganese, barium, titanium, lead, and combinations thereof. The formation methods of the replacement gate dielectric layers 60r may include Molecular-Beam Deposition (MBD), ALD, PECVD, and the like. In embodiments where portions of the gate dielectric layers 60 remains in the recesses, the replacement gate dielectric layers 60r include a material of the gate dielectric layers 60 (e.g., $SiO_2$).

The replacement gate electrodes 72r are deposited over the gate dielectric layers 60r, respectively, and fill the remaining portions of the recesses. The replacement gate electrodes 72r may include a polysilicon or metal-containing material such as titanium nitride, titanium oxide, tantalum nitride, tantalum carbide, cobalt, ruthenium, aluminum, tungsten, combinations thereof, or multi-layers thereof. The replacement gate electrode 72r may comprise any number of liner layers, any number of work function tuning layers, and a fill material. After the filling of the recesses, a planarization process, such as a CMP, may be performed to remove the excess portions of the replacement gate dielectric layers 60r and the material of the replacement gate electrodes 72r, which excess portions are over the top surface of the ILD 88. The remaining portions of material of the replacement gate electrodes 72r and the replacement gate dielectric layers 60r thus form the replacement gates. The replacement gate electrodes 72r and the replacement gate dielectric layers 60r may be collectively referred to as a "gate stack." The gate and the gate stacks may extend along sidewalls of channel regions 206a-d, 208a-d, 210a-d, 212a-d, and 214a-d of the fins 206, 208, 210, 212, and 214.

In accordance with some embodiments, the gate stack (including replacement gate dielectric layer 60r and corresponding overlying replacement gate electrode 72r) is recessed, so that a recess is formed directly over the gate stack and between opposing portions of gate spacers 78. A replacement gate mask 74r comprising one or more layers of dielectric material, such as silicon nitride, silicon oxynitride, or the like, is filled in the recess, followed by a planarization process to remove excess portions of the dielectric material extending over the first ILD 88. In other embodiments, the mask 74 may remain from a previous process where the gate electrodes 72 were not replaced.

Figure 27:
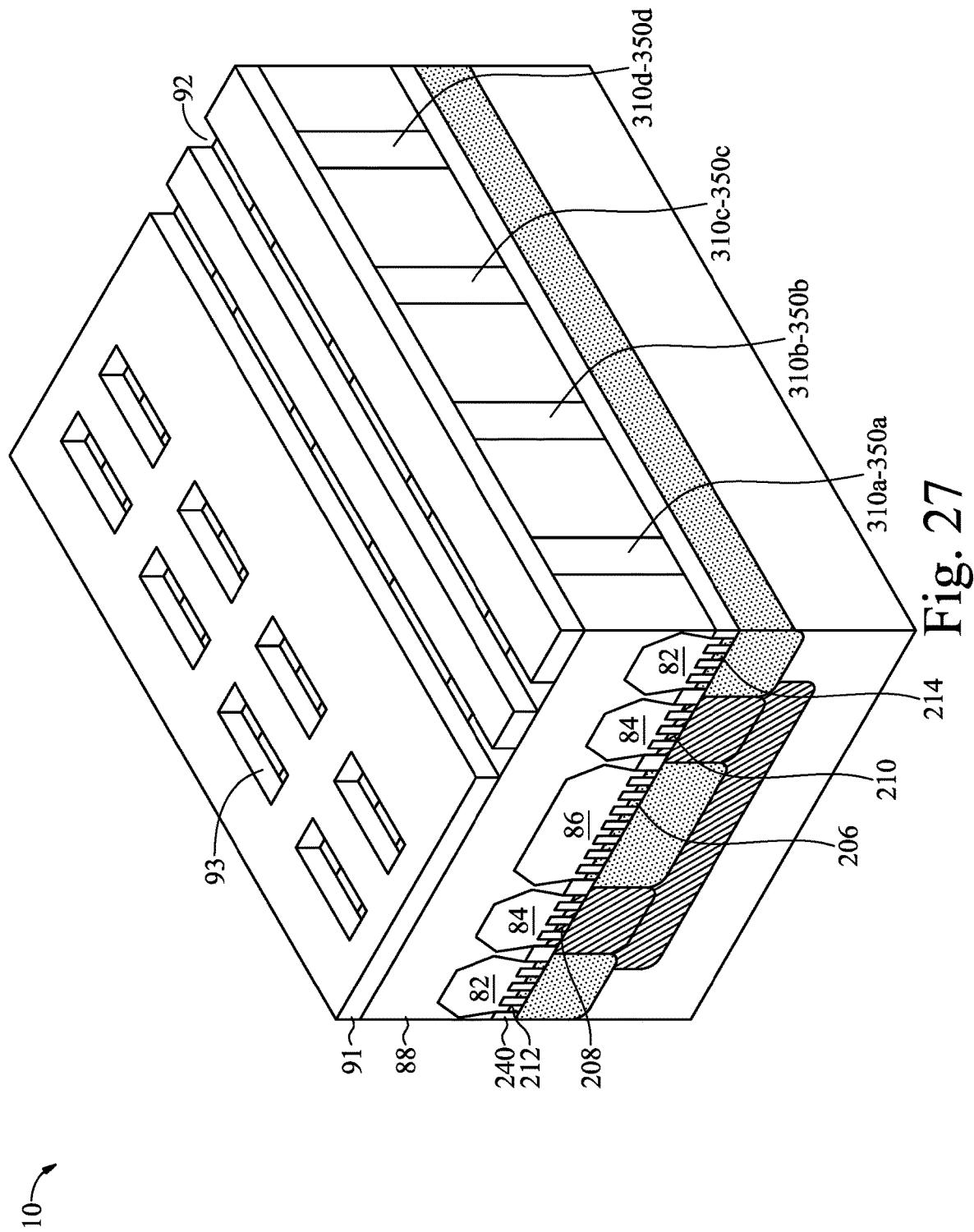

In FIG. 27, in one embodiment, where the gate structures 310, 320, 330, 340, and 350, in each row, a, b, c, or d, etc., are formed as continuous gate structure 310-350 spanning over all of the fins 206, 208, 210, 212, and 214, a gate cut process may be performed prior to or following the replacement gate process (if used). A mask 91 may be deposited over the ILD 88 and over top surfaces of the one continuous gate structure. The mask 91 is then patterned using acceptable photolithography techniques to form openings 93 and/or openings 92 to expose portions of the continuous gate structures 310-350 which will be removed and replaced with an insulating material. The openings 92 reflect a long cut across multiple gate structures, and the openings 93 reflect a cut across each specific gate structure. A combination of techniques may be used using openings 92 (spanning multiple gate structures) and/or openings 93 (spanning individual gate structures). A series of etching steps may be used to remove the gate material or dummy gate material of the exposed portions of the continuous gate structures 310-350. Following removing the gate material, the continuous gate structures 310-350 are cut into the portions 310, 320, 330, 340, and 350 as illustrated, for example, in FIG. 28.

Figure 28:
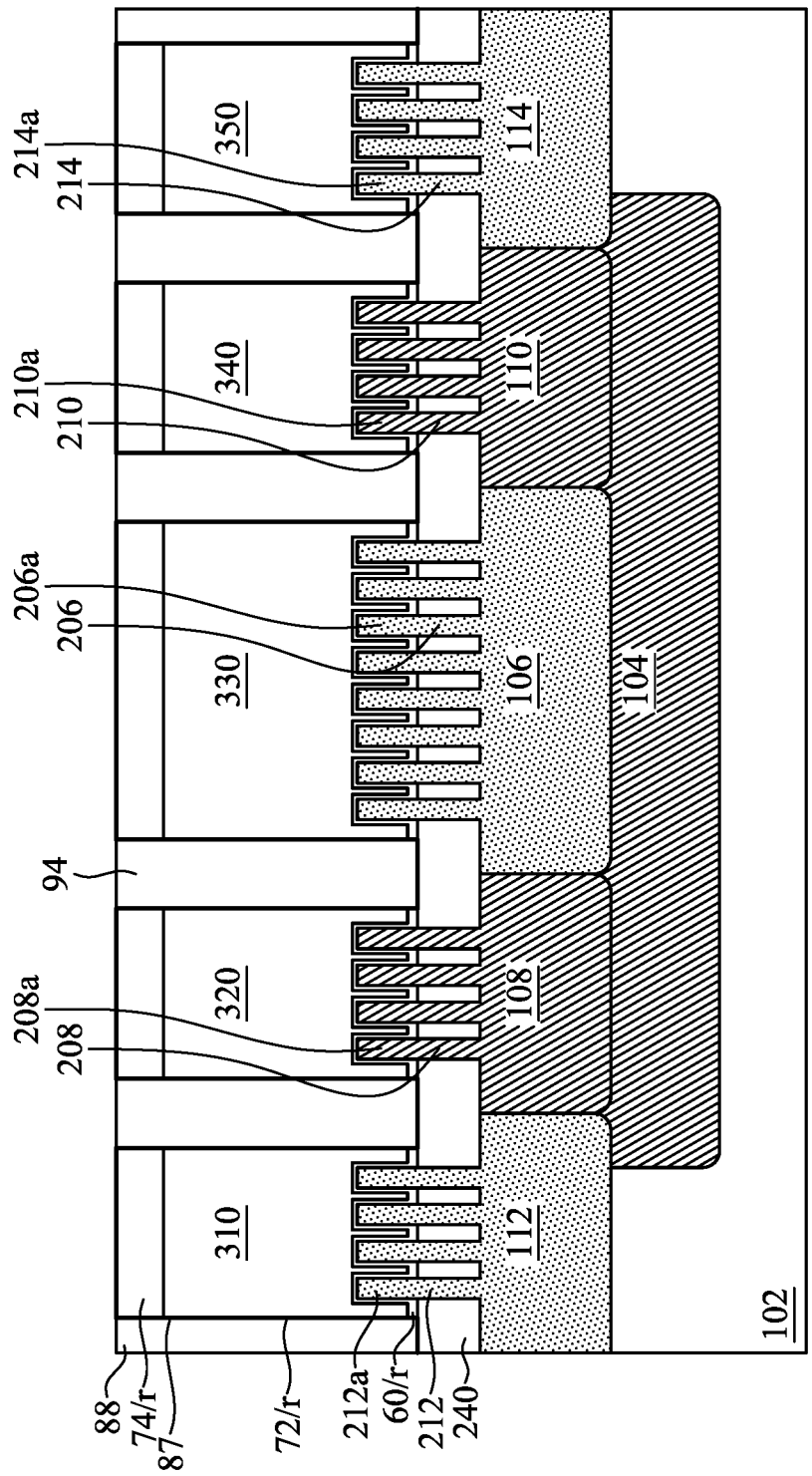
Figure 29:
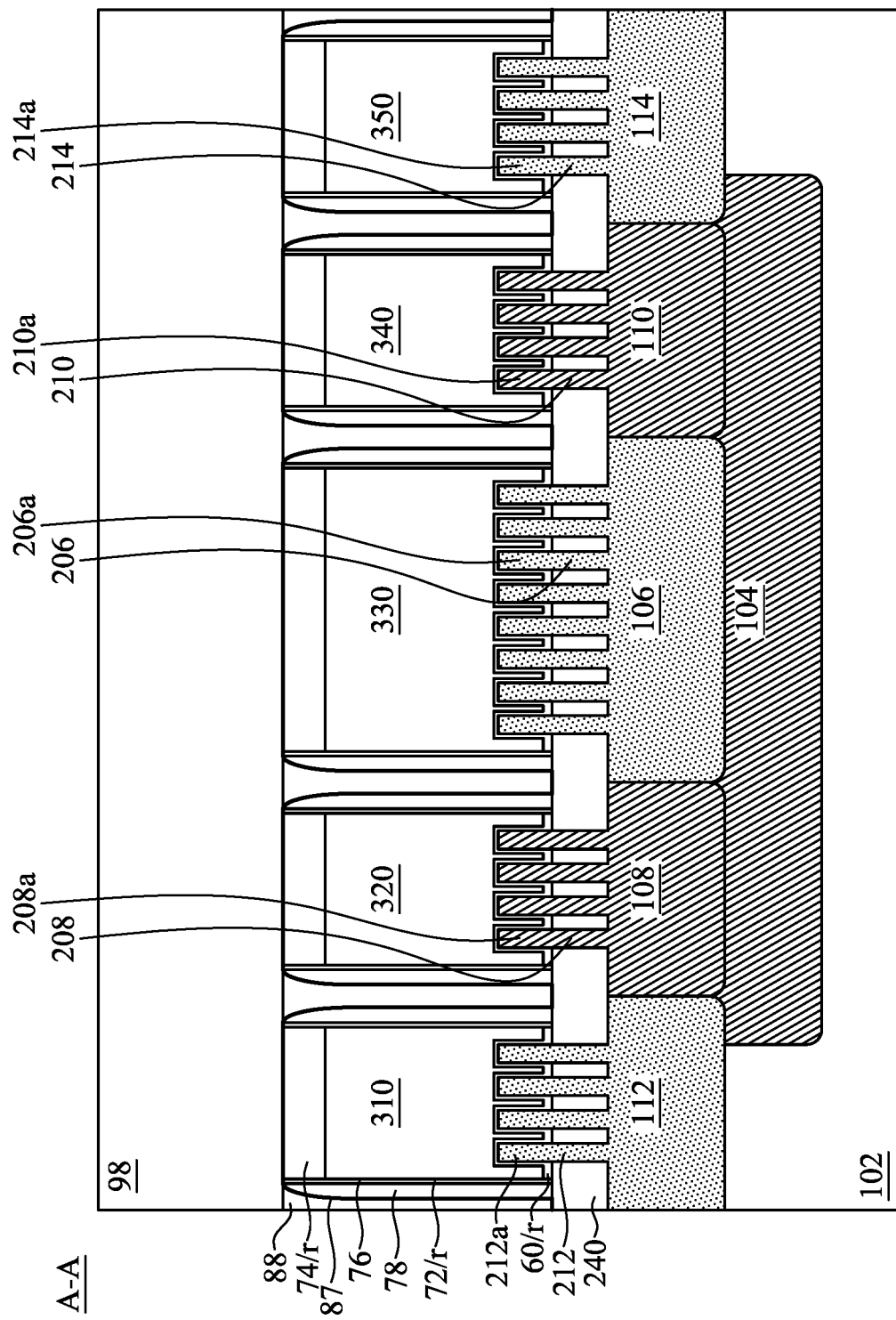
Figure 30:
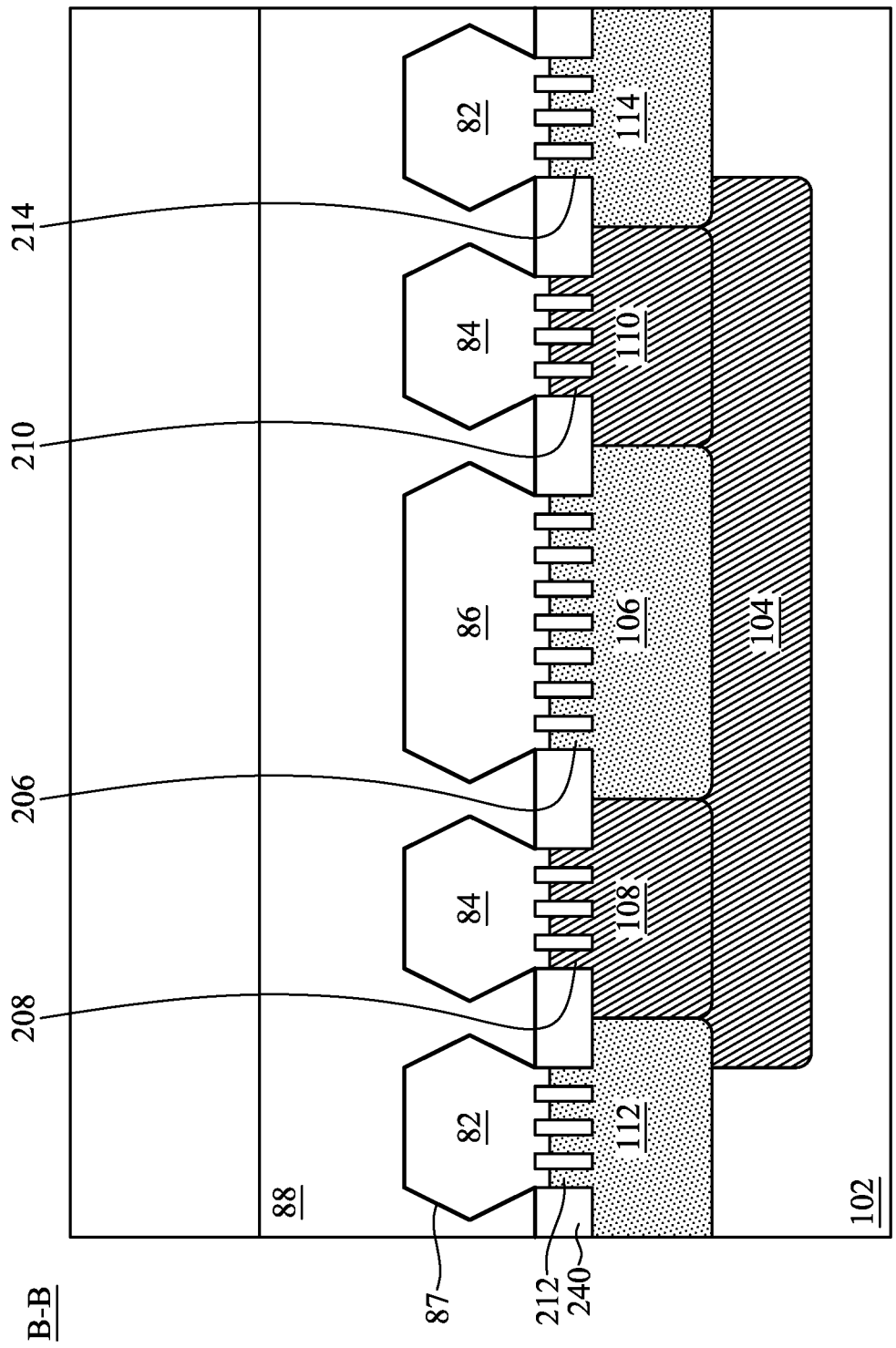
Figure 31:
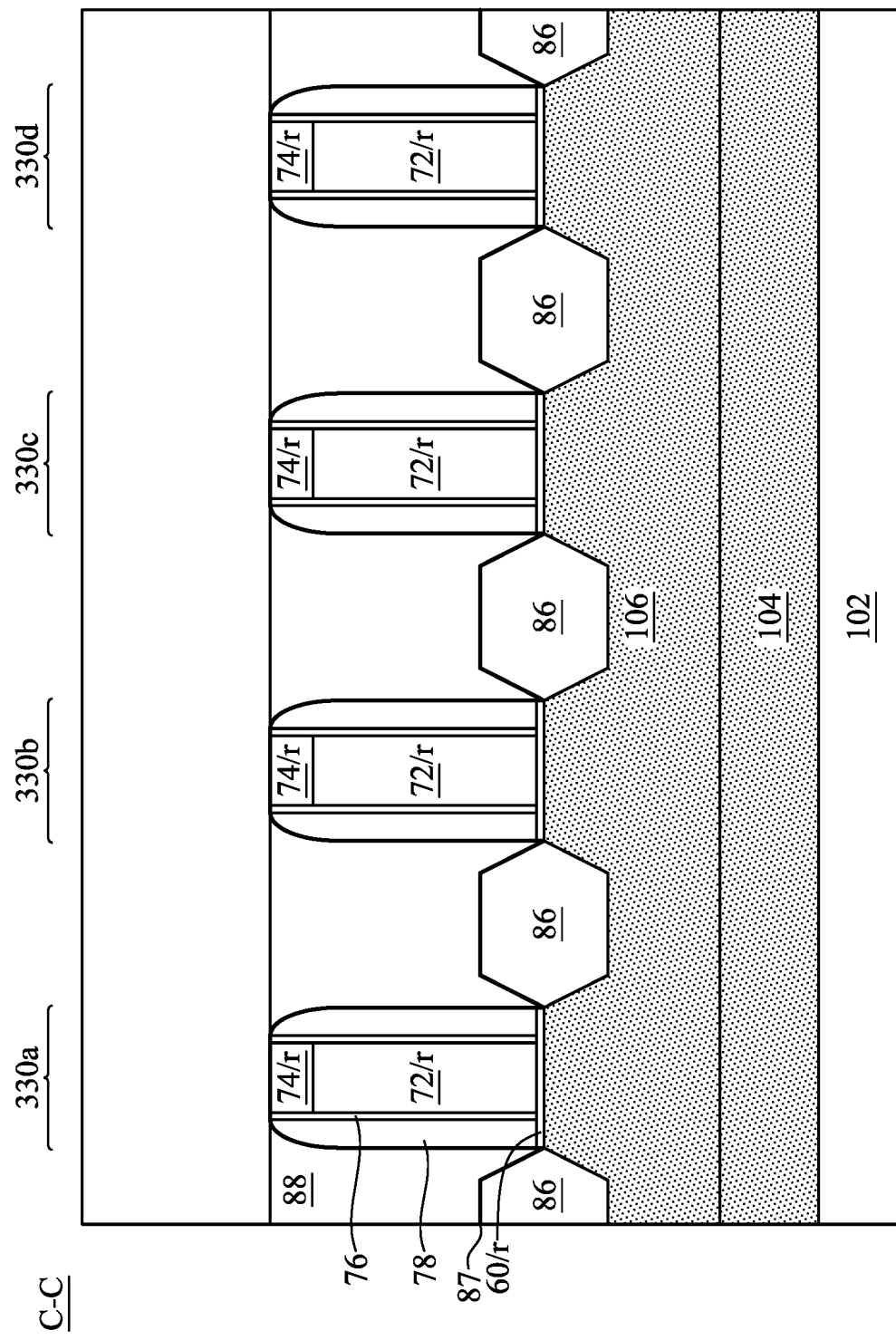
Figure 32:
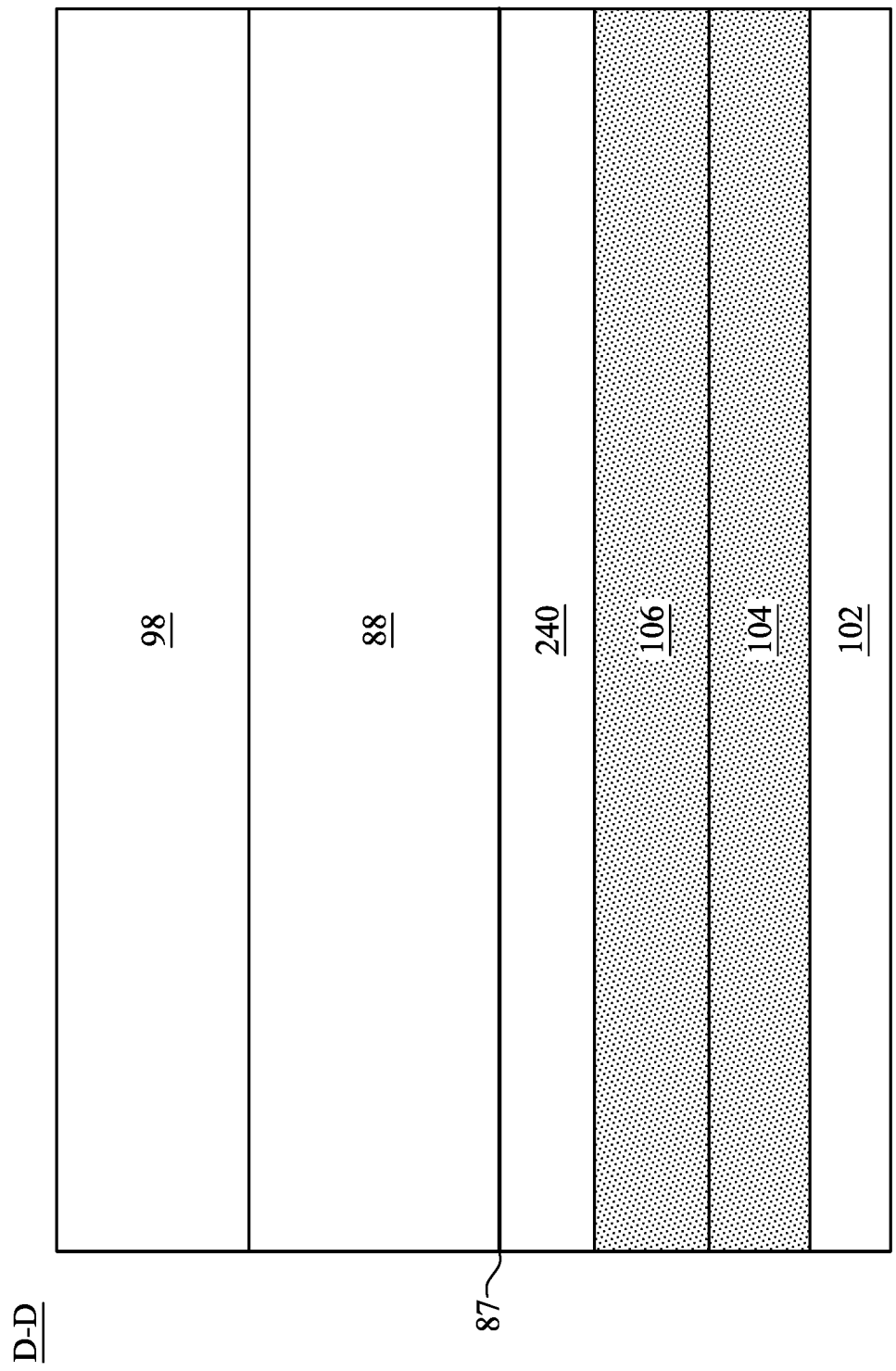
Figure 33:
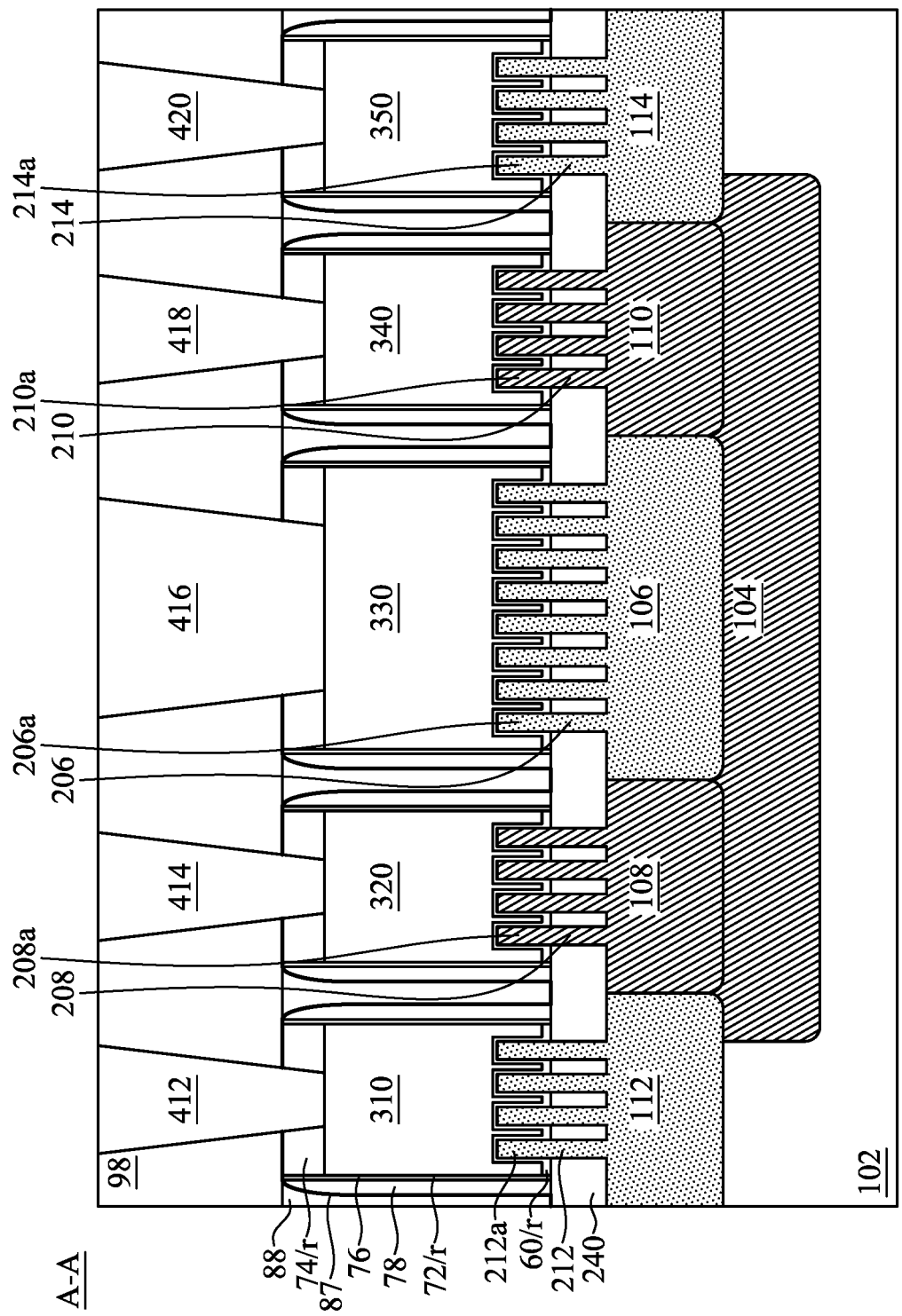
Figure 34:
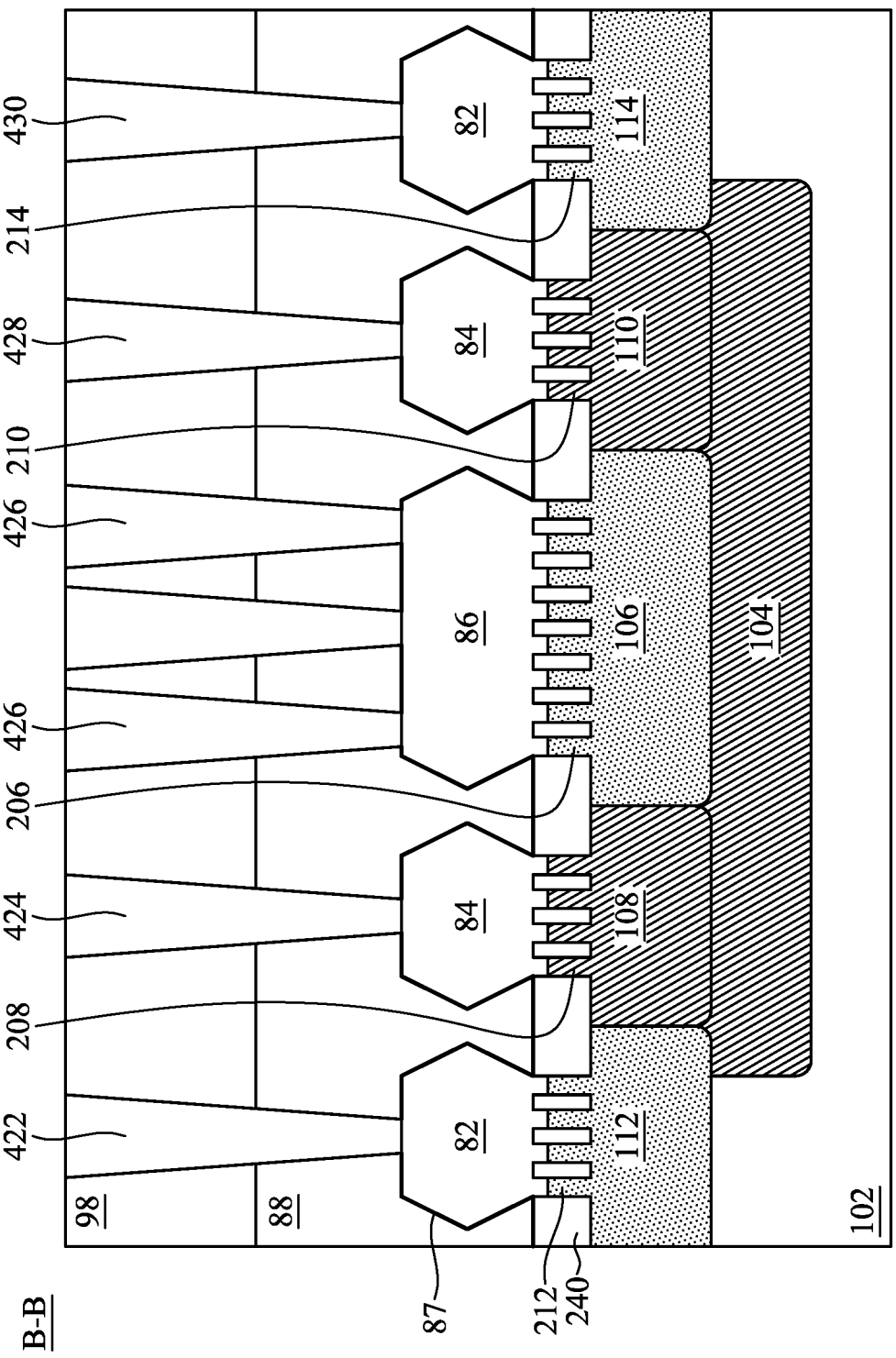
Figure 35:
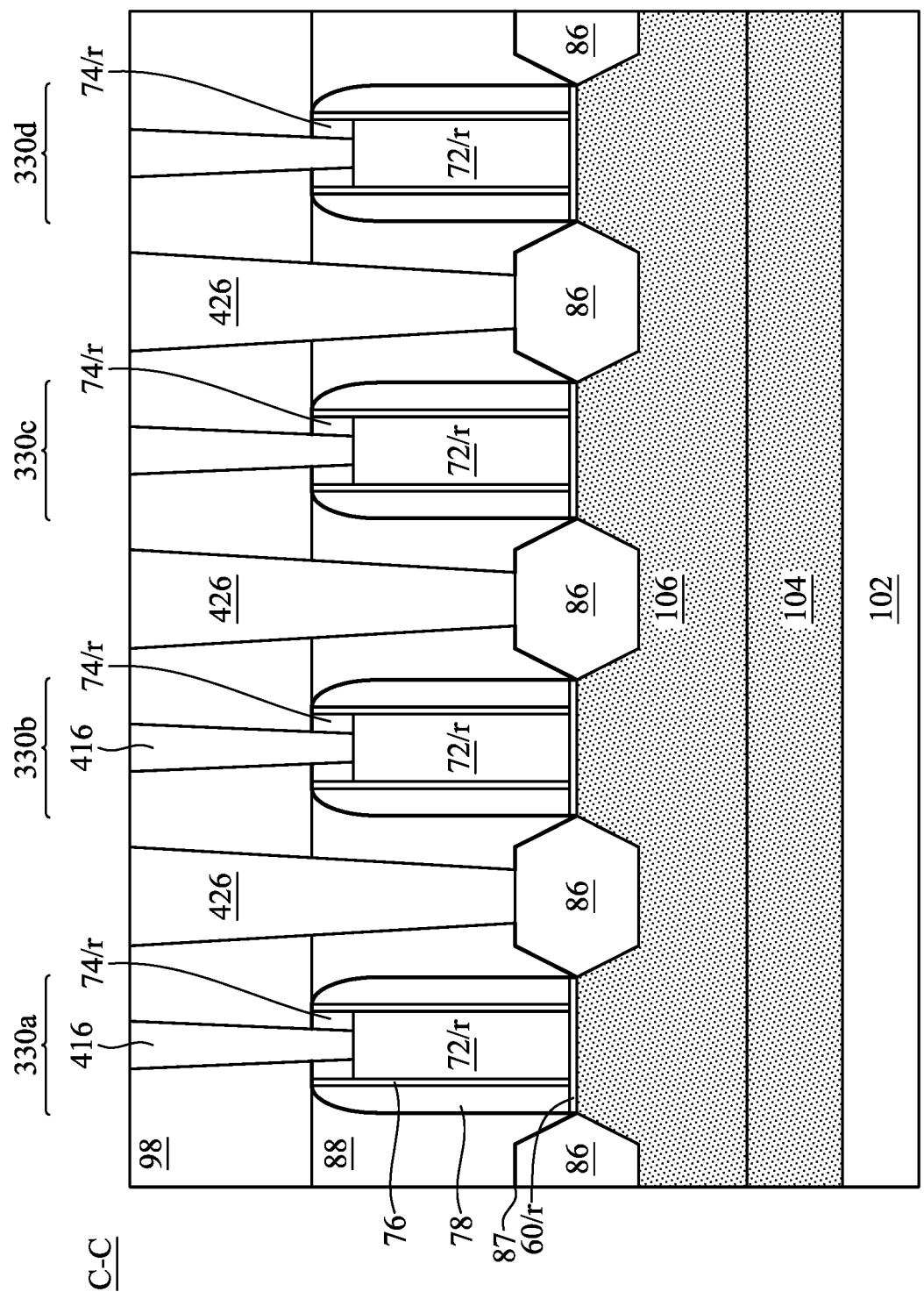
Figure 36:
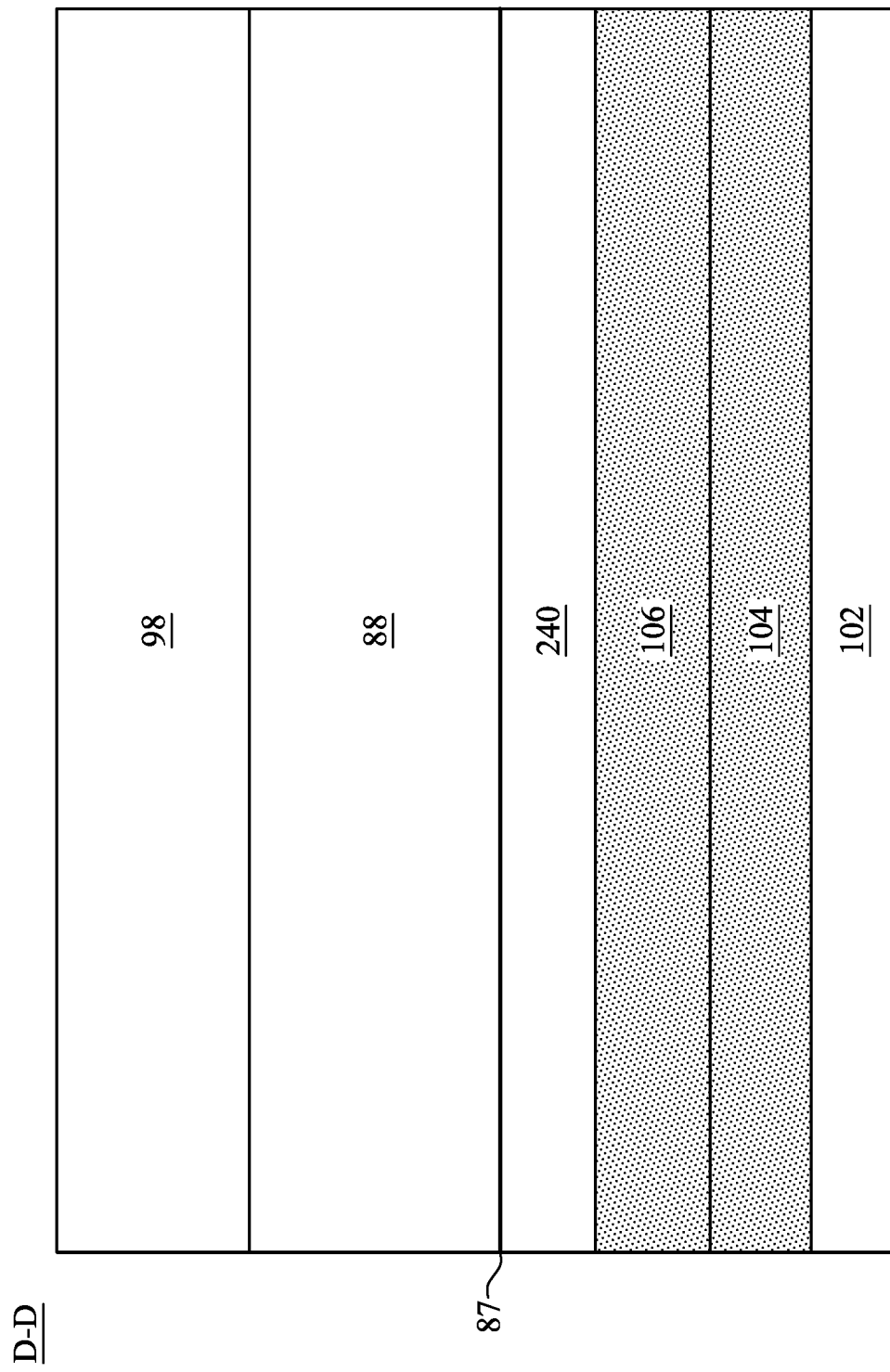
Figure 37:
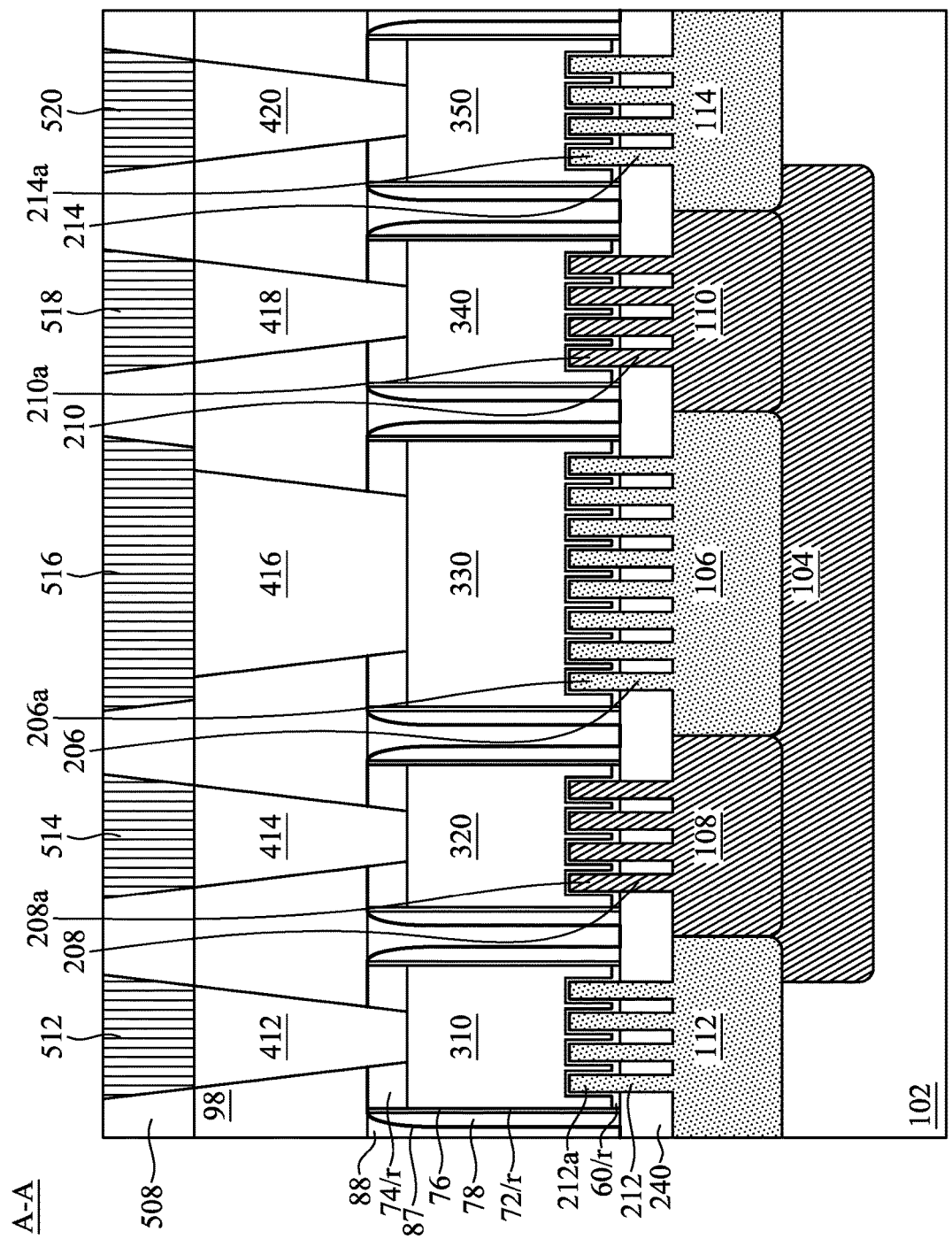
Figure 38:
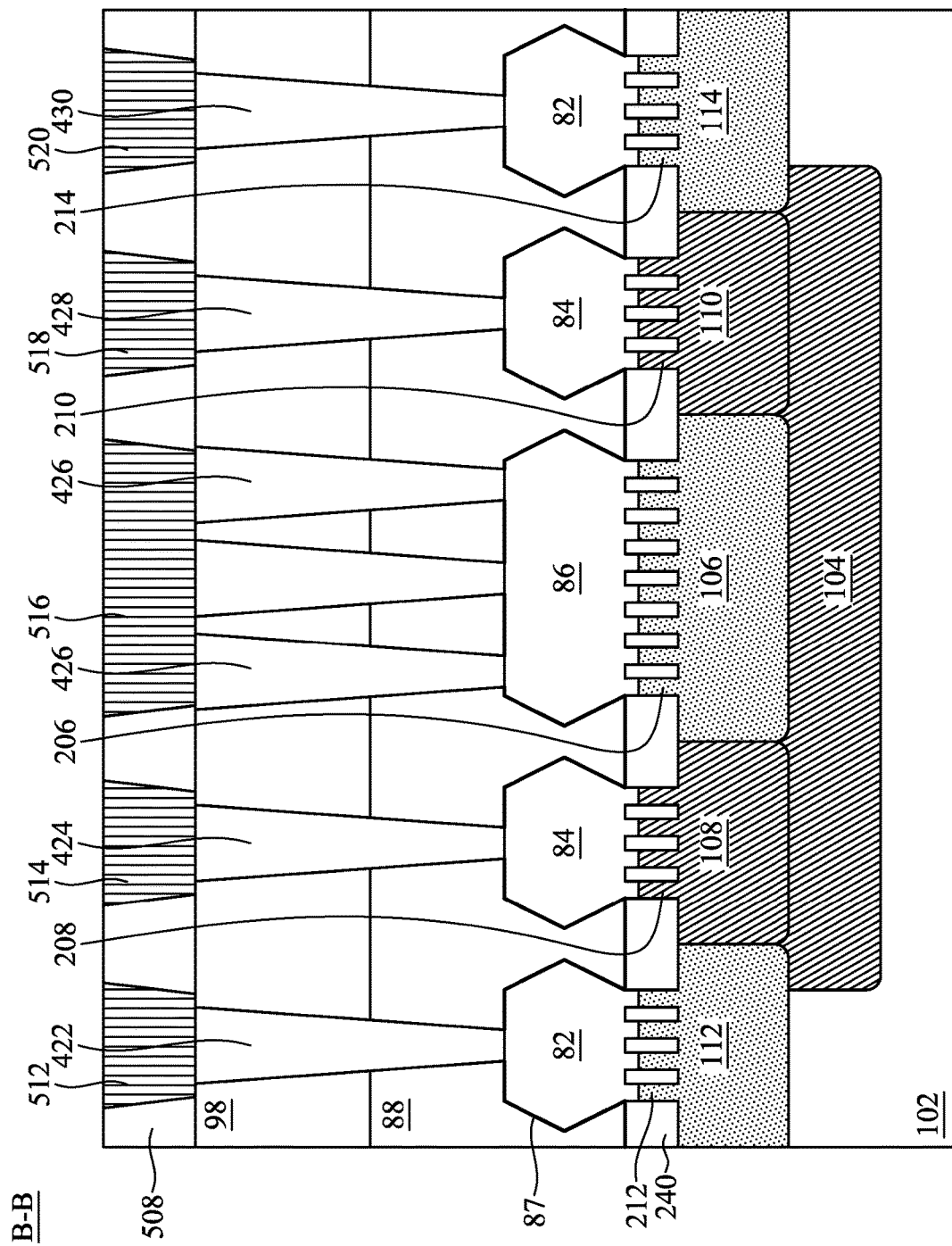
Figure 39:
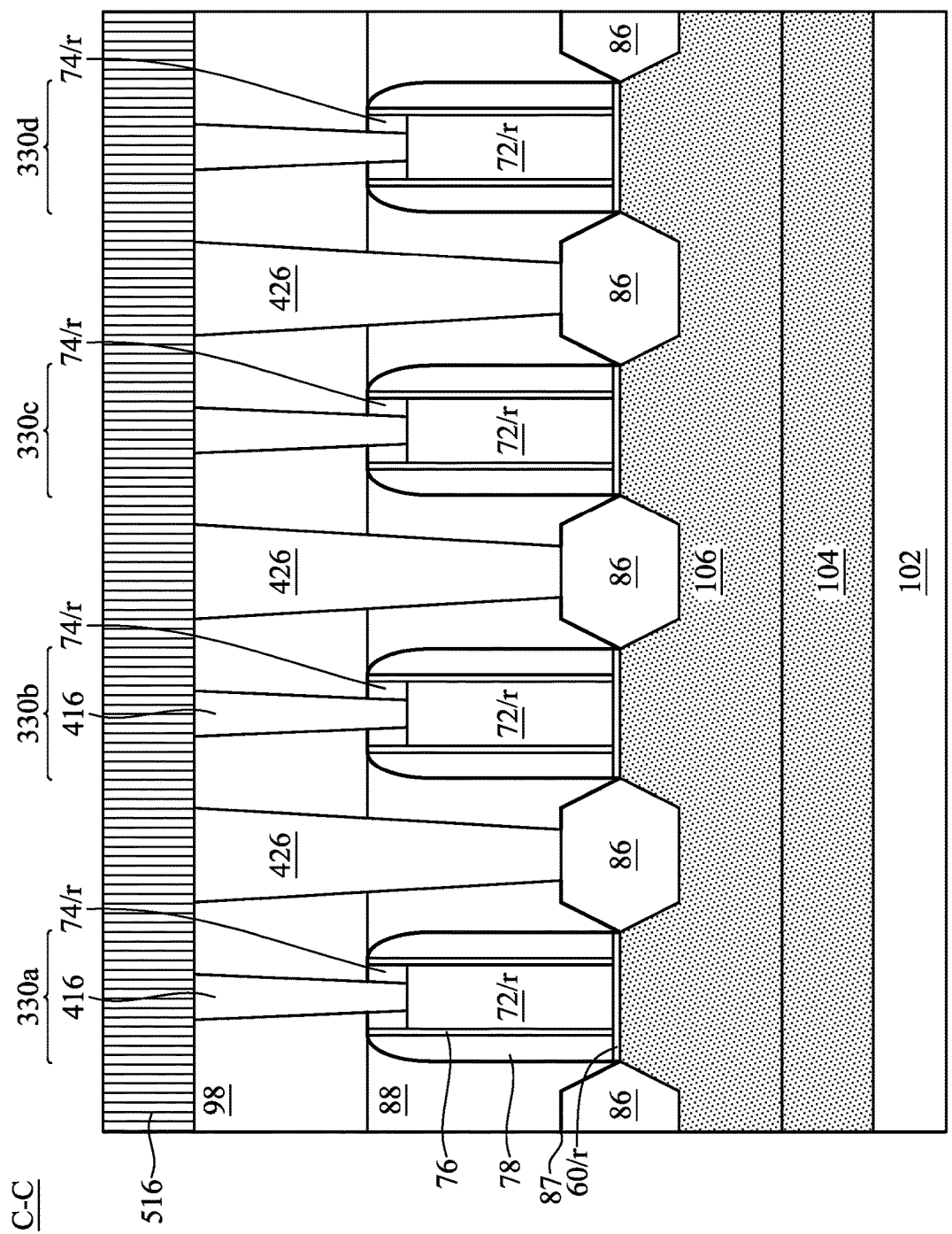
Figure 40:
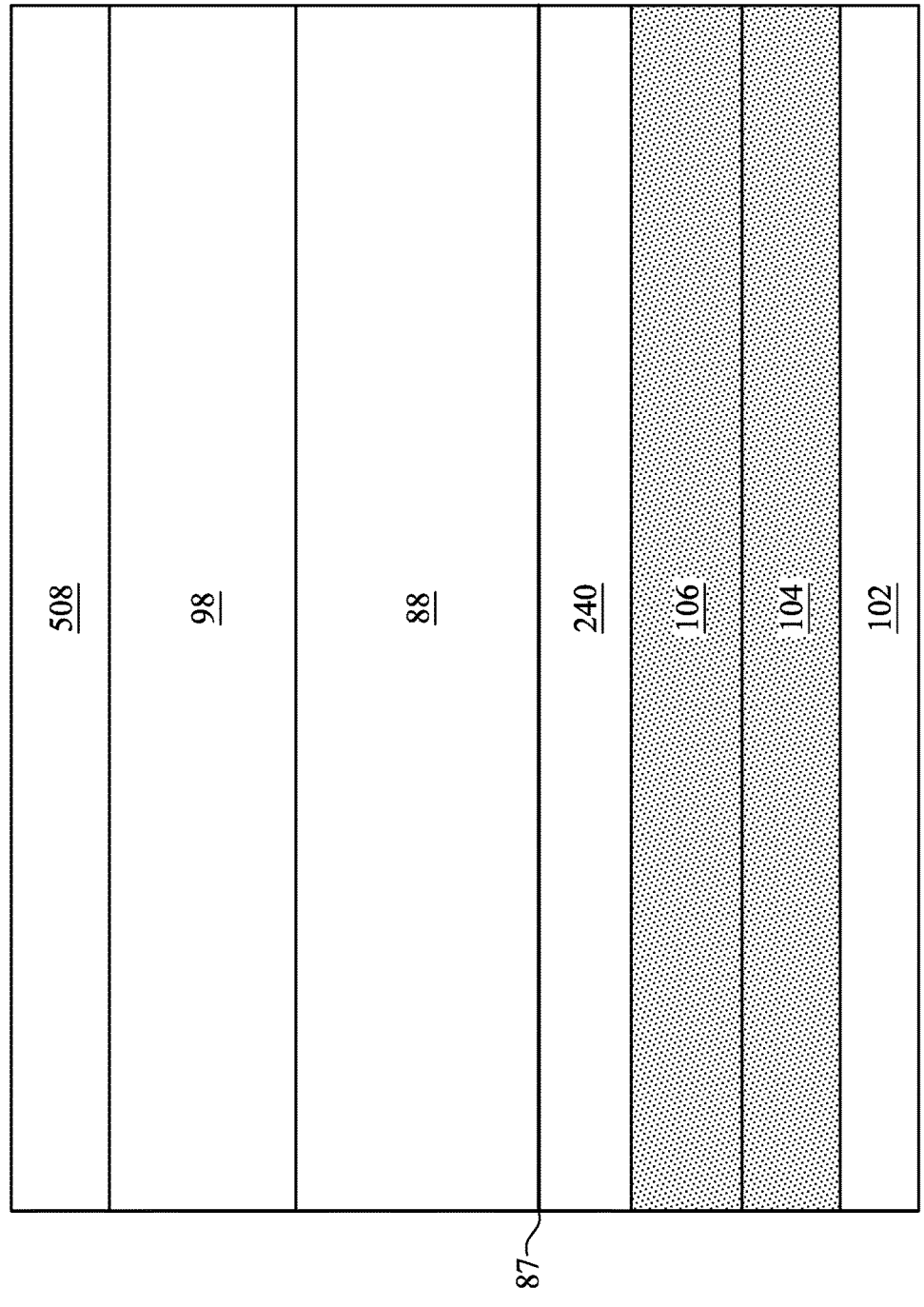

In FIG. 28, the openings 92 and/or openings 93 from the gate cutting process may be filled with an insulating material 94 using any acceptable techniques. In some embodiments, the insulating material 94 may be a dielectric material such as silicon oxide, silicon nitride, PSG, BSG, BPSG, USG, or the like, and may be deposited by any suitable method, such as CVD and PECVD. In such embodiments, an etch stop layer 87, a gate seal spacer 76, and gate spacer 78 are not disposed on ends of the gate structures 310, 320, 330, 340, and 350 which are cut (compare FIG. 27). In other words, the insulating material 94 may contact the ends of the cut gate structures 310, 320, 330, 340, and 350. Following filling the openings 92 and/or openings 93, the mask 91 is then removed by a planarization process.

In some embodiments, some of the gates may be cut using the gate cut process, while others may be formed as a separate gate using the above described masking processes (see FIGS. 8-10, and accompanying description). For example, gates 310 and 350 may be formed as separate gate structures, while gates 320, 330, and 340 may be formed as a continuous gate structure and then subsequently cut.

In FIGS. 29, 30, 31, and 32, a second ILD 98 is deposited over the first ILD 88. In some embodiments, the second ILD 98 is a flowable film formed by a flowable CVD method. In some embodiments, the second ILD 98 is formed of a dielectric material such as PSG, BSG, BPSG, USG, or the like, and may be deposited by any suitable method, such as CVD and PECVD. The subsequently formed gate contacts 110 (FIGS. 33, 34, 35, and 36) penetrate through the gate mask 74/74r to contact the top surface of the recessed gate electrode 72/72r.

In FIGS. 33, 34, 35, and 36 the gate contacts 412, 414, 416, 418, and 420 the terminal contacts 422, 424, 426, 428, and 430 are formed through the second ILD 98 and the first ILD 88 in accordance with some embodiments. Openings for the terminal contacts 422, 424, 426, 428, and 430 are formed through the first and second ILDs 88 and 98, and openings for the gate contacts 412, 414, 416, 418, and 420 are formed through the second ILD 98 and the gate mask 74. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 98. The remaining liner and conductive material form the terminal contacts 422, 424, 426, 428, and 430 and gate contacts 412, 414, 416, 418, and 420 in the openings. An anneal process may be performed to form a silicide at the interface between the epitaxial collector regions 82, the epitaxial base regions 84, and the epitaxial emitter regions 86 and their respective terminal contacts. The terminal contacts 422 and 430 are physically and electrically coupled to respective epitaxial collector regions 82, the terminal contacts 424 and 428 are physically and electrically coupled to respective epitaxial base regions 84, and the terminal contacts 426 are physically and electrically coupled to the epitaxial emitter regions 86.

The gate contacts 412, 414, 416, 418, and 420 are physically and electrically coupled to the gate electrodes 72/r of respective gates 310, 320, 330, 340, and 350. The terminal contacts 422, 424, 426, 428, and 430 and the gate contacts 412, 414, 416, 418, and 420 may be formed in different processes, or may be formed in the same process. Although shown as being formed in the same cross-section, for example, in FIG. 35, it should be appreciated that each of the terminal contacts 422, 424, 426, 428, and 430 and the gate contacts 412, 414, 416, 418, and 420 may be formed in different cross-sections, which may avoid shorting of the contacts.

In FIGS. 37, 38, 39, and 40, a metallization layer including a third ILD 508 and connecting features 512, 514, 516, 518, and 520 may be formed over the second ILD 98. In some embodiments, the third ILD 508 is a flowable film formed by a flowable CVD method. In some embodiments, the third ILD 508 is formed of a dielectric material such as PSG, BSG, BPSG, USG, or the like, and may be deposited by any suitable method, such as CVD and PECVD. In some embodiments, connecting features 512, 514, 516, 518, and 520 respectively couple the gate contacts 412, 414, 416, 418, and 420 to each other. In other words, a connecting feature 512, for example, may be a metal line electrically coupling all the gate contacts 412 together which contact the gate electrodes 72/r of the 310a-d gates. Similarly, connecting feature 514 may electrically couple all the gate contacts 414 together, connecting feature 516 may electrically couple all the gate contacts 416 together, connecting feature 518 may electrically couple all the gate contacts 418 together, and connecting feature 520 may electrically couple all the gate contacts 420 together. In some embodiments, connecting features 512, 514, 516, 518, and 520 may use multiple conductive features, such as multiple metal lines to couple a single set of gates together, such as gates 330a-d.

In some embodiments, the connecting features 512, 514, 516, 518, and 520 respectively couple the terminal contacts 422, 424, 426, 428, and 430 to each other. As such, in some embodiments, the connecting features 512, 514, 516, 518, and 520 may respectively electrically couple the gate contacts 412 with the terminal contacts 422, the gate contacts 414 with the terminal contacts 424, the gate contacts 416 with the terminal contacts 426, the gate contacts 418 with the terminal contacts 428, and the gate contacts 420 with the terminal contacts 430. In other words, the gate electrode 72/r for each gate 310-350 may be coupled to their adjacent epitaxial region for the epitaxial collector regions 82, epitaxial base regions 84, and epitaxial emitter regions 86. For example, connecting features 512 may couple the gate contacts 412 together with the terminal contacts 422, thereby coupling together the epitaxial collector regions 82 on the fins 212 with the gate electrodes 72/r of gate 310. Similarly, connecting features 514 may couple together epitaxial base regions 84 on the fins 208 with the gate electrodes 72/r of gate 320, connecting features 516 may couple together epitaxial emitter regions 86 on the fins 206 with the gate electrodes 72/r of gate 330, connecting features 518 may couple together epitaxial base regions 84 on the fins 210 with the gate electrodes 72/r of the gate 340, and connecting features 520 may couple together epitaxial collector regions 82 on the fins 214 with the gate electrodes 72/r of the gate 350.

Openings for the connecting features 512, 514, 516, 518, and 520 are formed through the third ILD 508. The openings may be formed using acceptable photolithography and etching techniques, thereby exposing upper surfaces of the gate contacts 412, 414, 416, 418, and 420 and upper surfaces of the terminal contacts 422, 424, 426, 428, and 430 (for connecting features 512, 514, 516, 518, and 520, respectively). A liner, such as a diffusion barrier layer, an adhesion layer, or the like, and a conductive material are formed in the openings. The liner may include titanium, titanium nitride, tantalum, tantalum nitride, or the like. The conductive material of the connecting features 512, 514, 516, 518, and 520 may be copper, a copper alloy, silver, gold, tungsten, cobalt, aluminum, nickel, or the like. A planarization process, such as a CMP, may be performed to remove excess material from a surface of the ILD 508. The remaining liner and conductive material form the connecting features 512, 514, 516, 518, and 520 in the openings.

In some embodiments, the connecting features 512, 514, 516, 518, and 520 may each include one or more metal lines connected to the gate contacts 412, 414, 416, 418, and 420 and one or more metal lines separately connected to the terminal contacts 422, 424, 426, 428, and 430, such that one or more of the gate contacts 412 and terminal contacts 424, the gate contacts 414 and terminal contacts 424, the gate contacts 416 and terminal contacts 426, the gate contacts 418 and terminal contacts 428, and the gate contacts 420 and terminal contacts 430 are not coupled together.

In some embodiments, additional insulating layers (e.g., ILDs) may be formed and metallization layers formed therein using processes and materials similar to those described above with regard to the connecting features 512, 514, 516, 518, and 520 or with regard to the gate contacts 412, 414, 416, 418, and 420 or with regard to the terminal contacts 422, 424, 426, 428, and 430, or another suitable process. In some embodiments, such as those consistent with FIG. 3b, such metallization layers may couple together the connecting features 512 so that all the epitaxial collector regions 82 are electrically coupled together. Also, the metallization layers may couple together the connecting features 514 so that all the epitaxial base regions 84 are electrically coupled together.

Figure 41:
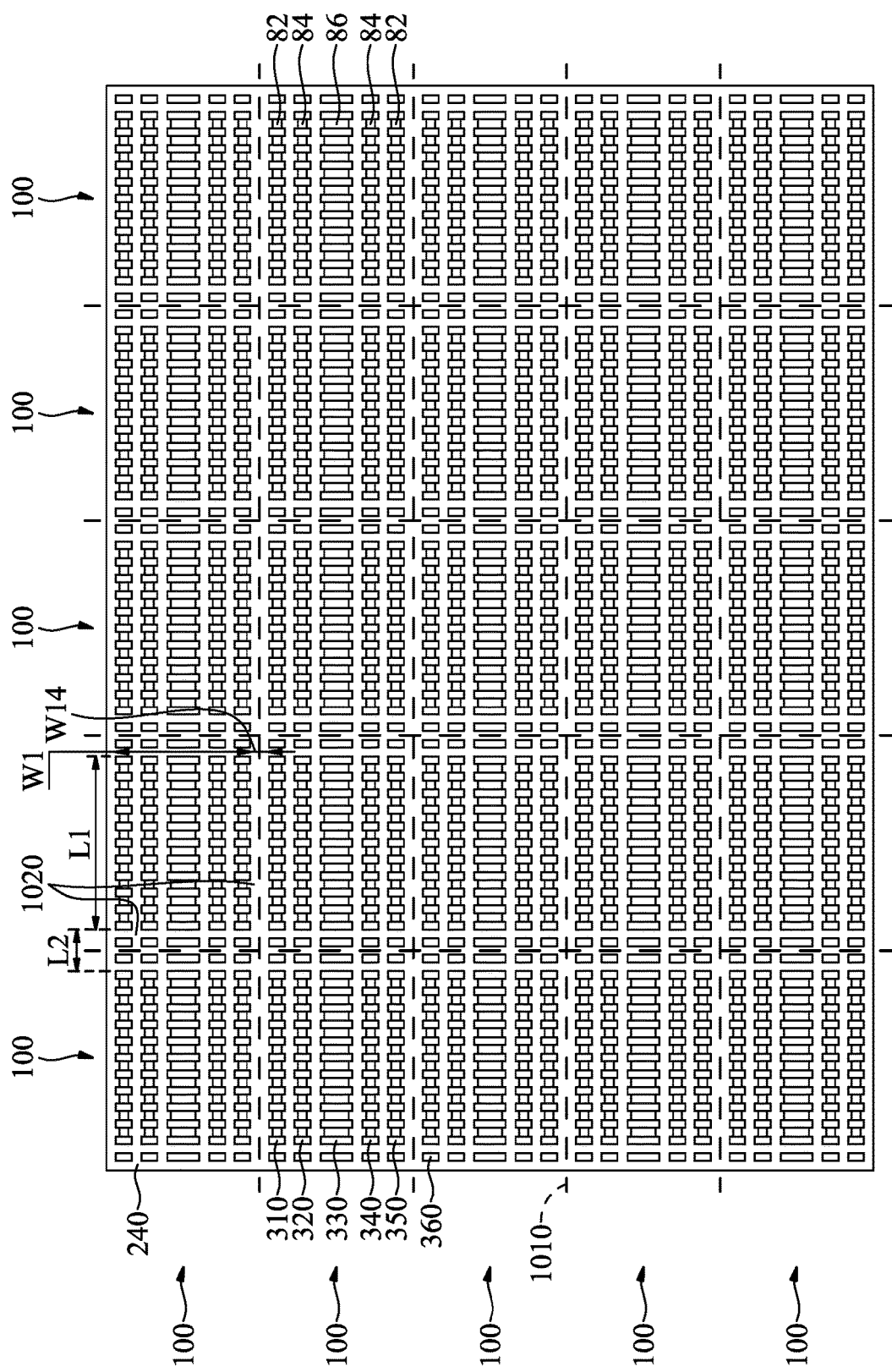
FIG. 41 illustrates a top down view of a bipolar transistor device, in accordance with some embodiments.

FIG. 41 illustrates a top down view of an array of BJT devices, in accordance with some embodiments. In FIG. 41, multiple BJT devices 100 (see FIG. 1) are arranged in a 5×5 array 1000. Dashed lines 1010 are lines of demarcation between BJT devices 100. In some embodiments, dashed lines 1010 correspond to scribe lines where some or all of the BJT devices 100 may be singulated into smaller packages. Between the active area (defined by L1 and W1, as discussed above with respect to FIG. 1) of one BJT device 100 and an adjacent BJT device 100 are inactive areas 1020. The spacing L2 between active areas in the direction parallel to the direction of the fins may be between about 200 nm and about 2000 nm, though other dimensions are contemplated and may be used. In some embodiments, the spacing may be determined by leaving a number of inactive gates 360 between active areas. For example, the number of inactive gates 360 between active areas as illustrated in the array 1000 is two, though in other designs the number of inactive gates may be between one and ten or more. The spacing W14 between active areas in the direction parallel to the lengthwise direction of the gates may be between about 120 nm and about 1500 nm, though other dimensions are contemplated and may be used.

Separating the gates 320 from the gates 330 causes an increase in size of the BJT 100, to account for the spacing between the gates 320 and the gates 330. However, arranging the BJT 100 in an array, such as the array 1000, the overall impact of the size increase is reduced. For example, the area for BJT 100 in embodiment devices increases between about 10% and 20%, such as about 15%, but the area used in a BJT array, such as the array 1000 only increases between about 5% and 15%, such as about 6%, over devices made with similar patterning techniques which do not use separated gates. The impact can also be lessened by using a gate cutting technique, such as discussed above with respect to FIGS. 27 through 28.

Embodiments advantageously use FinFET processes to form a BJT device. Embodiments utilize separate gates over BJT terminal contacts, including separate gates over the BJT base and BJT emitter. By separating the gates, although an increase in size is realized, a reduction in $\Delta V_{be}$ is also realized. As a measurement, $\Delta V_{be}$ represents a difference of voltages across the base and emitter, which is measured based on different currents into the emitter terminal. Embodiments achieve a $\Delta V_{be}$ with a 50% reduction in first sigma of a standard deviation of $\Delta V_{be}$. In other words, a 50% increase in $\Delta V_{be}$ performance is obtained by providing a more consistent $\Delta V_{be}$. Although separating the gates over the emitter and base signals of the BJTs causes an increase in area size, the device performance increases so significantly that the tradeoff with the loss of device area is worth the performance and reliability gains.

One embodiment is a device including a first set of fins having a first base region doped with a p-type dopant, an emitter of a bipolar junction transistor (BJT) disposed over the first set of fins. The device also includes a second set of fins having a second base region doped with an n-type dopant, the second base region contacting the first base region, a base of the BJT disposed over the second set of fins. The device also includes a third set of fins having a third base region doped with a p-type dopant, a collector of the BJT disposed over the third set of fins a first gate structure disposed over the first set of fins adjacent to the emitter. The device also includes a second gate structure disposed over the second set of fins adjacent to the base. The device also includes a third gate structure disposed over the third set of fins adjacent to the collector, where the first gate structure, second gate structure, and third gate structure are physically and electrically separated. In an embodiment, a minimum distance between a first end of the first gate structure and a first end of the second gate structure is at least 100 nm, the minimum distance measured in a direction along a lengthwise direction of the first gate structure. In an embodiment, the device may include a fourth gate structure disposed over a fourth set of fins adjacent to the first set of fins, the fourth set of fins corresponding to a base of a second BJT; and a fifth gate structure disposed over a fifth set of fins adjacent to the fourth set of fins, the fifth set of fins corresponding to a collector of a second BJT. In an embodiment, the emitter of the BJT is common to the second BJT. In an embodiment, a number of fins of the first set of fins is at least twice a number of fins of the second set of fins. In an embodiment, the first gate structure includes a gate electrode, and the gate electrode is electrically coupled to the first set of fins. In an embodiment, a first distance is between the first gate structure and the second gate structure, a second distance is between an outer edge of the first set of fins and nearest outer edge of the first gate structure, and a ratio of the first distance to the second distance is between one and four. In an embodiment, the emitter is disposed on opposing sides of the first gate structure, the base is disposed on opposing sides of the second gate structure, and the collector is disposed on opposing sides of the third gate structure. In an embodiment, a height of the first set of fins under the emitter is less than a height of the first set of fins under the first gate structure.

Another embodiment is a device including a first fin, a second fin, and a third fin protruding from a substrate, the first fin and the third fin having a first conductivity, the second fin having a second conductivity opposite to the first conductivity, the first, second, and third fins being parallel to each other. The device also includes a gate structure disposed over and along sidewalls of the first fin, the second fin, and the third fin. The device also includes an emitter of a bipolar junction transistor (BJT) disposed on opposing sides of the gate structure over the first fin. The device also includes a base of the BJT disposed on opposing sides of the gate structure over the second fin. The device also includes a collector of the BJT disposed on opposing sides of the gate structure over the third fin. The device also includes an insulating material completely encircling a first portion of the gate structure disposed over the first fin, a second portion of the gate structure disposed over the second fin, and a third portion of the gate structure disposed over the third fin. In an embodiment, a distance between adjacent ends of the first portion of the gate structure and the second portion of the gate structure is at least 100 nm. In an embodiment, the gate structure is a first gate structure, and the device may include a plurality of a gate structures each disposed over and along sidewalls of the first fin, the second fin, and the third fin, each of the plurality of gate structures separated into a first portion, a second portion, and a third portion completely encircled by the insulating material and respectively disposed over the first fin, the second fin, and the third fin. In an embodiment, the emitter of the BJT is common to an emitter of a second BJT. In an embodiment, the first conductivity corresponds to a p-type dopant, where the second conductivity corresponds to an n-type dopant. In an embodiment, the emitter of the BJT is electrically coupled to a gate electrode of the gate structure.

Another embodiment is a method including patterning a first doped well of a semiconductor substrate to form first fins, a second doped well of the semiconductor substrate to form second fins, and a third doped well of the semiconductor substrate to form third fins. The method also includes forming a gate structure over and along sidewalls of the first fins, the second fins, and the third fins. The method also includes epitaxially growing a first epitaxy of a bipolar junction transistor (BJT) over the first fins on opposing sides of the gate structure, a second epitaxy of the BJT over the second fins on opposing sides of the gate structure, and a third epitaxy of the BJT over the third fins on opposing sides of the gate structure, the first epitaxy and the third epitaxy having a first conductivity, the second epitaxy having a second epitaxy opposite the first conductivity, where the gate structure has a first portion, a second portion, and a third portion, the first portion, the second portion, and the third portion being electrically separated from each other, the first portion over the first fins, the second portion over the second fins, the third portion over the third fins. In an embodiment, forming the gate structure may include depositing a gate dielectric layer over the first fins, the second fins, and the third fins; depositing a gate electrode layer over the first fins, the second fins, and the third fins; and patterning the gate electrode layer and gate dielectric layer to form the first portion of the gate structure, the second portion of the gate structure, and the third portion of the gate structure. In an embodiment, the method may include depositing a first interlayer dielectric (ILD) over the first epitaxy, the second epitaxy, and the third epitaxy; cutting the gate structure to separate the gate structure into the first portion of the gate structure, the second portion of the gate structure, and the third portion of the gate structure; and depositing an insulating material between adjacent ends of the first portion and the second portion and between adjacent ends of the second portion and the third portion. In an embodiment, a width of the cutting between adjacent ends of the first portion of the gate structure and the second portion of the gate structure is between about 100 nm and about 400 nm. In an embodiment, the method may include forming an isolation material over and between the first fins, the second fins, and the third fins; recessing the isolation material so that the first fins, the second fins, and the third fins each protrude from an upper surface of the isolation material; and epitaxially growing the first epitaxy, the second epitaxy, and the third epitaxy between portions of the isolation material. In an embodiment, the first conductivity corresponds to a p-type dopant, where the second conductivity corresponds to an n-type dopant. In an embodiment, the method may include forming a metallization layer over the gate structure, the metallization layer electrically coupling the first epitaxy to a gate of the gate structure. In an embodiment, the method may include performing a gate replacement process to remove a gate electrode of the gate structure and replace the gate electrode with a replacement metal gate.

Another embodiment is a method including patterning a substrate to form first fins, a second fins, and third fins, each of the first fins, second fins, and third fins extending vertically from a respective first pedestal, second pedestal, and third pedestal, the first pedestal having a greater cross-sectional width than the second pedestal and the third pedestal. The method also includes forming a gate structure over the first fins, the second fins, and the third fins. The method also includes recessing the first fins, the second fins, and the third fins on either side of the gate structure. The method also includes depositing a first epitaxy over the first fins, a second epitaxy over the second fins, and a third epitaxy over the third fins. The method also includes forming first contacts to the first epitaxy, second contacts to the second epitaxy, third contacts to the third epitaxy, fourth contacts to a first portion of the gate structure, fifth contacts to a second portion of the gate structure, and sixth contacts to a third portion of the gate structure, the first contacts electrically coupled to the fourth contacts, the second contacts electrically coupled to the fifth contacts, and the third contacts electrically coupled to the sixth contacts.

Another embodiment is a method including patterning a substrate to form a plurality of fins extending vertically from a first doped well, a second doped well, and a third doped well, a number of the plurality of fins extending from the first doped well being between 3 and 8 times a number of the plurality of fins extending from the second doped well. The method also includes forming a gate structure over the plurality of fins, a first portion of the gate structure disposed over the first doped well, a second portion of the gate structure disposed over the second doped well, and a third portion of the gate structure disposed over the third doped well. The method also includes depositing a first epitaxy over the plurality of fins extending from the first doped well, a second epitaxy over the plurality of fins extending from the second doped well, and a third epitaxy over the plurality of fins extending from the third doped well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning a first doped well of a semiconductor substrate to form first fins, a second doped well of the semiconductor substrate to form second fins, and a third doped well of the semiconductor substrate to form third fins;
    forming a gate structure over and along sidewalls of the first fins, the second fins, and the third fins; and
    epitaxially growing a first epitaxy of a bipolar junction transistor (BJT) over the first fins on opposing sides of the gate structure, a second epitaxy of the BJT over the second fins on opposing sides of the gate structure, and a third epitaxy of the BJT over the third fins on opposing sides of the gate structure, the first epitaxy and the third conductivity having a first conductivity, the second epitaxy having a second epitaxy opposite the first conductivity, wherein the gate structure has a first portion, a second portion, and a third portion, the first portion, the second portion, and the third portion being electrically separated from each other, the first portion over the first fins, the second portion over the second fins, the third portion over the third fins.

2. The method of claim 1, wherein forming the gate structure comprises:
    depositing a gate dielectric layer over the first fins, the second fins, and the third fins;
    depositing a gate electrode layer over the first fins, the second fins, and the third fins; and
    patterning the gate electrode layer and gate dielectric layer to form the first portion of the gate structure, the second portion of the gate structure, and the third portion of the gate structure.

3. The method of claim 1, further comprising:
    depositing a first interlayer dielectric (ILD) over the first epitaxy, the second epitaxy, and the third epitaxy;
    cutting the gate structure to separate the gate structure into the first portion of the gate structure, the second portion of the gate structure, and the third portion of the gate structure; and
    depositing an insulating material between adjacent ends of the first portion and the second portion and between adjacent ends of the second portion and the third portion.

4. The method of claim 3, wherein a width of the cutting between adjacent ends of the first portion of the gate structure and the second portion of the gate structure is between about 100 nm and about 400 nm.

5. The method of claim 1, further comprising:
    forming an isolation material over and between the first fins, the second fins, and the third fins;
    recessing the isolation material so that the first fins, the second fins, and the third fins each protrude from an upper surface of the isolation material; and
    epitaxially growing the first epitaxy, the second epitaxy, and the third epitaxy between portions of the isolation material.

6. The method of claim 1, further comprising:
    forming a metallization layer over the gate structure, the metallization layer electrically coupling the first epitaxy to a gate of the gate structure.

7. The method of claim 1, further comprising:
    performing a gate replacement process to remove a gate electrode of the gate structure and replace the gate electrode with a replacement metal gate.

8. A method comprising:
patterning a substrate to form first fins, a second fins, and third fins, each of the first fins, second fins, and third fins extending vertically from a respective first pedestal, second pedestal, and third pedestal, the first pedestal having a greater cross-sectional width than the second pedestal and the third pedestal;
forming a gate structure over the first fins, the second fins, and the third fins;
recessing the first fins, the second fins, and the third fins on either side of the gate structure;
depositing a first epitaxy over the first fins, a second epitaxy over the second fins, and a third epitaxy over the third fins; and
forming first contacts to the first epitaxy, second contacts to the second epitaxy, third contacts to the third epitaxy, fourth contacts to a first portion of the gate structure, fifth contacts to a second portion of the gate structure, and sixth contacts to a third portion of the gate structure, the first contacts electrically coupled to the fourth contacts, the second contacts electrically coupled to the fifth contacts, and the third contacts electrically coupled to the sixth contacts.

9. The method of claim 8, further comprising:
after depositing the first epitaxy, the second epitaxy, and the third epitaxy, depositing an interlayer dielectric material over the first epitaxy, the second epitaxy, and the third epitaxy; and
cutting the gate structure to separate the first portion of the gate structure from the second portion of the gate structure and the third portion of the gate structure.

10. The method of claim 9, further comprising:
filling a space between the first portion of the gate structure and the second portion of the gate structure with an insulating material.

11. The method of claim 8, wherein the first portion of the gate structure is disposed over the first fins, the second portion of the gate structure is disposed over the second fins, and the third portion of the gate structure is disposed over the third fins.

12. The method of claim 8, further comprising:
patterning the substrate to form fourth fins and fifth fins; and
forming the gate structure over the fourth fins and over the fifth fins, wherein the first fins, the second fins, and the third fins form a first transistor, and wherein the first fins, the fourth fins, and the fifth fins form a second transistor.

13. The method of claim 12, wherein the first fins are a shared emitter of the first transistor and the second transistor.

14. The method of claim 8, further comprising:
after forming the first fins, the second fins, and the third fins, depositing a shallow trench isolation material in between the first fins, the second fins, and the third fins; and
recessing the shallow trench isolation material so that the first fins, the second fins, and the third fins partially protrude from the shallow trench isolation material, wherein the gate structure runs on an upper surface of the shallow trench isolation material.

15. A method comprising:
patterning a substrate to form a plurality of fins extending vertically from a first doped well, a second doped well, and a third doped well, a number of the plurality of fins extending from the first doped well being between 3 and 8 times a number of the plurality of fins extending from the second doped well;
forming a gate structure over the plurality of fins, a first portion of the gate structure disposed over the first doped well, a second portion of the gate structure disposed over the second doped well, and a third portion of the gate structure disposed over the third doped well; and
depositing a first epitaxy over the plurality of fins extending from the first doped well, a second epitaxy over the plurality of fins extending from the second doped well, and a third epitaxy over the plurality of fins extending from the third doped well.

16. The method of claim 15, wherein the first epitaxy, the second epitaxy, and the third epitaxy together form an emitter, a base, and a collector, respectively, of a bipolar junction transistor.

17. The method of claim 16, wherein the emitter is a shared emitter of a second bipolar junction transistor.

18. The method of claim 15, wherein the plurality of fins is a first plurality of fins, further comprising:
patterning the substrate to form a second plurality of fins extending vertically from a fourth doped well and a fifth doped well, wherein the number of the second plurality of fins extending from the fourth doped well is the same as the number of the first plurality of fins extending from the second doped well.

19. The method of claim 18, wherein the first plurality of fins corresponds to a first bipolar junction transistor (BJT), wherein the second plurality of fins corresponds to a second BJT, wherein fins of the first plurality of fins which extend from the first doped well correspond to both the first BJT and the second BJT.

20. The method of claim 15, wherein forming the gate structure comprises:
forming the first portion, the second portion, and the third portion as one continuous gate structure; and
after depositing an insulating material over the one continuous gate structure, patterning the insulating material to form an opening therein, the opening exposing a segment of the one continuous gate structure, and removing the exposed segment of the one continuous gate structure to separate the first portion from the second portion.

* * * * *

UNITED STATES PATENT AND TRADEMARK OFFICE
CERTIFICATE OF CORRECTION

PATENT NO. : 11,843,038 B2
APPLICATION NO. : 17/589180
DATED : December 12, 2023
INVENTOR(S) : Li et al.

Page 1 of 1

It is certified that error appears in the above-identified patent and that said Letters Patent is hereby corrected as shown below:

In the Claims

In Column 22, in Claim 1, Line 18, after "third" delete "conductivity" and insert -- epitaxy --.

In Column 22, in Claim 1, Line 19, before "opposite" delete "epitaxy" and insert -- conductivity --.

Signed and Sealed this
Twenty-seventh Day of August, 2024

Katherine Kelly Vidal
*Director of the United States Patent and Trademark Office*